United States Patent
Kato et al.

(10) Patent No.: US 10,250,247 B2
(45) Date of Patent: Apr. 2, 2019

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Kiyoshi Kato, Kanagawa (JP); Yutaka Shionoiri, Kanagawa (JP); Tomoaki Atsumi, Kanagawa (JP); Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 52 days.

(21) Appl. No.: 15/427,815

(22) Filed: Feb. 8, 2017

(65) Prior Publication Data
US 2017/0230041 A1 Aug. 10, 2017

(30) Foreign Application Priority Data

Feb. 10, 2016 (JP) .................... 2016-023593
Apr. 7, 2016 (JP) .................... 2016-077225

(51) Int. Cl.
*H03K 5/24* (2006.01)
*G11C 5/14* (2006.01)
(Continued)

(52) U.S. Cl.
CPC ........ *H03K 5/2481* (2013.01); *G11C 5/144* (2013.01); *G11C 5/145* (2013.01); *H01L 21/78* (2013.01);
(Continued)

(58) Field of Classification Search
CPC .. H03K 19/0013; H03K 19/0016; H03K 3/00; H03K 17/162; H03K 17/163; H03K 17/687; H03K 3/012; H03K 5/08
(Continued)

(56) References Cited

U.S. PATENT DOCUMENTS 5,146,112 A * 9/1992 Ito .................... H01L 27/088
257/357
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Atsumi.T et al., "DRAM Using Crystalline Oxide Semiconductor for Access Transistors and Not Requiring Refresh for More Than Ten Days", IMW 2012 (4th IEEE International Memory Workshop), 2012, pp. 99-102, IEEE.
(Continued)

*Primary Examiner* — John W Poos
(74) *Attorney, Agent, or Firm* — Fish & Richardson P.C.

(57) ABSTRACT

Provided is a semiconductor device that can directly compare two negative potentials. The semiconductor device includes a first to a third transistor and a load and is configured to compare a first negative potential and a second negative potential. The first negative potential and the second negative potential are input to a gate of the first transistor and a gate of the second transistor, respectively. Each drain of the first transistor and the second transistor is electrically connected to the load. The third transistor serves
(Continued)

as a current source. The first transistor and the second transistor each include a backgate. A positive potential is input to the backgates.

24 Claims, 34 Drawing Sheets

(51) Int. Cl.
  *H01L 21/78* (2006.01)
  *H01L 27/00* (2006.01)
  *H01L 49/02* (2006.01)
  *H01L 23/498* (2006.01)
  *H01L 27/108* (2006.01)
  *H01L 27/146* (2006.01)

(52) U.S. Cl.
  CPC ........ *H01L 23/49844* (2013.01); *H01L 27/00* (2013.01); *H01L 27/10805* (2013.01); *H01L 27/14687* (2013.01); *H01L 28/00* (2013.01)

(58) Field of Classification Search
  USPC .............................................. 327/53, 54, 56
  See application file for complete search history.

(56) References Cited

U.S. PATENT DOCUMENTS

| | | |
|---|---|---|
| 5,744,864 A | 4/1998 | Cillessen et al. |
| 6,069,518 A | 5/2000 | Nakai et al. |
| 6,229,379 B1 | 5/2001 | Okamoto |
| 6,294,274 B1 | 9/2001 | Kawazoe et al. |
| 6,337,593 B1 | 1/2002 | Mizuno et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0051118 A1 | 3/2012 | Yamazaki et al. |
| 2015/0054571 A1 | 2/2015 | Watanabe et al. |
| 2015/0091003 A1 | 4/2015 | Kurokawa |
| 2015/0192641 A1 | 7/2015 | Kurokawa |
| 2015/0348609 A1 | 12/2015 | Ohmaru |
| 2016/0037106 A1 | 2/2016 | Ohmaru |
| 2016/0070386 A1 | 3/2016 | Yamamoto et al. |
| 2016/0329368 A1 | 11/2016 | Ohmaru |
| 2016/0356645 A1 | 12/2016 | Yoneda et al. |
| 2016/0366360 A1 | 12/2016 | Okamoto et al. |
| 2017/0025415 A1 | 1/2017 | Kurokawa |
| 2017/0041517 A1 | 2/2017 | Ikeda |
| 2017/0063351 A1 | 3/2017 | Kurokawa |
| 2017/0186473 A1 | 6/2017 | Ikeda et al. |
| 2017/0186749 A1 | 6/2017 | Ohshima et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-231647 A | 8/1995 |
| JP | 08-264794 A | 10/1996 |

(56) References Cited

FOREIGN PATENT DOCUMENTS

| | | |
|---|---|---|
| JP | 11-505377 | 5/1999 |
| JP | 11-150230 A | 6/1999 |
| JP | 11-191611 A | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-069932 A | 4/2012 |
| WO | WO-2004/114391 | 12/2004 |

OTHER PUBLICATIONS

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

Aoki.T et al., "Normally-Off Computing with Crystalline InGaZnO-based FPGA", ISSCC 2014 (Digest of Technical Papers. IEEE International Solid-State Circuits Conference), Feb. 12, 2014, vol. 2014, pp. 502-504.

Matsuzaki.T et al., "A 128kb 4b/cell Nonvolatile Memory with Crystalline In—Ga—Zn Oxide FET Using Vt Cancel Write Method", ISSCC 2015 (Digest of Technical Papers. IEEE International Solid-State Circuits Conference), Feb. 22, 2015, pp. 306-308.

Ohmaru.T et al., "25.3μW at 60fps 240×160—Pixel Vision Sensor for Motion Capturing with In-Pixel Non-Volatile Analog Memory Using Crystalline Oxide Semiconductor FET", ISSCC 2015 (Digest of Technical Papers. IEEE International Solid-State Circuits Conference), Feb. 23, 2015, pp. 118-120.

Tamura.H et al., "Embedded SRAM and Cortex-M0 Core Using a 60-nm Crystalline Oxide Semiconductor", IEEE Micro, Nov. 1, 2014, vol. 34, No. 6, pp. 42-53.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charged-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

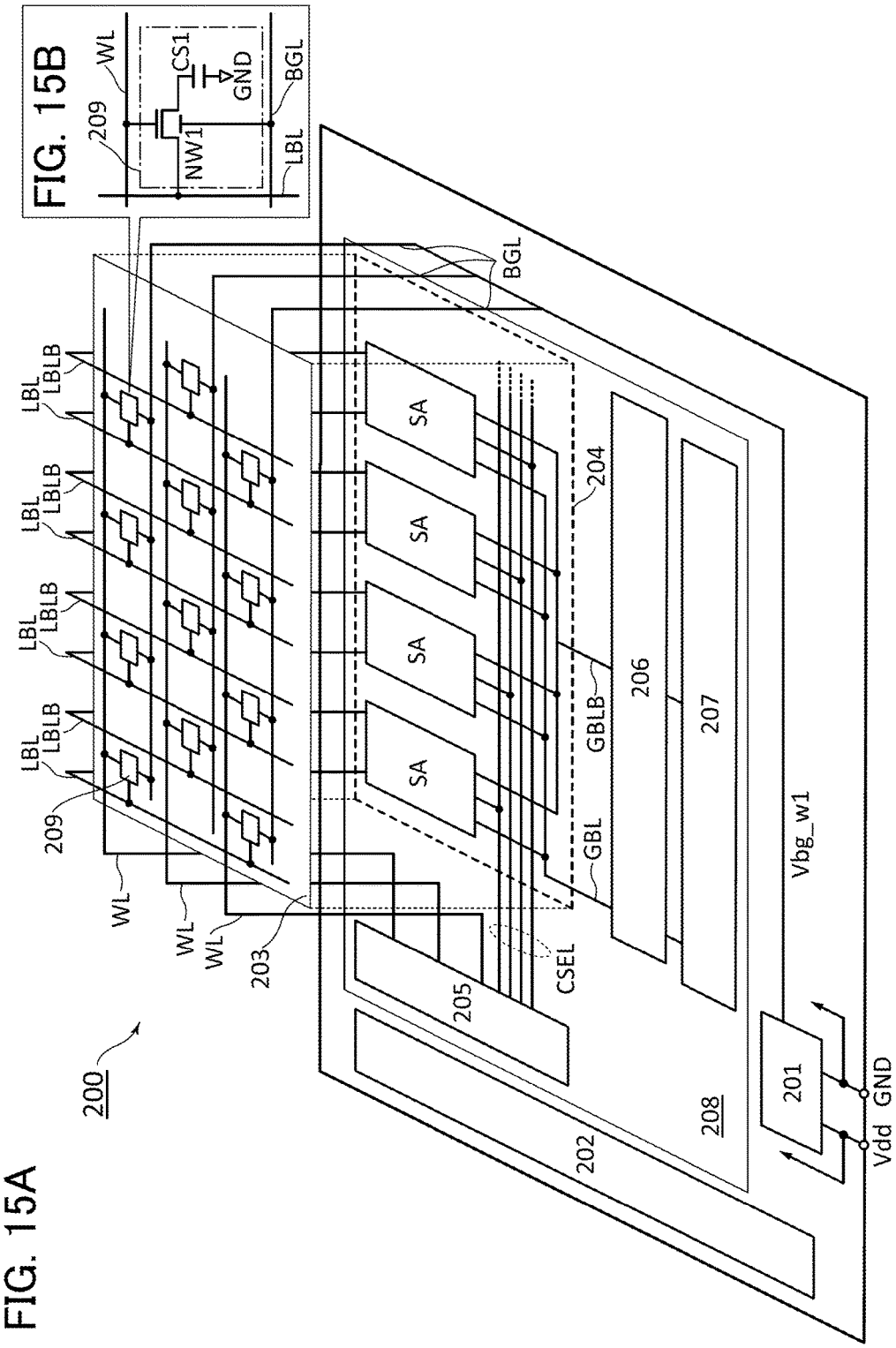

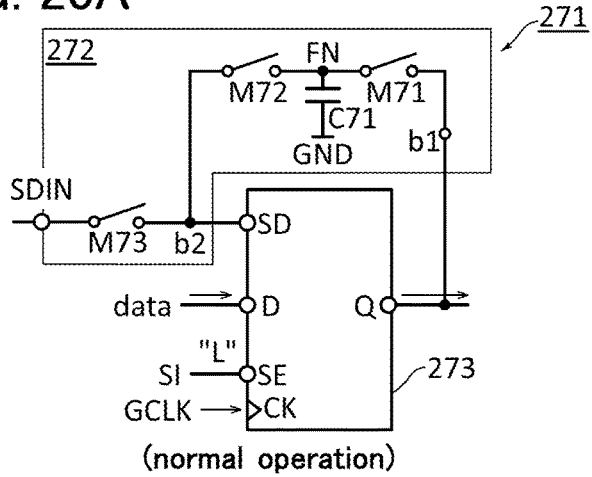
FIG. 20A (normal operation)
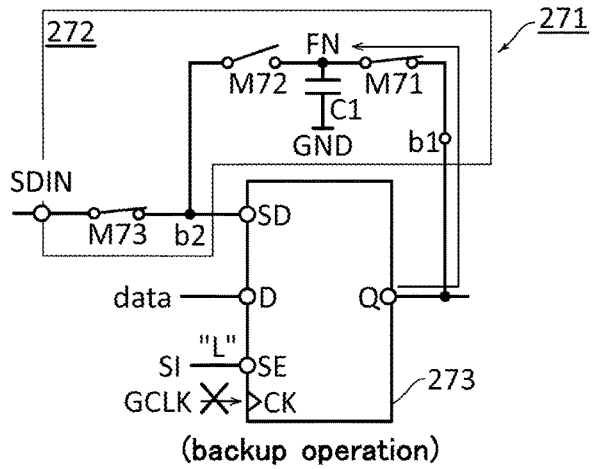
FIG. 20B (backup operation)
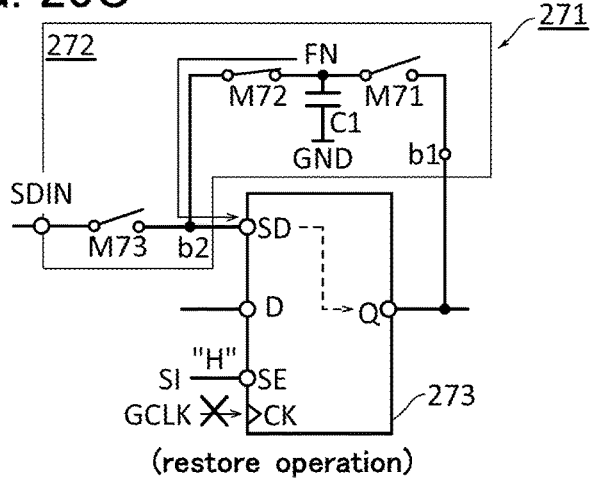
FIG. 20C (restore operation)

FIG. 25A
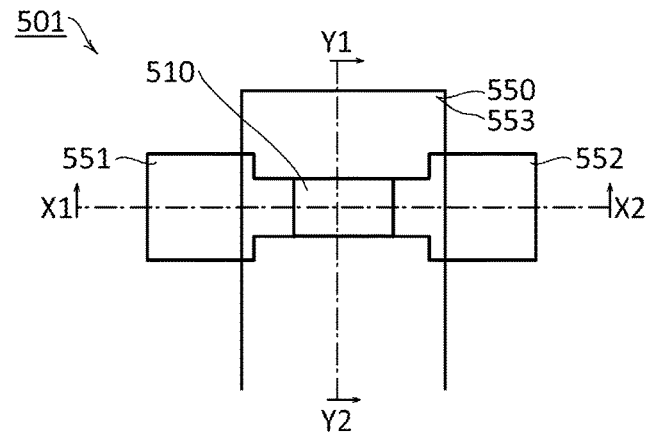
FIG. 25B
FIG. 25C
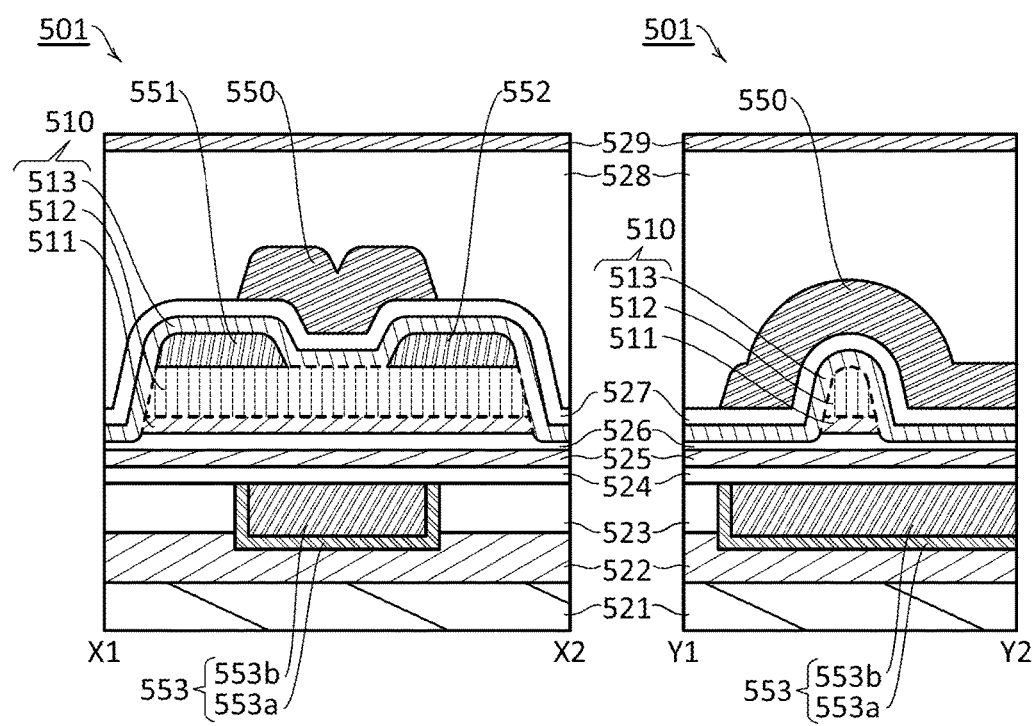

FIG. 30A
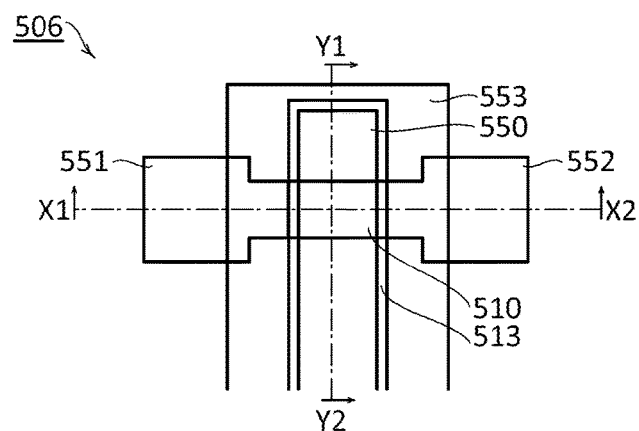
FIG. 30B
FIG. 30C
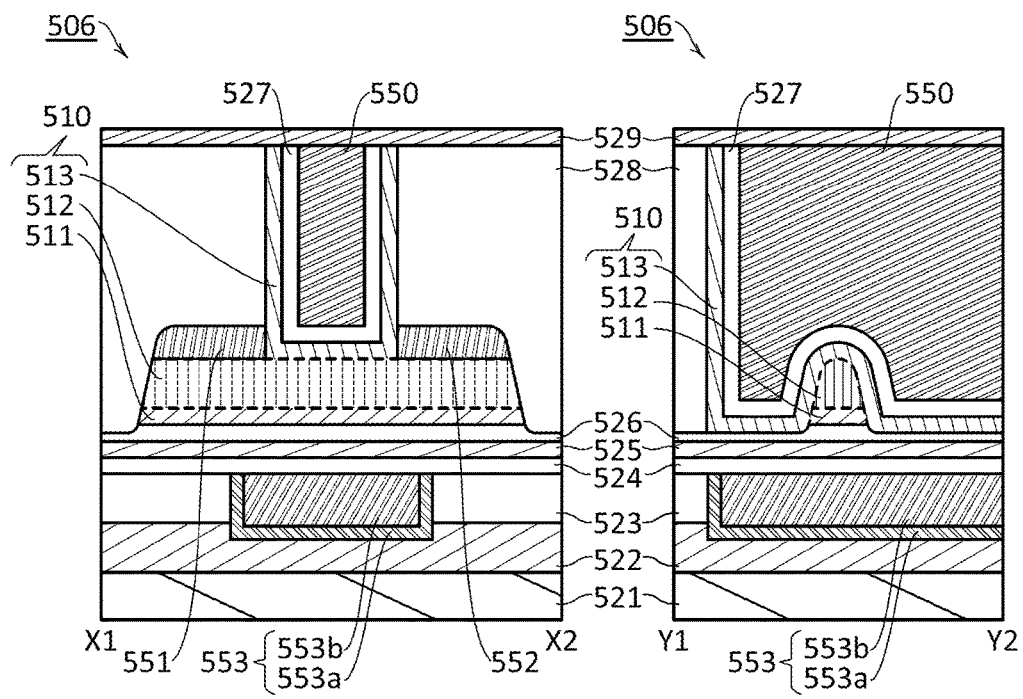

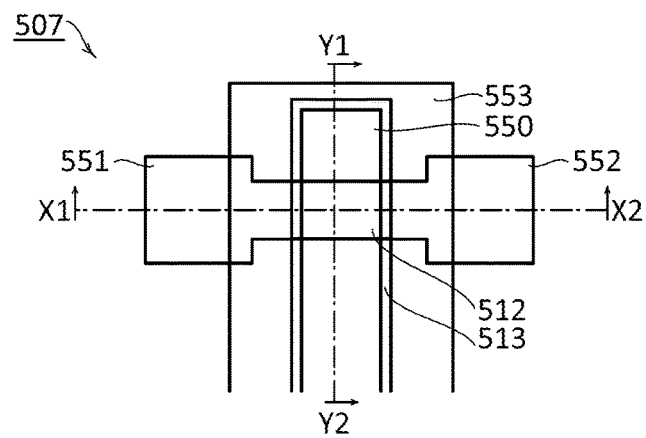
FIG. 31A
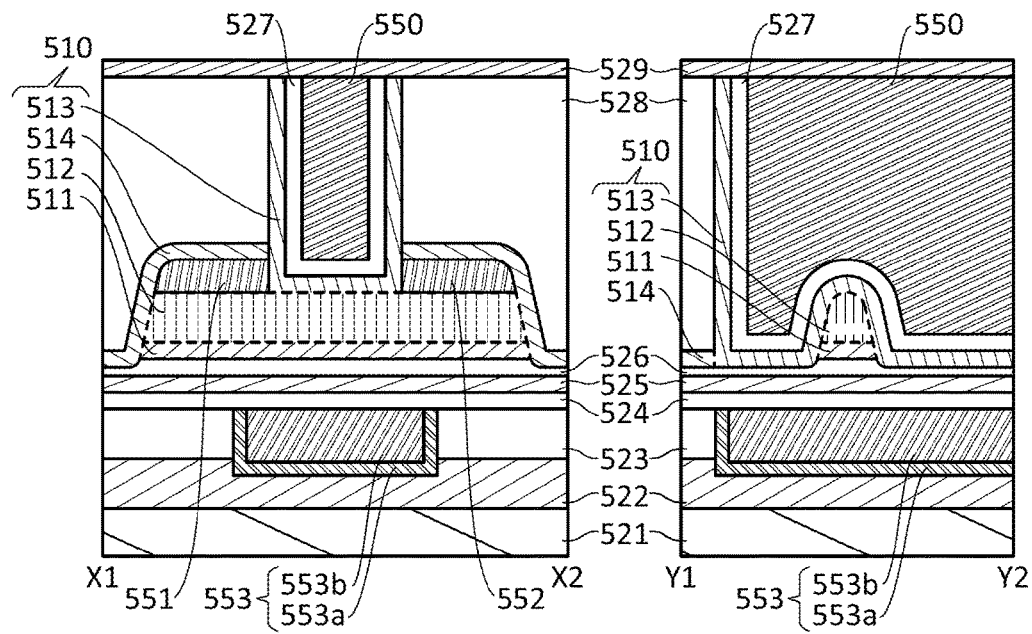
FIG. 31B
FIG. 31C metal oxide layer
conductive layer
insulating layer

SEMICONDUCTOR DEVICE, ELECTRONIC COMPONENT, AND ELECTRONIC DEVICE

BACKGROUND OF THE INVENTION

1. Field of the Invention

One embodiment of the present invention disclosed in the specification, drawings, and scope of claims of this application (hereinafter referred to as this specification and the like) relates to a semiconductor device, an operation method thereof, a usage method thereof, a manufacturing method thereof, and the like. Note that one embodiment of the present invention is not limited to these technical fields.

2. Description of the Related Art

A semiconductor device in which a negative potential lower than a ground potential is used is known. For example, in order to reduce subthreshold leakage current, a substrate bias potential in an n-channel MOS transistor is a negative potential, whereas a substrate bias potential in a p-channel MOS transistor is a positive potential (Patent Document 1). In a flash memory, a negative potential is used in accordance with the operation (Patent Document 2).

A negative potential can be generated by a charge pump circuit. Patent Documents 2 and 3 disclose a technique for generating negative potentials with high accuracy. In Patent Documents 2 and 3, a negative voltage output from q charge pump circuit is converted into a positive voltage, the difference between the positive voltage and a positive reference voltage is detected, and the operation of the charge pump circuit is controlled in accordance with the detection results.

A transistor including a metal oxide in a channel formation region (hereinafter, such a transistor may be referred to as an oxide semiconductor transistor or an OS transistor) is known. A variety of semiconductor devices has been fabricated using a CMOS process for a hybrid of an OS transistor and a Si transistor (Non-Patent Documents 1 to 6). As disclosed in Non-Patent Document 6, an OS transistor can be stacked over a Si transistor. In addition, an OS transistor can include a first gate electrode (also referred to as gate or front gate) and a second gate electrode (also referred to as backgate).

Patent Document 4 discloses a memory device using an OS transistor including a first gate electrode and a second gate electrode. For a longer data holding time, a potential lower than a ground potential is input to the second gate electrode. Since the potential of the second gate electrode is a negative potential, the threshold voltage of the OS transistor is shifted on the positive side, and the off-state current of the OS transistor is small.

REFERENCE

Patent Document

[Patent Document 1] Japanese Published Patent Application No. H11-191611
[Patent Document 2] Japanese Published Patent Application No. H7-231647
[Patent Document 3] Japanese Published Patent Application No. H11-150230
[Patent Document 4] Japanese Published Patent Application No. 2012-69932

Non-Patent Document

[Non-Patent Document 1] T. Atsumi et al., "DRAM Using Crystalline Oxide Semiconductor for Access Transistors and not Requiring Refresh for More Than Ten Days," IMW, 2012, pp. 99-102.
[Non-Patent Document 2] T. Ishizu et al., "SRAM with C-Axis Aligned Crystalline Oxide Semiconductor: Power Leakage Reduction Technique for Microprocessor Caches," International Memory Workshop, 2014, pp. 103-106.
[Non-Patent Document 3] T. Aoki et al., "Normally-Off Computing with Crystalline InGaZnO-based FPGA," IEEE ISSCC Dig. Tech. Papers, 2014, pp. 502-503.
[Non-Patent Document 4] T. Matsuzaki et al., "A 128 kb 4 bit/Cell Nonvolatile Memory with Crystalline In—Ga—Zn Oxide FET Using Vt Cancel Write Method," ISSCC Dig. Tech. Papers, 2015, pp. 306-307.
[Non-Patent Document 5] T. Ohmarul et al., "25.3 µW at 60 fps 240×160-Pixel Vision Sensor for Motion Capturing with In-Pixel Non-Volatile Analog Memory Using Crystalline Oxide Semiconductor," ISSCC Dig. Tech. Papers, 2015, pp. 118-119.
[Non-Patent Document 6] H. Tamura et al., "Embedded SRAM and Cortex-M0 Core Using a 60-nm Crystalline Oxide Semiconductor," IEEE Micro, 2014, vol. 34, No. 6, pp. 42-53.

SUMMARY OF THE INVENTION

Objects of one embodiment of the present invention is to provide a novel semiconductor device, provide a method of operating a novel semiconductor device, provide a method of using a novel semiconductor device, directly compare two negative potentials, generate negative potentials with high accuracy, reduce a device size, provide a semiconductor device driven with a single power source, and the like.

Note that one embodiment of the present invention does not necessarily achieve all the objects described above. The description of a plurality of objects does not preclude their coexistence. Other objects will be apparent from the description of this specification and the like, and such objects could be objects of one embodiment of the present invention.

(1) One embodiment of the present invention is a semiconductor device comprising a first transistor, a second transistor, a third transistor, a load, a first terminal, a second terminal, a third terminal, a fourth terminal, and a fifth terminal. The semiconductor device is configured to compare a first potential and a second terminal. The semiconductor device is configured to generate a third potential based on the comparison results. The first terminal is configured to supply the first potential. The second terminal is configured to supply the second potential. The third terminal, the fourth terminal, and the fifth terminal are configured to supply a fourth potential, a fifth potential, and a sixth potential, respectively. A gate of the first transistor is electrically connected to the first terminal. A gate of the second transistor is electrically connected to the second terminal. A drain of the first transistor is electrically connected to the load. A source of the first transistor is electrically connected to a drain of the third transistor. A source of the second transistor is electrically connected to the drain of the third transistor. A gate of the third transistor is electrically connected to the third terminal. A source of the third transistor is electrically connected to the fourth terminal. The first transistor and the second transistor each comprise a backgate. The backgate of the first transistor is electrically connected to the fifth terminal. The backgate of the second transistor is electrically connected to the fifth terminal. The first potential and the second potential are lower than the fifth potential. The sixth potential is higher than the fifth potential.

(2) The semiconductor device according to the embodiment (1), further comprising a sixth terminal configured to supply a seventh potential. The seventh potential is higher than the fifth potential. The backgate of the second transistor is electrically connected to the sixth terminal.

(3) The semiconductor device according to the embodiment (1) or (2), further comprising a seventh terminal configured to supply an eighth potential. The third transistor comprises a backgate. The backgate of the third transistor is electrically connected to the seventh terminal.

(4) In the semiconductor device according to the embodiment (1) or (2), the third transistor comprises a backgate. The backgate of the third transistor is electrically connected to the gate or the drain of the third transistor.

(5) In the embodiments (1) to (3), each channel formation region of the first to third transistors may comprise a metal oxide.

(6) One embodiment of the present invention is a semiconductor device comprising a first-potential generation portion, a second-potential generation portion, a first-potential hold portion, a second-potential hold portion, a potential comparison portion, a control portion, and an output terminal. The potential comparison portion comprises the semiconductor device described in any one of the embodiments (1) to (5). The first terminal of the potential comparison portion is electrically connected to the output terminal of the second-potential generation portion. The second terminal of the potential comparison portion is electrically connected to the output terminal. The first-potential generation portion is configured to supply a negative potential to the output terminal. The first-potential hold portion is configured to hold the potential of the output terminal. The second-potential generation portion is configured to supply a negative potential to the first terminal of the potential comparison portion. The control portion is configured to control the second-potential generation portion and is configured to control the first-potential generation portion based on the third potential generated in the potential comparison portion.

(7) One embodiment of the present invention is a semiconductor device comprising a first-potential generation portion, a second-potential generation portion, a first-potential hold portion, a potential comparison portion, a control portion, and an output terminal. The potential comparison portion comprises the semiconductor device described in any one of the embodiments (1) to (5). The first-potential generation portion is configured to supply a negative potential to the output terminal. The first-potential hold portion is configured to hold the potential of the output terminal. The second terminal of the potential comparison portion is electrically connected to the output terminal. The second-potential generation portion is configured to supply a negative potential to the first terminal of the potential comparison portion. The second-potential hold portion is configured to hold the potential of the first terminal of the potential comparison portion. The control portion is configured to control the first-potential generation portion and the second-potential generation portion based on the third potential generated in the potential comparison portion.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, a ground potential is regarded as 0 V, and a positive potential and a negative potential are potentials with respect to the ground potential with 0 V.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relationship, for example, a connection relationship shown in drawings or texts, another connection relationship is included in the drawings or the texts. Note that X and Y each denote an object (e.g., a device, an element, a circuit, a wiring, an electrode, a terminal, a conductive film, or a layer).

Note that a transistor includes three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

A voltage usually refers to a potential difference between a given potential and a reference potential (e.g., a ground potential or a source potential). Thus, a voltage can be referred to as a potential and vice versa.

In this specification and the like, the terms "film" and "layer" can be interchanged depending on the case or circumstances. For example, in some cases, the term "conductive film" can be used instead of the term "conductive layer," and the term "insulating layer" can be used instead of the term "insulating film".

In this specification and the like, ordinal numbers such as first, second, and third are used to avoid confusion among components, and the terms do not limit the components numerically or do not limit the order.

One embodiment of the present invention can provide a novel semiconductor device, a method of operating a novel semiconductor device, and a method of using a novel semiconductor device; can directly compare two negative potentials; can generate negative potentials with high accuracy; can reduce a device size; can provide a semiconductor device driven with a single power source, and the like.

In one embodiment of the present invention, there is no need to achieve all the effects described above. Note that the description of the plurality of effects does not disturb the existence of other effects. In one embodiment of the present invention, an object other than the above objects, an effect other than the above effects, and a novel feature will be apparent from the description of the specification and the drawings.

BRIEF DESCRIPTION OF THE DRAWINGS

FIG. 15A is a block diagram showing a configuration example of a memory device. FIG. 15B is a circuit diagram showing a structure example of a memory cell.

FIG. 20A to 20C are circuit diagrams showing operation examples of a flip-flop.

FIG. 25A is a plan view illustrating a structure example of an OS (oxide semiconductor) transistor. FIGS. 25B and 25C are cross-sectional views illustrating the OS transistor of FIG. 25A.

FIG. 30A is a plan view illustrating a structure example of an OS transistor. FIGS. 30B and 30C are cross-sectional views illustrating the OS transistor of FIG. 30A.

FIG. 31A is a plan view illustrating a structure example of an OS transistor. FIGS. 31B and 31C are cross-sectional views illustrating the OS transistor of FIG. 31A.

DETAILED DESCRIPTION OF THE INVENTION

Figure 1A:
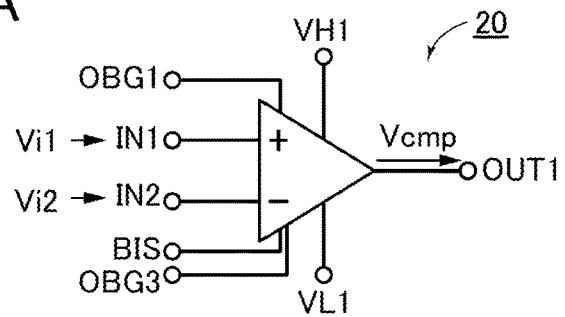
FIGS. 1A and 1B are circuit diagrams illustrating a configuration example of a comparison circuit.

An embodiment of the present invention will hereinafter be described. Note that any of the embodiments described in this specification can be combined as appropriate. In addition, in the case where a plurality of structure examples (including operation examples and manufacturing method examples) are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the size, the layer thickness, the region, and the like are exaggerated for clarity in some cases and thus are not limited to the illustrated scale. The drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relations of circuit blocks illustrated in a block diagram are specified for description; therefore, the positions of circuit blocks of one embodiment of the present invention are not limited thereto. Even when different functions are achieved by different circuit blocks according to a block diagram, one circuit block may be actually configured to achieve different functions. Functions of circuit blocks in a diagram are specified for description. Even when a diagram shows one circuit block performing given processing, a plurality of circuit blocks may be actually provided to perform the processing.

Embodiment 1

Described in this embodiment is a semiconductor device or the like that is configured to directly compare two negative voltages.

<<Configuration Example 1 of Comparison Circuit>>

FIG. 1A is a circuit diagram showing a configuration example of a comparison circuit. A comparison circuit 20 includes terminals IN1, IN2, OUT1, VH1, VL1, BIS, OBG1, and OBG3. The comparison circuit 20 is configured to compare a potential Vi1 of the terminal IN1 and a potential Vi2 of the terminal IN2, and to output a potential Vcmp, which has a potential level corresponding to the comparison results, from the terminal OUT1.

In the example of FIG. 1A, the terminal IN1 and the terminal IN2 are a non-inverting input terminal (terminal (+)) and an inverting output terminal (terminal (−)), respectively. Therefore, when Vi1<Vi2, the potential Vcmp output from the terminal OUT1 is at a low level, whereas when Vi1>Vi2, the potential Vcmp is at a high level.

The terminal VH1 is an input terminal for supplying a high power supply potential Vdd (hereinafter referred to as potential Vdd). The terminal VL1 is an input terminal for supplying a low power supply potential Vss (hereinafter referred to as potential Vss). Terminals BIS, OBG1, and OBG3 are input terminals for bias potentials.

Figure 1B:
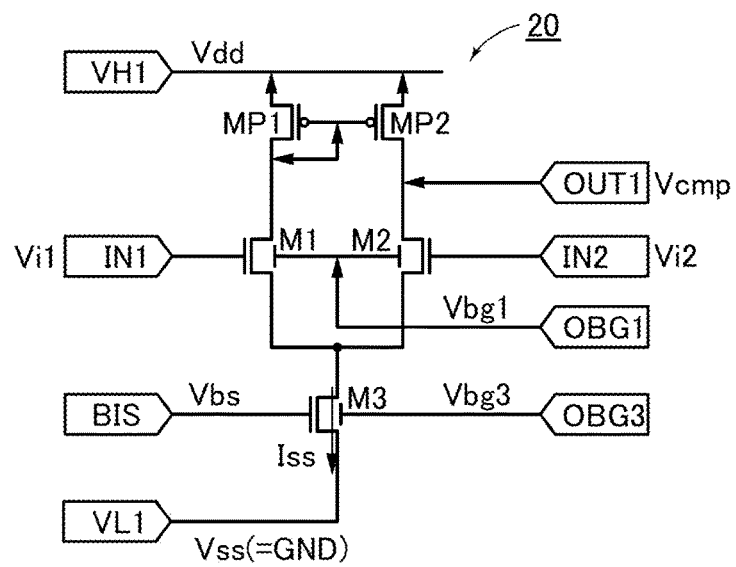

FIG. 1B is a specific configuration example of the comparison circuit 20. FIG. 1B is an example in which the comparison circuit 20 is composed of a differential amplifier circuit including a differential pair. The comparison circuit 20 includes transistors MP1, MP2, M1, M2, and M3. The differential amplifier circuit is composed of these transistors.

The differential pair is composed of the transistors M1 and M2. A gate of the transistor M1 is electrically connected to the terminal IN1. A gate of the transistor M2 is electrically connected to the terminal IN2. Each backgate of the transistors M1 and M2 is electrically connected to the terminal OBG1. A drain of the transistor M2 is electrically connected to the terminal OUT1.

The transistor M3 serves as a current source for supplying a current Iss. A gate, a backgate, and a source of the transistor M3 are electrically connected to the terminal BIS, the terminal OBG3, and the terminal VL1, respectively. A bias potential Vbg3 for controlling a backgate potential of the transistor M3 (hereinafter referred to as potential Vbg3) is input to the terminal OBG3. For example, the potential Vss is input to the terminal OBG3. A bias potential Vbs for determining the level of the current Iss (hereinafter referred to as potential Vbs) is input to the terminal BIS.

The transistors MP1 and MP2 serve as loads for the transistors M1 and M2, respectively. A current mirror circuit is composed of the transistors MP1 and MP2 in this example.

The transistors MP1 and MP2 are p-channel transistors, and there is no particular limitation on the type of the transistors. For example, the transistors MP1 and MP2 are Si transistors.

The transistors M1 to M3 are n-channel transistors including backgates. As each of the transistors M1 to M3, a transistor whose backgate and gate face to each other with a channel formation region sandwiched therebetween can be used.

A semiconductor (oxide semiconductor) made of a metal oxide, silicon, or the like can be used as a semiconductor used for the channel formation region of the transistor M1. In order to ensure the reliability and electric characteristics of the transistor M1, the semiconductor is preferably a crystalline semiconductor. The transistor M1 is preferably an OS transistor, more preferably an OS transistor including a crystalline metal oxide in its semiconductor region. The same applies to the transistors M2 and M3. This is because an OS transistor including a crystalline metal oxide can hold excellent characteristics even when stacked over a Si transistor.

A metal oxide used for a channel formation region, an OS transistor, and a semiconductor device in which a Si transistor and an OS transistor are stacked will be described in Embodiments 4 to 6.

<<Operation Example of Comparison Circuit>>

In Patent Documents 1 to 3, a comparison circuit is used for monitoring a negative potential generated by a charge pump circuit. For example, in a comparison circuit in Patent Document 2, a negative potential generated by a charge pump circuit is converted into a positive potential by a divider circuit, and the positive potential is compared to a positive reference potential. A comparison circuit in Patent Document 3 is similar to this. In contrast, the comparison circuit 20 can directly compare two negative potentials and convert the two input potentials Vi1 and Vi2 into negative potentials. The comparison circuit 20 is described below.

Figure 36:
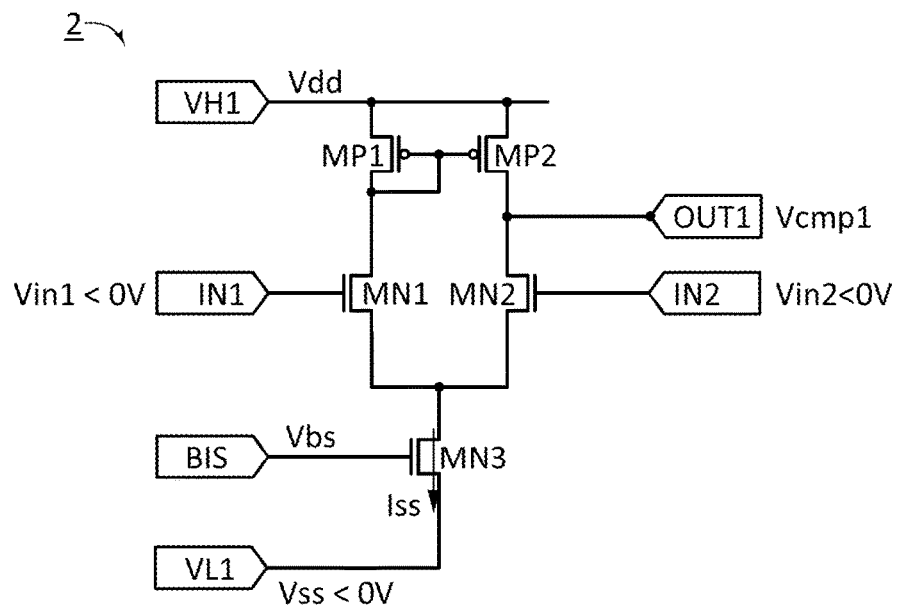
FIG. 36 is a circuit diagram showing a configuration example of a comparison circuit.

First, a comparison example is described with reference to FIG. 36. A comparison circuit 2 shown in FIG. 36 is a circuit in which transistors MN1 to MN3 without backgates are used instead of the transistors M1 to M3 of the comparison circuit 20. The transistors MN1 to MN3 are Si transistors over silicon wafers like the transistors MP1 and MP2. The threshold voltages (hereinafter also referred to as Vt) of the transistors MN1 to MN3 are larger than 0 V.

In order to let the comparison circuit 2 compare the potentials Vin1 and Vin2, the transistor MN1 needs to be electrically connected to the transistor MN2 and the transistor MN3 needs to flow the current Iss. For example, when the potentials Vdd, Vbs, Vin1, and Vin2 are 3 V, 3 V, −2 V, and −3 V, respectively, the potential Vss needs to be lower than −3 V. In other words, the potential Vss of the comparison circuit 2 becomes negative because of the negative potentials Vin1 and Vin2. High-accuracy supply of the potential Vss is required for high-accuracy comparison by the comparison circuit 2. However, the negative potential Vss causes reduction in comparison accuracy. Thus, a comparison circuit for comparing two negative potentials at high accuracy becomes more complex than the comparison circuit 2.

Figure 3:
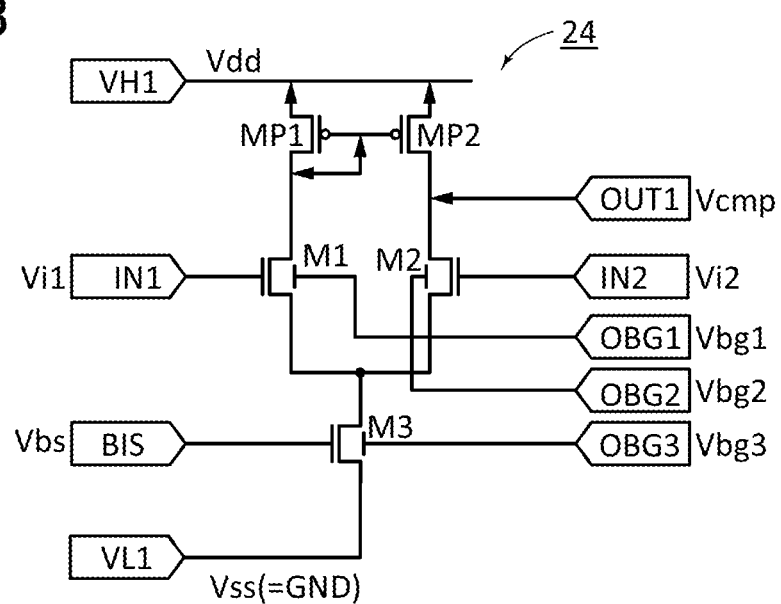
FIG. 3 is a circuit diagram illustrating a configuration example of a comparison circuit.

When the substrate potential is a ground potential (=0 V) and the negative potential Vss is input to the source of the n-channel transistor (the transistor MN3) in the comparison circuit 2, a forward bias potential is applied to a parasitic diode (a pn junction diode) between a p-well and a source region. This causes backflow of large current from the substrate to the source region. In order to prevent the backflow of current, a triple-well n-channel transistor in which an n-channel transistor is surrounded by an n-well is generally employed (e.g., see FIG. 3b and FIG. 5 in Patent Document 3). However, the area of the comparison circuit 2 is increased due to the triple-well n-channel transistor.

This embodiment can provide the comparison circuit 20 that is free of the problem. An operation example of the comparison circuit 20 is described with reference to FIGS. 1B and 1C. The example described here is the operation of the comparison circuit 20 when the potentials Vdd, Vbs, Vi1, and Vi2 are 3 V, 3 V, −2 V, and −3 V, respectively.

Figure 1C:
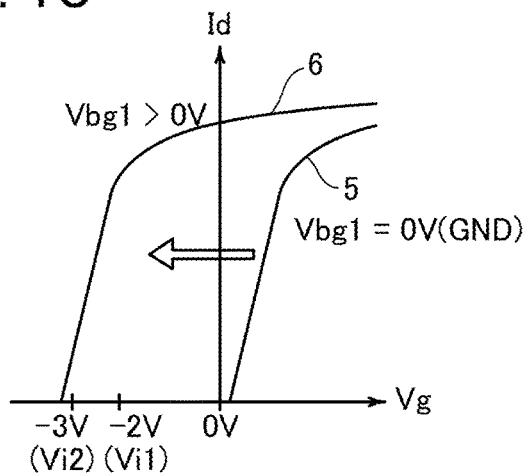
FIG. 1C schematically illustrates drain current-gate voltage (Id-Vg) characteristics of an OS transistor.

FIG. 1C schematically shows drain current-gate voltage (Id-Vg) characteristics of the transistors M1 and M2. A curve 5 represents the Id-Vg characteristics when the potential Vbg1 is 0 V. A curve 6 represents the Id-Vg characteristics when the potential Vbg1 is a positive potential.

When the potential Vbg1 is 0 V and the potential Vss is a ground potential (hereinafter also referred to as a potential GND), the Vt of the transistors M1 and M2 are higher than the potentials Vi1 and Vi2, respectively; thus, the comparison circuit 20 is out of operation.

By the input of a positive potential to the terminal OBG1, the Vt of the transistors M1 and M2 can be shifted on the negative-potential side to be lower than the potentials Vi1 and Vi2. For example, by the input of the potential Vdd to the terminals OBG1 and OBG3, the Vt of the transistors M1 to M3 can be shifted on the negative-potential side without the increase in number of potentials needed for the operation.

Even when the potential Vss is 0 V (the ground potential), the transistors M1 and M2 can be turned on owing to the characteristics of the curve 6. The comparison circuit 20 can thus be operated to detect a difference between the potentials Vi1 and Vi2. The comparison circuit 20 outputs the high-level potential Vcmp because Vi1>Vi2.

As described above, the comparison circuit 20 can directly compare two negative potentials without a complex circuit configuration. Since the potential Vss can be 0 V (ground potential), the comparison circuit 20 can have high accuracy. Since OS transistors are used as the transistors M1 to M3 instead of a triple-well structure, the channel formation regions of the transistors M1 to M3 can be insulated from the substrate. As a result, the circuit area of the comparison circuit 20 can be reduced.

Other configuration examples of the comparison circuit are described below with reference to FIGS. 2A to 8B.

<Configuration Examples 2 to 4 of Comparison Circuit>

A modification example of a current source of the comparison circuit 20 is described. A comparison circuit 21 shown in FIG. 2A includes a transistor M13 without a backgate instead of the transistor M3. The structure of the transistor M13 is similar to that of the transistor M3 except the absence of backgate.

When the transistor M3 having a backgate is used as a current source, the following effect can be obtained, for example. As is found from FIG. 1C, the potential Vbs can be lowered (e.g., GND) by the input of the positive potential Vbg3 to the backgate of the transistor M3. The potential Vbg3 can control the transconductance of the comparison circuit 20; as a result, the comparison circuit 20 can be operated at high speed.

Figure 2A:
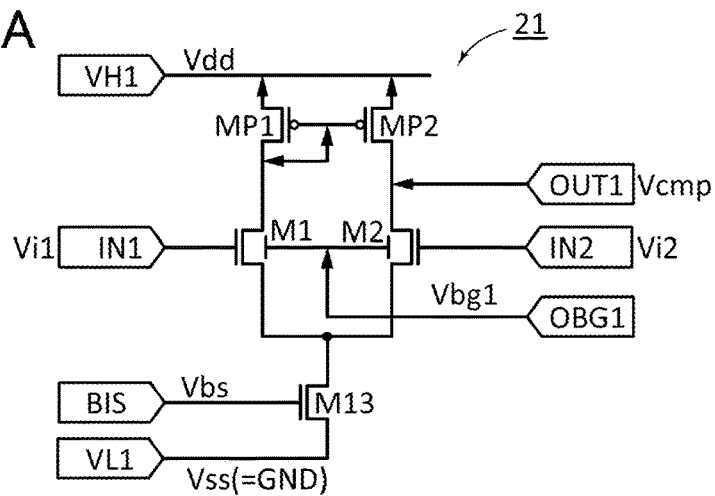
FIGS. 2A to 2C are circuit diagrams each showing a configuration example of a comparison circuit.
Figure 2B:
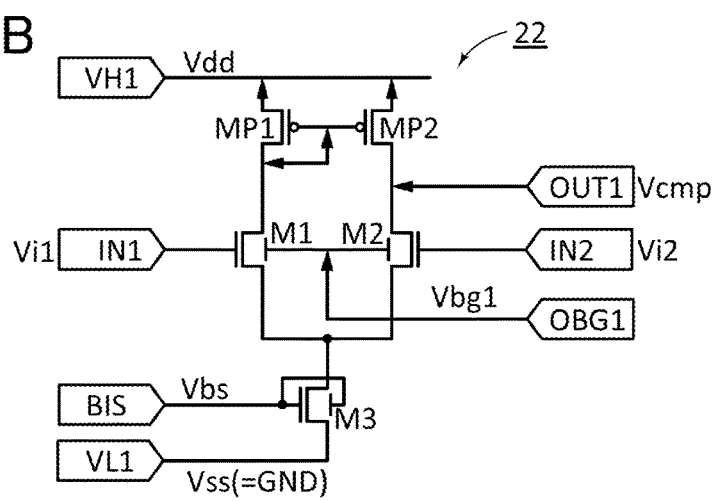
Figure 2C:
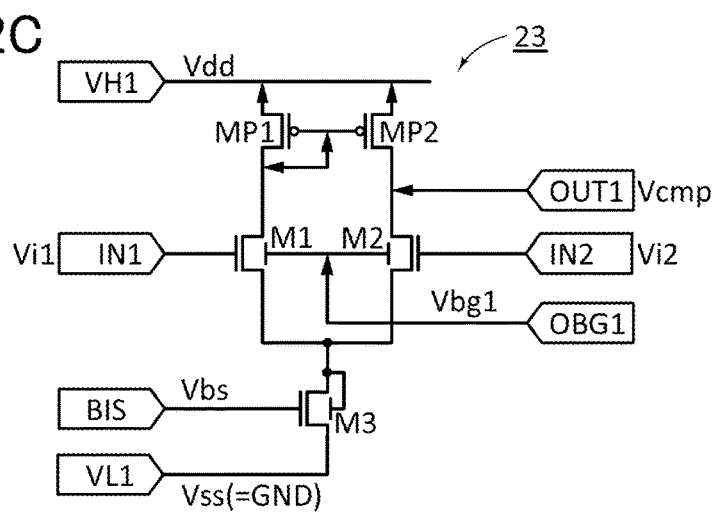

Comparison circuits 22 and 23 are modification examples of the comparison circuit 20 (FIGS. 2A and 2B). The comparison circuit 22 includes the transistor M3 whose backgate is electrically connected to the gate. The comparison circuit 23 includes the transistor M3 whose backgate is electrically connected to the drain.

<Configuration Example 5 of Comparison Circuit>

A modification example of the differential pair is described here. A comparison circuit 24 shown in FIG. 3 includes a terminal OBG2. The terminal OBG2 is a terminal for inputting a bias potential. The potential Vbg2 is input to the terminal OBG2. The terminal OBG2 is electrically connected to a backgate of the transistor M2.

For example, when the potential Vss, Vbg1, or Vbg2 is input to the terminal OBG3, the number of potentials the comparison circuit 24 handle can be reduced. In addition, when one of the potentials Vbg1 and Vbg2 is the potential Vdd, the number of potentials the comparison circuit 24 handles can be reduced.

In the comparison circuit 24, the backgate potentials of the transistors M1 and M2 can be controlled independently. Although the transistors M1 and M2 are designed to have the same electrical characteristics, in practice, the electrical characteristics of the transistors M1 and M2 do not perfectly correspond to each other due to variation in process. In view of this, the potentials Vbg1 and Vbg2 are determined to cancel an off-set voltage.

FIGS. 4A to 5C are modification examples of a load.

<Configuration Examples 6 to 8 of Comparison Circuit>

Figure 4A:
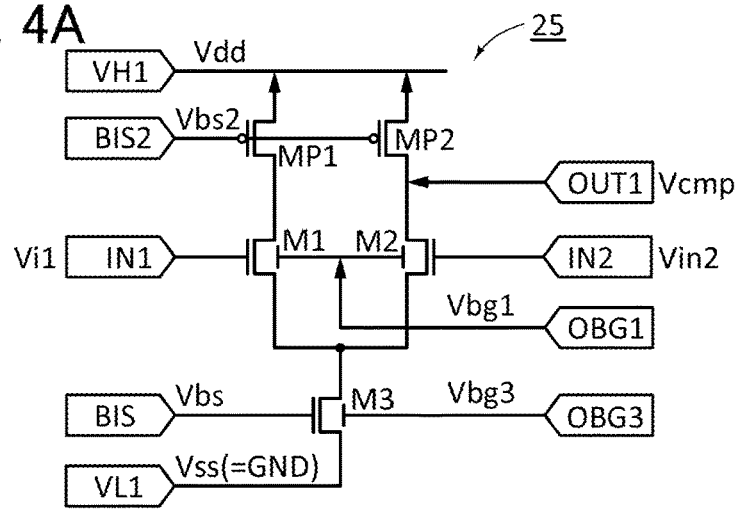
FIGS. 4A to 4C are circuit diagrams each showing a configuration example of a comparison circuit.

In a comparison circuit 25 shown in FIG. 4A, the transistors MP1 and MP2 serve as constant current sources. Gates of the transistors MP1 and MP2 are electrically connected to a terminal BIS2. The bias potential Vbs2 is input to the terminal BIS2.

Figure 4B:
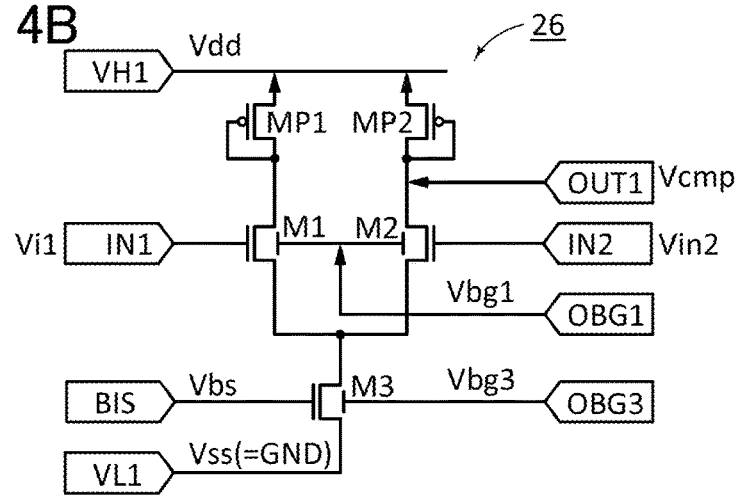

In a comparison circuit 26 shown in FIG. 4B, the transistors MP1 and MP2 are diode-connected transistors.

Figure 4C:
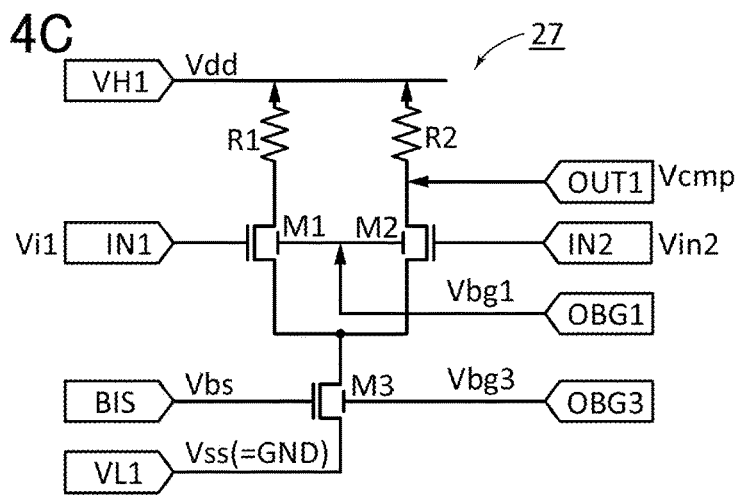

In a comparison circuit 27 shown in FIG. 4C, resistors R1 and R2 are provided instead of the transistors MP1 and MP2, respectively.

<Configuration Examples 9 to 11 of Comparison Circuit>

Figure 5A:
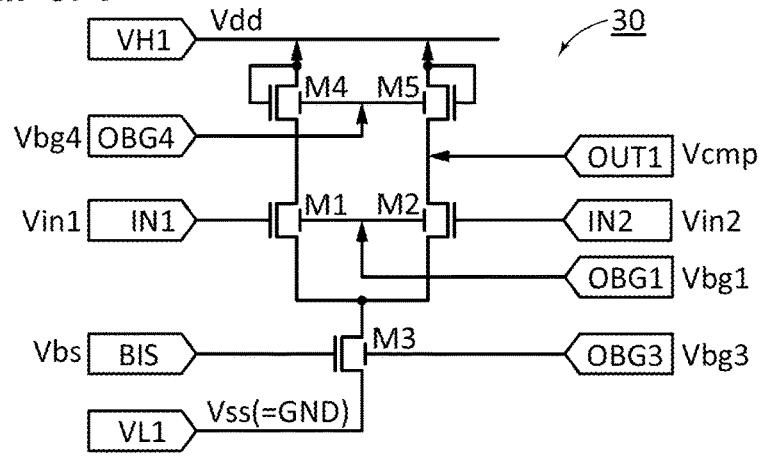
FIGS. 5A to 5C are circuit diagrams each illustrating a configuration example of a comparison circuit.
Figure 5B:
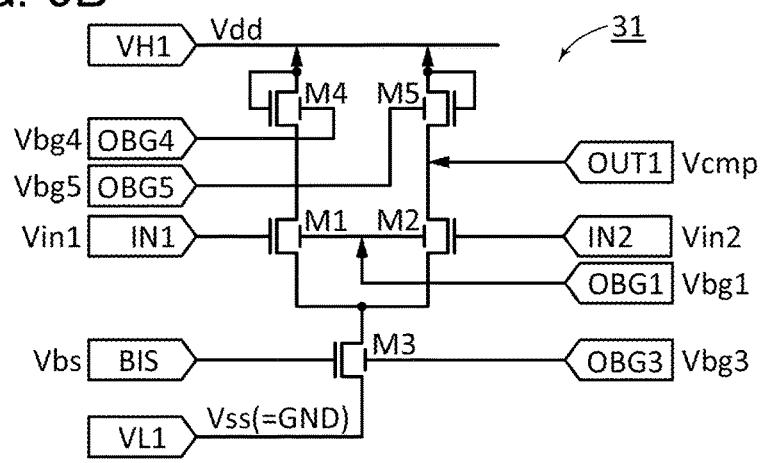
Figure 5C:
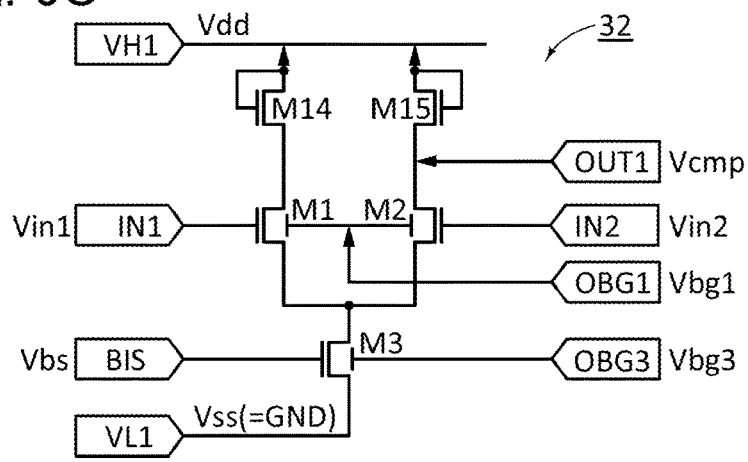

Comparison circuits shown in FIGS. 5A to 5C are examples in which two n-channel transistors serve as loads.

A comparison circuit 30 shown in FIG. 5A includes a terminal OBG4 and transistors M4 and M5. The transistors M4 and M5 are diode-connected transistors and serve as loads.

The transistors M4 and M5 each have a backgate. The transistors M4 and M5 can be OS transistors, similarly to the transistor M1. The backgates of the transistors M4 and M5 are electrically connected to the terminal OBG4. The terminal OBG4 is a terminal for inputting a bias potential. A potential Vbg4 is input to the terminal OBG4. The backgate potentials of the transistors M4 and M5 are adjusted with the potential Vbg4, whereby drain current flowing in the transistors M4 and M5 can be adjusted. For example, when the potential Vbg4 is a positive potential, the transistors M4 and M5 can have higher current drive capabilities.

A comparison circuit 31 shown in FIG. 5B is a modification example of the comparison circuit 30. The comparison circuit 31 includes a terminal OBG5. The backgate of the transistor M5 is electrically connected to the terminal OBG5. The terminal OBG5 is a terminal for inputting a bias potential. The potential Vbg5 is input to the terminal OBG5.

In the comparison circuit 31, the backgate potentials of the transistors M4 and M5 can be controlled independently. In other words, by the input of the potentials Vbg4 and Vbg5, the amount of Vt shift of the transistor M4 and that of the transistor M5 can be determined independently. The potentials Vbg4 and Vbg5 are determined to cancel variation in electrical characteristics of the transistors M4 and M5.

A comparison circuit 32 shown in FIG. 5C is a modification example of the comparison circuit 30. The comparison circuit 31 includes, instead of the transistors M4 and M5, transistors M14 and M15 which do not have a backgate. The transistors M14 and M15 can be OS transistors, similarly to the transistor M1, or may be Si transistors.

<Configuration Examples 12 and 13 of Comparison Circuit>

Figure 6A:
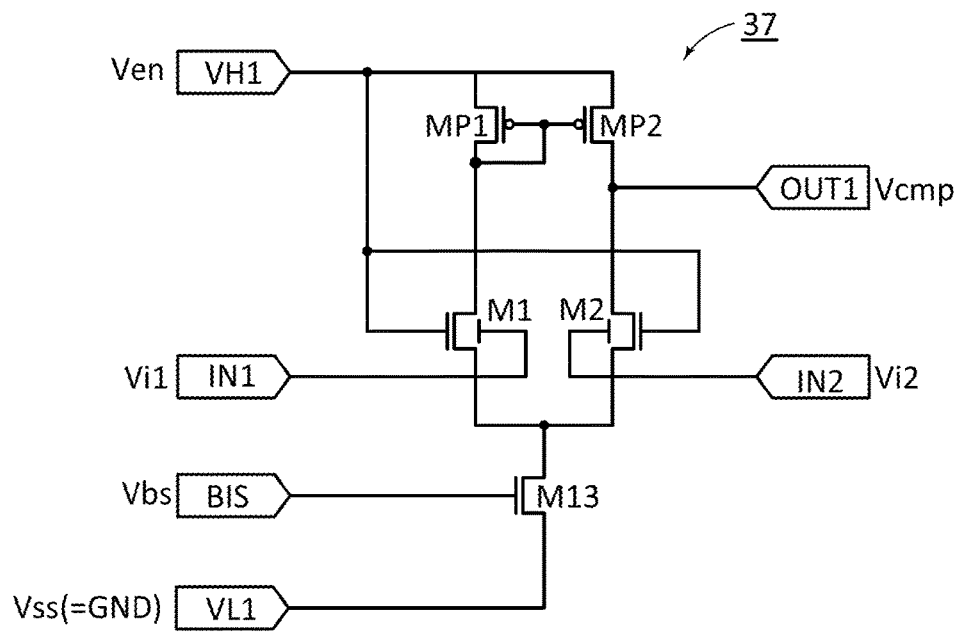
FIGS. 6A and 6B are circuit diagrams illustrating a configuration example of a comparison circuit.

A comparison circuit 37 shown in FIG. 6A is a modification example of the comparison circuit 21. In the comparison circuit 37, a terminal IN1 is electrically connected to the backgate of the transistor M1, a terminal IN2 is connected to the backgate of the transistor M2, and the terminal VH1 is electrically connected to the gate of the transistor M1 and the gate of the transistor M2. In the comparison circuit 37, not the potential Vdd but a potential Ven is applied to the terminal VH1. The potential Ven is an enable signal. The comparison circuit 37 is operated while the potentials Ven and Vbs are high potentials. When the comparison circuit 37 is in a standby mode, the potentials Ven and Vbs can be 0 V (the ground potential).

As in the comparison circuits described above, when Vi1<Vi2, the potential Vcmp output from the terminal OUT1 is at a low level, whereas when Vi1>Vi2, the potential Vcmp is at a high level in the comparison circuit 37.

Figure 6B:
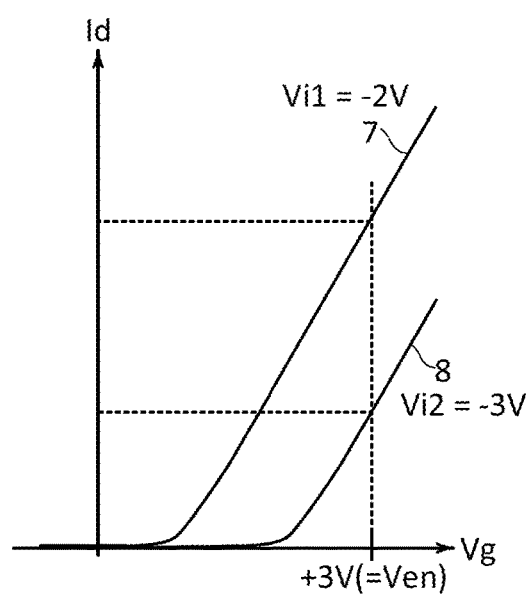

For example, FIG. 6B schematically shows the Id-Vg characteristics of the transistors M1 and M2 when −2 V and −3 V are applied to the potentials Vi1 and Vi2, respectively. Curves 7 and 8 represent the Id-Vg characteristics of the transistors M1 and M2, respectively.

As a potential applied to a backgate is larger, the Vt of an n-channel transistor is shifted more in the negative direction; thus, the Vt of the transistor M1 is smaller than the Vt of the transistor M2. When +3 V (=Ven) and +3 V (=Vbs) are input to the terminals VH1 and BIS, respectively, the comparison circuit 37 is activated. Since the amount of drain current the transistor M1 can output is higher than that of the transistor M2, the potential Vcmp becomes at a high level.

A gate insulating layer on the backgate side of the transistor M1 is preferably thicker than an insulating layer on the gate side. The absolute value of the potential Vi1 that is input to the backgate of the transistor M1 can be higher than the absolute value of the potential Ven that is input to the gate of the transistor M1. The same applies to the transistor M2. As a result, the comparison circuit 37 can compare high negative potentials.

The transistor M13 of the comparison circuit 37 may be a Si transistor or an OS transistor. When the transistor M13 is an OS transistor, the transistor M13 can have a backgate.

The comparison circuit 37 can directly compare two negative potentials without a complex circuit configuration. The comparison circuit 37 can have higher accuracy because the potential Vss can be 0 V. Since the transistors M1 and M2 are OS transistors, the channel formation regions of the transistors M1 and M2 can be insulated from the substrate without employing the triple-well structure. As a result, the circuit area of the comparison circuit 37 can be reduced.

Figure 7:
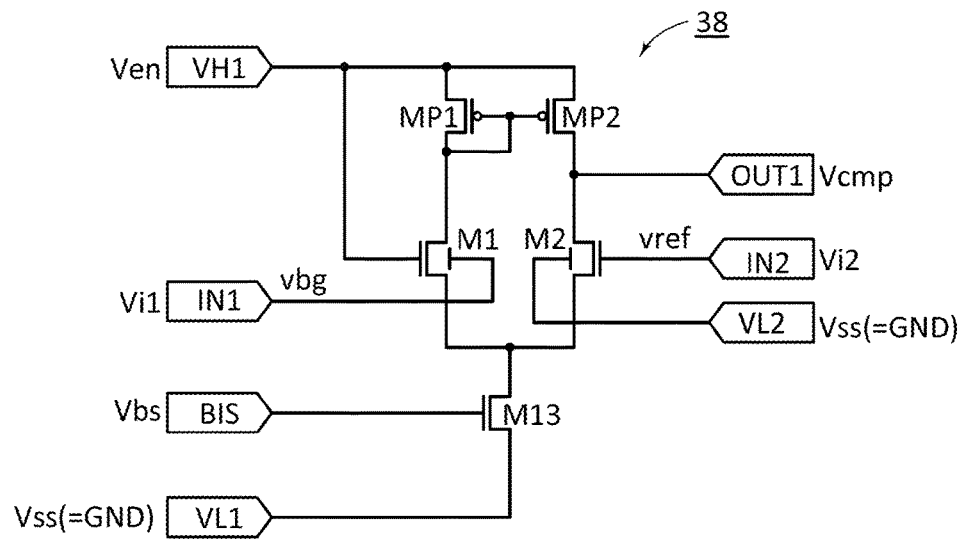
FIG. 7 is a circuit diagram illustrating a configuration example of a comparison circuit.

A comparison circuit 38 shown in FIG. 7 is a modification example of the comparison circuit 37. In the comparison circuit 38, the terminal IN2 is connected to the backgate of the transistor M2, and a terminal VL2 is connected to the backgate of the transistor M2. Like the terminal VL1, the terminal VL2 is an input terminal for the potential Vss. Similarly to the comparison circuit 37, the comparison circuit 38 is operated while the potentials Ven and Vbs are high potentials. When the comparison circuit 38 is in a standby mode, the potentials Ven and Vbs can be 0 V (the ground potential).

The comparison circuit 38 can apply a negative potential and a positive potential as the potential Vi1 and the potential Vi2, respectively. For example, when +3 V, +3 V, and +2 V are applied as the potentials Ven, Vbs, and Vi2, respectively, the transistor M2 is turned on and drain current flows. That is, the transistor M2 is regarded as a resistor having a particular resistivity. Drain current also flows in the transistor M1 because a high potential is applied to its gate. The channel resistance of the transistor M1 can be changed using the potential Vi1. That is, the transistor M1 can be regarded as a changeable resistor. When the potential Vi1 is changed and the channel resistance of the transistor M1 is smaller than that of the transistor M2, the potential Vcmp that is output from the terminal OUT1 is at high level. In contrast, when the channel resistance of the transistor M1 is larger than that of the transistor M2, the potential Vcmp that is output from the terminal OUT1 is at low level. By the above operation, the comparison circuit 38 compares potentials applied to the terminals IN1 and IN2.

The transistor M13 of the comparison circuit 38 may be a Si transistor or an OS transistor. When the transistor M13 is an OS transistor, the transistor M13 can have a backgate.

The comparison circuit 38 can directly compare a negative potential and a positive potential without a complex circuit configuration. The comparison circuit 38 can have higher accuracy because the potential Vss can be 0 V. Since the transistors M1 and M2 are OS transistors, the channel formation regions of the transistors M1 and M2 can be insulated from the substrate without employing the triple-well structure. As a result, the circuit area of the comparison circuit 38 can be reduced.

<Configuration Examples 14 and 15 of Comparison Circuit>

Figure 8A:
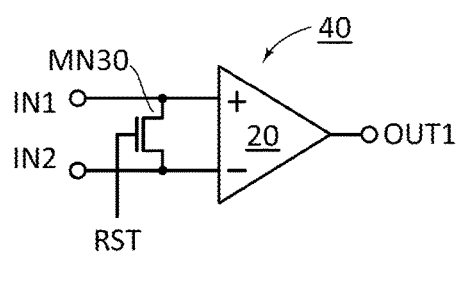
FIGS. 8A and 8B are circuit diagrams each illustrating a configuration example of a comparison circuit.
Figure 8B:
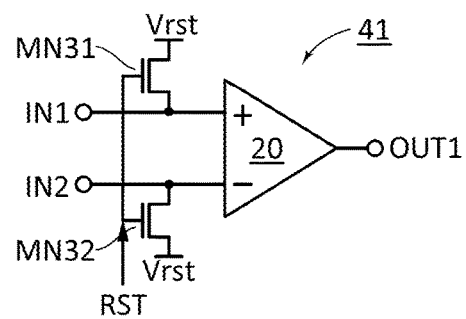

FIGS. 8A and 8B show configuration examples of a resettable comparison circuit.

A comparison circuit 40 shown in FIG. 8A is the comparison circuit 20 further including a transistor MN30. A comparison circuit 41 shown in FIG. 8B is the comparison circuit 20 further including a transistor MN31 and a transistor MN32. Note that the comparison circuit 40 may be the comparison circuits in other configuration examples. The same applies to the comparison circuit 41.

The transistor MN30 of the comparison circuit 40 serves as a switch for setting the terminals IN1 and IN2 to the same potential. A signal RST (a reset signal) is input to a gate of the transistor MN30.

The transistor MN31 of the comparison circuit 41 is configured to reset the potential of the terminal IN1 to a potential Vrst. The transistor MN32 is configured to reset the potential of the terminal IN2 to the potential Vrst. The signal RST is input to gates of the transistors MN31 and MN32. For example, the potential Vss is input as the potential Vrst.

The transistor MN30 may be a Si transistor or an OS transistor. When the transistor MN30 is an OS transistor, the transistor MN30 can have a backgate that is electrically connected to the gate. The transistor MN30 may be a p-channel transistor. The same is applied to the transistors MN31 and MN32.

Embodiment 2

Described in this embodiment is an example of a semiconductor device including the comparison circuit shown in Embodiment 1.

<<Structure Example 1 of Potential Generation System>>

Figure 9A:
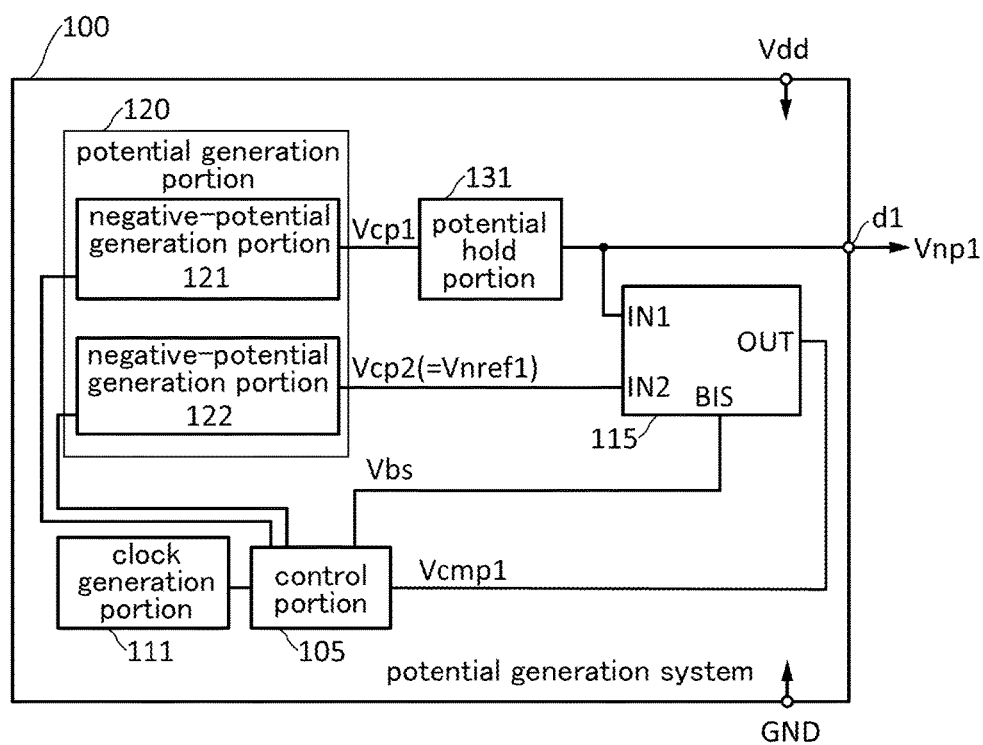
FIG. 9A is a block diagram illustrating a structure example of a potential generation system.

A semiconductor device that is configured to generate a negative potential will be described. FIG. 9A is a block diagram illustrating a structure example of a potential generation system. A potential generation system 100 is configured to generate and output a potential Vnp1. The potential Vnp1 is a negative potential. The potential generation system 100 includes a control portion 105, a clock generation portion 111, a potential comparison portion 115, a potential generation portion 120, a potential hold portion 131, and a terminal d1. The terminal d1 is an output terminal for the potential Vnp1. The potentials Vdd and GND are input to the potential generation system 100. The potential GND is a potential used as the low power supply potential Vss.

The clock generation portion 111 generates a reference clock signal. The reference clock signal is input to the control portion 105.

The control portion 105 is configured to control over the potential generation system 100. The control portion 105 is configured to generate the potential Vbs and a control signal for controlling the potential generation portion 120. When the comparison circuit 40 or 41 (see FIG. 8A or 8B) is employed to the potential comparison portion 115, the control portion 105 is configured to generate the signal RST.

The potential generation portion 120 includes negative-potential generation portions 121 and 122. The negative-potential generation portion 121 is configured to supply a negative potential to the terminal d1. The negative-potential hold portion 131 is configured to hold the potential of the terminal d1.

A potential Vcp1 is an output potential for the negative-potential generation portion 121. The potential hold portion 131 holds a potential Vnp1. The potential Vnp1 is input to the terminal d1 and the terminal IN1 of the potential comparison portion 115. The negative-potential generation portion 122 is configured to supply a reference potential Vnref1 to the terminal IN2 of the potential comparison portion 115. In this example, the output potential Vcp2 of the negative-potential generation portion 122 is used as the reference potential Vnref1. The potentials Vnp1, Vcp1, and Vcp2 are negative potentials.

<Negative-Potential Generation Portion>

Each of the negative-potential generation portions 121 and 122 can be formed with a charge pump circuit. Described below is a structure example of the negative-potential generation portion 121. Note that the below-described structure example can be applied to the negative-potential generation portion 122.

Figure 10A:
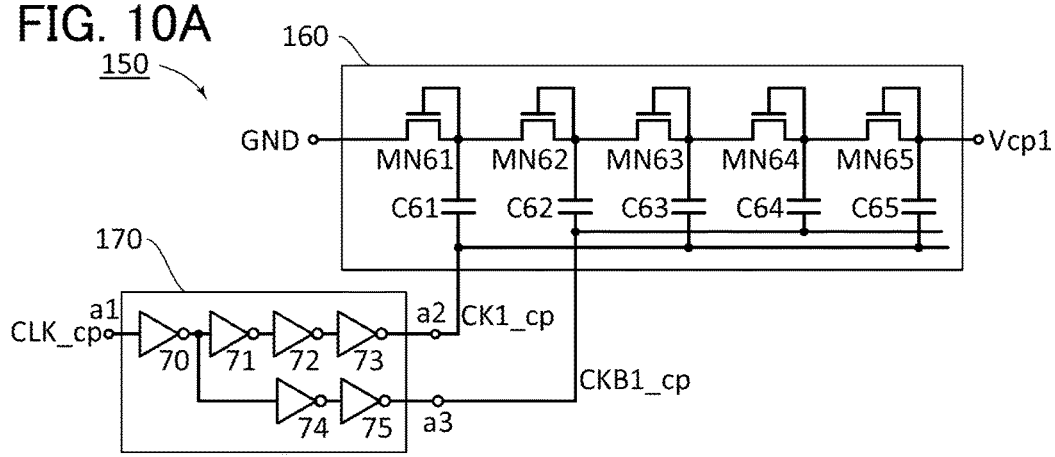
FIG. 10A is a circuit diagram illustrating a structure example of a negative-potential generation portion.

A negative-potential generation circuit 150 shown in FIG. 10A includes a charge pump circuit 160 and a clock buffer circuit 170.

(Clock Buffer Circuit)

The clock buffer circuit 170 includes inverters 70 to 75 and terminals a1 to a3. The clock buffer circuit 170 is configured to generate signals CK1_*cp* and CKB1_*cp* from the signal CLK_cp. The terminal a1 is an input terminal for the signal CLK_cp. The terminals a2 and a3 are output terminals for the signals CK1_*cp* and CKB1_*cp*, respectively. The signal CLK_cp is a clock signal that is output from the control portion 105. For example, the control portion 105 divides the reference clock signal and generates the signal CLK_cp. The signals CK1_*cp* and CKB1_*cp* are complementary clock signals.

Figure 10B:
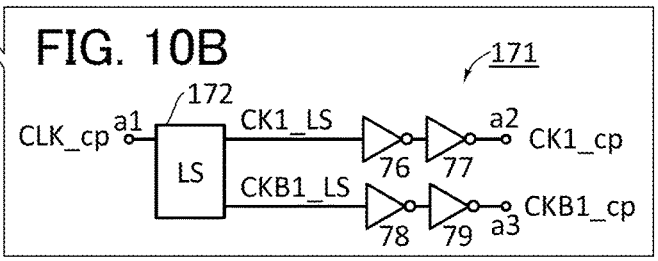
FIG. 10B is a circuit diagram illustrating a configuration example of a clock generation circuit.

The clock buffer circuit may include a level shifter (LS) as shown in a structure example of FIG. 10B. A clock buffer circuit 171 shown in FIG. 10B includes an LS 172 and inverters 76 to 79. The LS 172 level-shifts the signal CLK_cp to generate signals CK1_LS and CKB1_LS. The signals CK1_*cp* and CKB1_*cp* are output from the inverters 77 and 79, respectively.

Although the clock buffer circuit 170 includes six inverters, the number of inverters is not limited to six. The clock buffer circuit 170 includes at least the inverters 70 and 71. The clock buffer circuit 170 can serve as a delay circuit for the signal CLK_cp. The number of inverters can be determined depending on the delay time. For example, the same applies to the clock buffer circuit 171.

(Charge Pump Circuit)

The charge pump circuit 160 is a step-down charge pump circuit which lowers the pressure of the potential GND to generate the potential Vcp1. Note that the input potential is not limited to the potential GND. The charge pump circuit 160 includes transistors MN61 to MN65 and capacitors C61 to C65. The number of stages of the charge pump circuit 160 is five but is not limited thereto.

The transistors MN61 to MN65 are diode-connected n-channel Si transistors. Instead of the transistors MN61 to MN65, diode-connected p-channel Si transistors or diode-connected OS transistors may be provided. The OS transistors may have backgates as shown in FIGS. 10C to 10E.

Figure 10C:
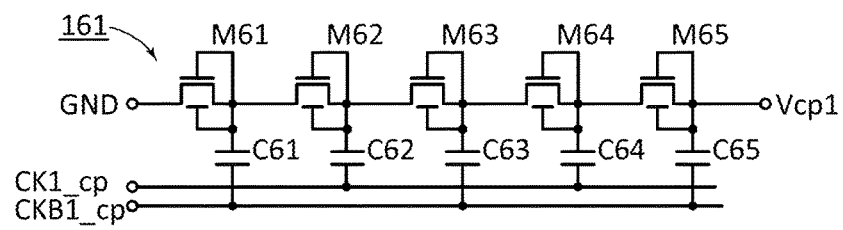
FIGS. 10C to 10E are circuit diagrams each illustrating a configuration example of a charge pump circuit.
Figure 10D:
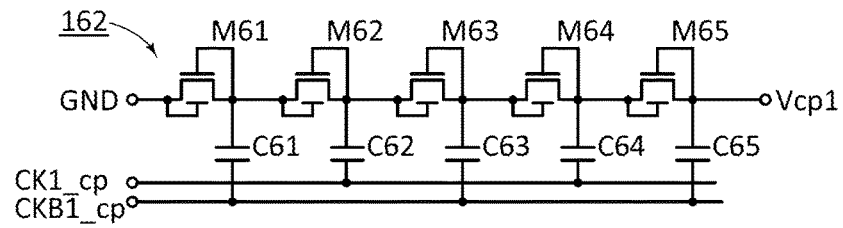
Figure 10E:
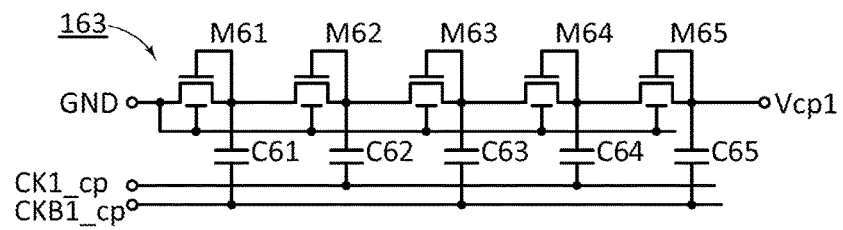

The charge pump circuit 161 shown in FIG. 10C includes the transistors MN61 to MN65 and the capacitors C61 and C65. Charge pump circuits 162 and 163 shown in FIGS. 10D and 10E are modification examples of the charge pump circuit 161.

In these examples, a Dickson charge pump circuit is provided in the negative-potential generation portion 121, but a Cockcroft-Walton charge pump circuit may be provided instead.

<Potential Hold Portion>

Figure 11:
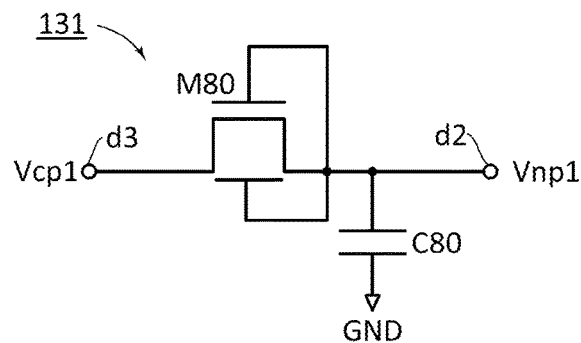
FIG. 11 is a circuit diagram illustrating a structure example of a potential hold portion.

FIG. 11 shows a structure example of the potential hold portion 131. The potential hold portion 131 includes a transistor M80, a capacitor C80, and terminals d2 and d3. The terminal d2 is electrically connected to the terminal d1 and the terminal IN1 of the potential comparison portion 115. The terminal d3 is electrically connected to the output terminal of the negative-potential generation portion 121 so that the potential Vcp1 is input. The transistor M80 is an OS transistor having a backgate. The transistor M80 is a diode-connected transistor. A first terminal of the capacitor C80 is electrically connected to a drain, gate, and backgate of the transistor M80.

When the negative-potential generation portion 121 starts operating, the pressure of the terminal d2 is lowered together with the terminal d3. In the structure example of FIG. 11, the relation between the potential Vnp1 of the terminal d2, the potential Vcp1 of the terminal d3, and the threshold voltage of the transistor M80 (Vt_m80) is represented by Vnp1=Vcp1−Vt_m80. The negative-potential generation portion 121 generates the potential Vcp1 so that the potential Vnp1 is lower than 0 V.

Since Vt_m80 is lower than 0 V, Vnp1 is higher than Vcp1. The operation of the negative-potential generation portion 121 is stopped, whereby a reverse bias voltage is input to the diode-connected transistor M80, so that the capacitor C80 can hold the potential Vnp1 that is lower than 0 V.

When the potential hold portion 131 holds the potential Vnp1, a negative potential is input to the backgate of the transistor M80. Thus, cut-off current of the transistor M80 can be reduced, and leakage of electric charges from the capacitor C80 can be suppressed. Owing to this, the negative-potential generation portion 121 can be in a standby state for a longer time, and power consumption of the potential generation system 100 can be reduced effectively.

Note that the cutoff current refers to drain current when the transistor's gate-source voltage is 0 V.

Note that the transistor M80 may be a Si transistor or an OS transistor. The OS transistor is particularly preferable because the off-state current of the transistor M80 can be small and the withstand voltage between the source and drain can be increased.

Since an oxide semiconductor has a band gap of 2 eV or more, the off-state current of an OS transistor can be extremely small. Specifically, the off-state current per micrometer in channel width at room temperature (25° C.) and at a source-drain voltage of 3.5 V can be lower than $1\times10^{-20}$ A, lower than $1\times10^{-22}$ A, or lower than $1\times10^{-24}$ A. That is, the on/off ratio of drain current can be greater than or equal to 20 digits and less than or equal to 150 digits.

An oxide semiconductor is a semiconductor which has a large energy gap and in which electrons are unlikely to be excited and the effective mass of a hole is large. Accordingly, an avalanche breakdown and the like are less likely to occur in an OS transistor than in a Si transistor. Since hot-carrier degradation or the like due to the avalanche breakdown is inhibited, the OS transistor has high withstand voltage between the source and drain.

<Negative-Potential Comparison Portion>

Any of the comparison circuits shown in Embodiment 1 is employed to the potential comparison portion 115. The comparison circuit 20 is employed to the potential comparison portion 115. The potentials Vref1 and Vnp1 are input to the terminals IN2 and IN1, respectively. For example, the potential Vdd is input to the terminals OBG1 and OBG3. Potentials input to the terminals OBG1 and OBG3 may be generated in the control portion 105.

The potential comparison portion 115 is configured to monitor the potential Vnp1 that is lower than the reference potential Vnref1. If the potential Vnp1 is lower than the reference potential Vnref1, the potential Vcmp1 is at a low level. If the potential Vnp1 is higher than or equal to the reference potential Vnref1, the potential Vcmp1 is at a high level.

<Control Portion>

Figure 9B:
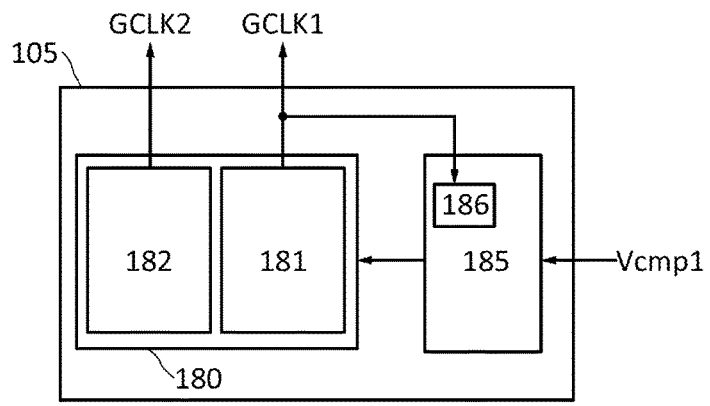
FIG. 9B is a block diagram illustrating a structure example of a control portion.

FIG. 9B is a structure example of the control portion 105. The control portion 105 includes a clock generation portion 180 and a logic portion 185. The clock generation portion 180 is composed of clock generation portions 181 and 182.

The clock generation portions 181 and 182 generate signals GCLK1 and GCLK2, respectively. The signal GCLK1 is a clock signal supplied to the negative-potential generation portion 121. The signal GCLK2 is a clock signal supplied to the negative-potential generation portion 122.

The logic portion 185 has a function of generating a control signal for the clock generation portion 180. The logic portion 185 includes a counter 186. The counter 186 has a function of counting the clock number of the signal GCLK1. The logic portion 185 has a function of generating a control signal for the clock generation portion 181 on the basis of the count value counted by the counter 186 and a function of generating a control signal for the clock generation portion 181 on the basis of the potential Vcmp1.

<<Operation Example>>

Figure 12:
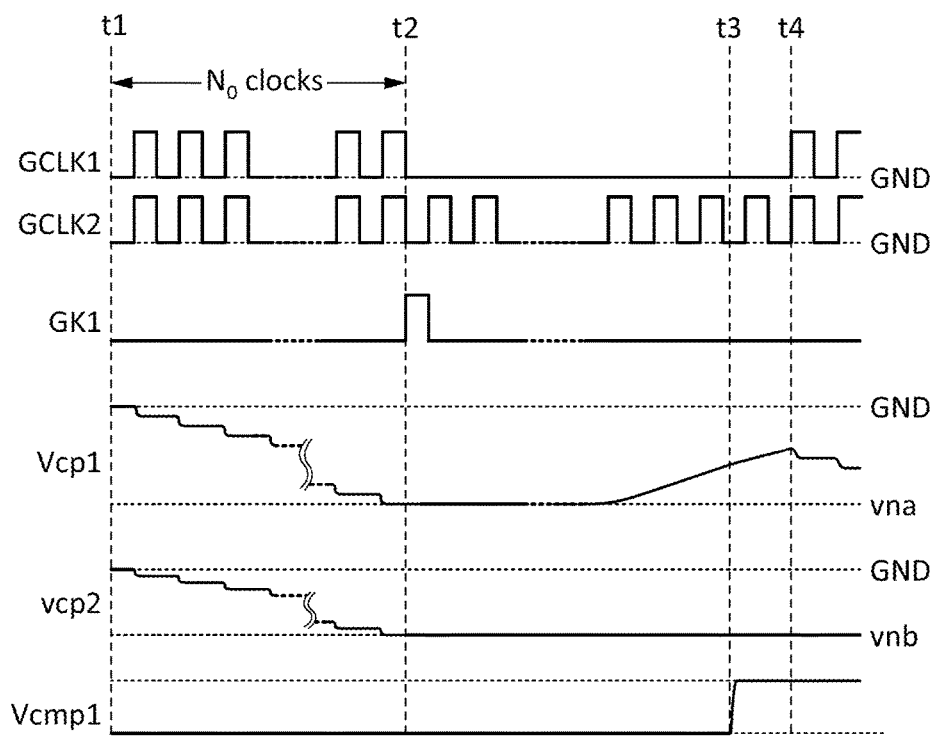
FIG. 12 is a timing chart showing an operation example of a potential generation system.

There is no need to operate the negative-potential generation portion 121 all the time because the potential hold portion 131 is provided. The negative-potential generation portion 121 can be brought into a stand-by state when needs not be operated. The control portion 105 controls the operation of the negative-potential generation portion 121 depending on the potential Vcmp1. An operation example of the potential generation system 100 is described with reference to FIG. 12. FIG. 12 is a timing chart for the operation example of the potential generation system 100. Time is denoted by t1, t2, t3, and t4.

In this example, the negative-potential generation portion 121 is designed to make the potential Vcp1 reach a set potential vna by the No-clock-input of the signal GCLK1 to the negative-potential generation portion 121. The same applies to the negative-potential generation portion 122, in which case a potential vnp is a set potential for the negative-potential generation portion 122. A signal GK1 is a control signal for the clock generation portion 181 that is generated by the logic portion 185 and is a signal for stopping generation of the signal GCLK1.

At the time t2 in FIG. 12, it appears that Vcp1=vna and Vcp2=vnb. Note that the values of the potentials vna and vnb at the time t2 are values in the design specifications and may have margin errors.

At the time t1, the signals GCLK1 and GCLK2 are input to the negative-potential generation portions 121 and 122, respectively. At the time t1, the counter 186 counts the clock number of the signal GCLK1. When the count value counted by the counter 186 becomes No at the time t2, the logic portion 185 generates the signal GK1 to output to the clock generation portion 181. By the input of the signal GK1, the clock generation portion 181 stops generating the signal GCLK1. After the time t2, the potential GND is input as the signal GCLK1 to the negative-potential generation portion 121, and the negative-potential generation portion 121 is brought into a stand-by state. After the time t2, the clock generation portion 182 continues its operation and outputs the signal GCLK2 to the negative-potential generation portion 122.

The potential Vnp1 output from the potential generation system 100 is supplied to other semiconductor devices. The potential Vcp1 is increased with the potential Vnp1 due to leakage current of the transistor M80 in the potential hold portion 131 and the like.

When the potential Vnp1 exceeds the potential Vnref1 at the time t3, the potential Vcmp1 is changed from a low level to a high level. The logic portion 185 in the control portion 105 detects the high-leveled potential Vcmp1, generates a signal for starting operation of the clock generation portion 181, and outputs the signal to the clock generation portion 181. At the time t4, the signal GCLK1 is input to the negative-potential generation portion 121, so that the negative-potential generation portion 121 recovers from the stand-by state to an operation state. The potential Vcmp1 is kept at high level for a while after the input of the signal GCLK1, and is reduced to low level when the potential Vnp1 becomes the potential Vnref1 or lower.

At the time t4, the counter 186 in the control portion 105 performs counting of the signal GCLK1. When the count value counted by the counter 186 becomes No, the signal GK1 is generated.

These operations are repeated, and the potential generation system 100 can stably output the potential Vnp1. The potential comparison portion 115 can directly compare two negative potentials, the potential Vnp1 and the reference potential Vnref. Owing to this, the potential generation system 100 can have high reliability without complicated circuit configuration.

From the time t3 to time t4, the control portion 105 sets the negative-potential generation portion 121 in a standby-state using clock gating. If necessary, the negative-potential generation portion 121 may be in a stand-by state using power gating.

<<Structure Example 2 of Potential Generation System>>

Figure 13A:
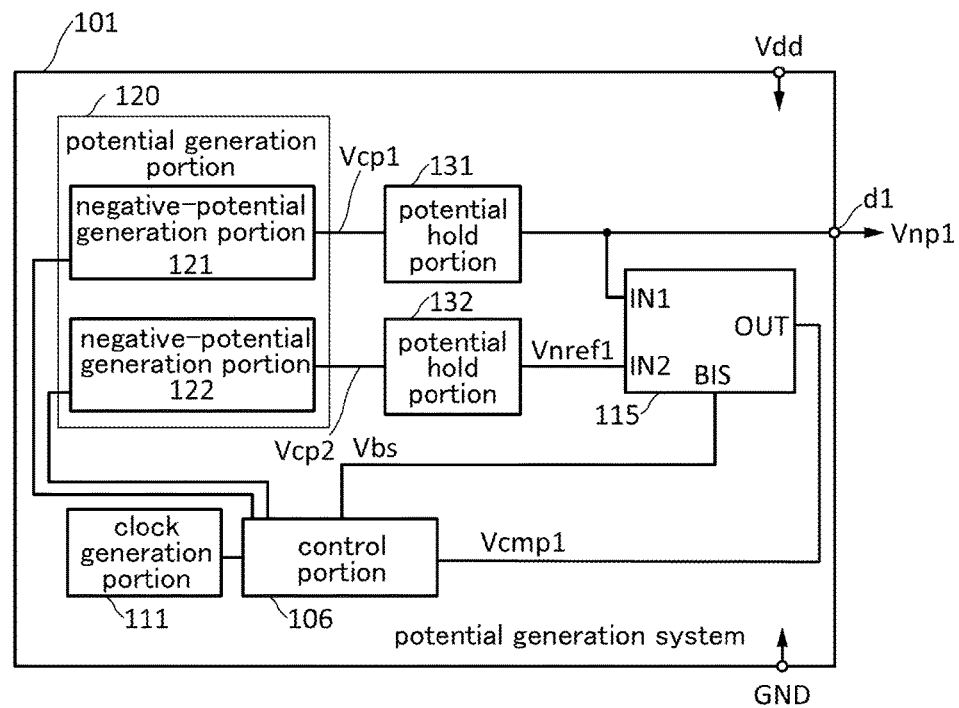
FIG. 13A is a block diagram illustrating a configuration example of a potential generation system.

FIG. 13A shows another structure example of the potential generation system. A potential generation system 101 shown in FIG. 13A has the structure of the potential generation system 100 and further includes a potential hold portion 132. The potential hold portion 132 has a function of holding the potential of the terminal IN2. Owing to this, there is no need to operate pressure-lowering all the time in the negative-potential generation portion 122, as in the negative-potential generation portion 121.

The potential hold portion 132 has a circuit configuration similar to that of the potential hold portion 131. The potential held by the potential hold portion 132 is input to the terminal IN2 of the potential comparison portion 115 as the reference potential Vnref2. The potential generation system 101 is operated similarly to the potential generation system 100.

Figure 13B:
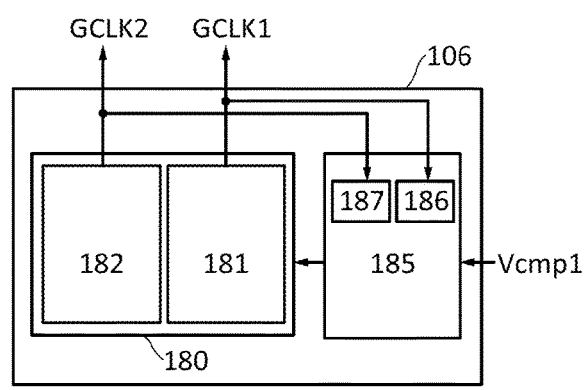
FIGS. 13B and 13C are block diagrams each showing a structure example of a control portion.

In addition, the potential generation system 101 includes a control portion 106 instead of the control portion 105. FIG. 13B shows a structure example of the control portion 106. The control portion 106 shown in FIG. 13B includes a logic portion 185 that includes a counter 187. The counter 187 has a function of counting the clock number of the signal GCLK2. Thus, the logic portion 185 has a function of, in addition to the above-described functions, generating a control signal for the clock generation portion 182 on the basis of the count value counted by the counter 187 and a function of generating a control signal for the clock generation portion 182 on the basis of the potential Vcmp1. The clock number of the signal GCLK1 and that of the signal GCLK2 can be counted independently; thus, the operation of the negative-potential generation portion 121 and that of the negative-potential generation portion 122 can be stopped at different times.

Figure 13C:
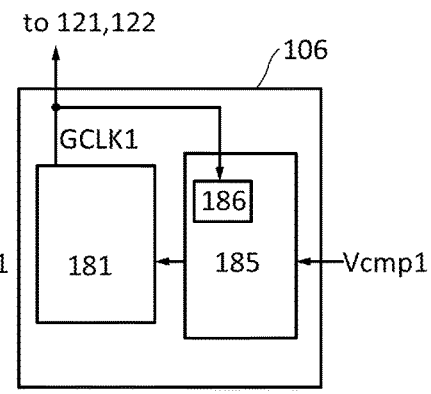

On the contrary, when the negative-potential generation portion 122 can be operated in synchronization with the negative-potential generation portion 121, the clock generation portion 182 for generating the signal GCLK2 is not necessarily provided in the control portion 106. FIG. 13C shows a structure example of the control portion 106 without the clock generation portion 182. In the example of FIG. 13C, the signal GCLK1 is supplied from the clock generation portion 181 to the negative-potential generation portions 121 and 122.

<<Structure Example 3 of Potential Generation System>>

Figure 14:
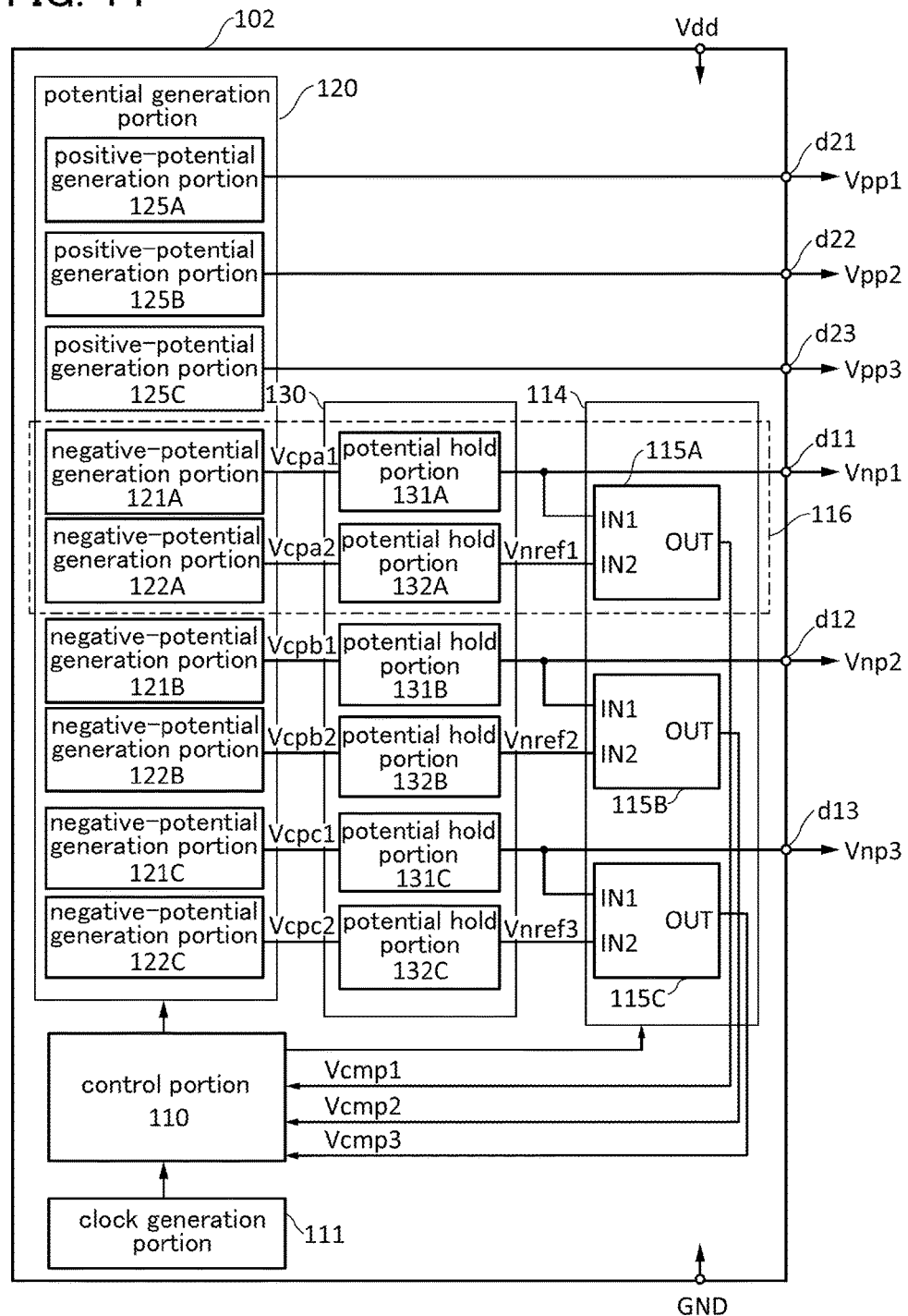
FIG. 14 is a block diagram illustrating a configuration example of a potential generation system.

FIG. 14 shows another structure example of a potential generation system. A potential generation system 102 shown in FIG. 14 is configured to generate a plurality of potentials.

The potential generation system 102 shown in FIG. 14 is configured to generate potentials Vnp1, Vnp2, Vnp3, Vpp1, Vpp2, and Vpp3. The potentials Vnp1 to Vnp3 are negative potentials. The potentials Vpp1 to Vpp3 are positive potentials.

The potential generation system 102 includes a control portion 110, a clock generation portion 111, a potential generation portion 120, a potential comparison portion 114, a potential hold portion 130, and terminals d11, d12, d13, d21, d22, and d23. The control portion 110 has a function of controlling the potential generation portion 120 and the potential comparison portion 114. The terminals d11, d12, and d13 are output terminals for the potentials Vnp1, Vnp2, and Vnp3, respectively. The terminals d21 to d23 are output terminals for the potentials Vpp1 to Vpp3, respectively.

The potential generation portion 120 includes positive-potential generation portions 125A, 125B, and 125C and negative-potential generation portions 121A, 121B, 121C, 122A, 122B, and 122C. The potential hold portion 130 includes potential hold portions 131A, 131B, 131C, 132A, 132B, and 132C. The potential comparison portion 114 includes potential comparison portions 115A, 115B, and 115C.

The positive-potential portions 125A, 125B, and 125C respectively generate the potentials Vpp1, Vpp2, and Vpp3 from the potential Vdd and/or GND. A charge pump circuit, a regulator, or the like can be used for the positive-potential generation portion 125A. The same is applied to the positive-potential generation portions 125B and 125C.

The negative-potential generation portions 121A, 121B, and 121C generate potentials Vcpa1, Vcpb1, and Vcpc1, respectively. Their structures and functions are similar to those of the negative-potential generation portion 121. The negative-potential generation portions 122A, 122B, and 122C generate potentials Vcpa2, Vcpb2, and Vcpc2, respectively. Their structures and functions are similar to those of the negative-potential generation portion 122.

The potential hold portions 131A, 131B, and 131C hold potentials of the terminals d11, d12, and d13, respectively. The terminal d11 is electrically connected to the terminal IN1 of the potential comparison portion 115A. The same applies to the terminals d12 and d13.

The potential hold portion 132A holds the potential of the terminal IN2 of the potential comparison portion 115A. The same applies to the potential hold portions 132B and 132C. The potentials held by the potential hold portions 132A to 132C are output as the reference potentials Vnref1 to Vnref3 to the potential comparison portions 115A to 115C, respectively.

The structures and functions of the potential comparison portions 115A, 115B, and 115C are similar to those of the potential comparison portion 115. The potential comparison portions 115A, 115B, and 115C output the potentials Vcmp1, Vcmp2, and Vcmp3, respectively. The control portion 110 has a function similar to that of the control portion 106. The control portion 110 controls the operations of the negative-potential generation portions 121A and 122A based on the potential Vcmp1, controls the operations of the negative-potential generation portions 121B and 122B based on the potential Vcmp2, and controls the operations of the negative-potential generation portions 121C and 122C based on the potential Vcmp3.

In this structure example, the unit 116 including 2 negative-potential generation portions, 2 potential hold portions, and 1 potential comparison portion is a basic unit for generation of a negative potential. The number of the unit 116 provided in the potential generation system 102 depends on the number of output negative potentials. Note that some or all of the units do not necessarily include the potential hold portion for holding the reference potential. In addition, in this structure example, the number of positive-potential generation portions can be determined depending on the number of output positive potentials.

The potential generation system in this embodiment is suitable for a power supply circuit in a variety of semiconductor devices. As a semiconductor device used for a power supply circuit in the potential generation system, there are a variety of semiconductor devices in which a substrate bias potential is a negative potential (e.g., a DRAM, an image sensor), a semiconductor device driven by a negative potential (e.g., a memory device such as a flash memory), and a semiconductor device including an OS transistor having a backgate, for example. In Embodiment 3, a structure example of a semiconductor device including the potential generation system is described.

Embodiment 3

<<Memory Device 200>>

A memory device 200 shown in FIG. 15A includes a potential generation portion 201, a control portion 202, a cell array 203, and a periphery circuit 208. The periphery circuit 208 includes a sense amplifier circuit 204, a driver 205, a main amplifier 206, and an input output circuit 207.

The memory cell array 203 includes a plurality of memory cells 209. The memory cells 209 are electrically connected to wirings WL, LBL (or LBLB), and BGL. The wiring WL is a word line. The wirings LBL and LBLB are local bit lines.

FIG. 15B shows a structure example of the memory cell 209. The memory cell 209 includes a transistor MW1 and a capacitor CS1. The memory cell 209 has a circuit configuration similar to that of a memory cell for a DRAM. The transistor MW1 in this example is an OS transistor having a backgate. The backgate of the transistor MW1 is electrically connected to a wiring BGL. Since the transistor MW1 is an OS transistor, the memory cell 209 does not consume power while data is held. In other words, the memory cell 209 is a low-power-consuming memory cell that can hold data for a long time.

The driver 205 is electrically connected to a plurality of wirings WL and CSEL. The driver 205 generates signals output to the plurality of wirings WL and CSEL.

The cell array 203 is stacked over the sense amplifier circuit 204. The sense amplifier circuit 204 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA are configured to amplify the potential difference between the wirings LBL and LBLB.

In the sense amplifier circuit 204, one wiring GBL is provided for four wirings LBL, and one wiring GBLB is provided for four wirings LBLB. However, the configuration of the sense amplifier circuit 204 is not limited to the configuration example of FIG. 15A.

The main amplifier 206 is connected to the sense amplifier circuit 204 and the input output circuit 207. The main amplifier 206 is configured to amplify the potential difference between the wirings GBL and GBLB. The main amplifier 206 is not necessarily provided.

The input output circuit 207 has a function of inputting a potential corresponding to a write data to the wiring GBL and a function of outputting the potential of the wiring GBL or an output potential of the main amplifier 206 to the outside as a read data.

The sense amplifier SA from which data is read and the sense amplifier SA to which data is written can be selected in accordance with the signal of the wiring CSEL. Therefore, there is no need to provide a selection circuit such as a multiplexer in the input output circuit 207. Thus, the input output circuit 207 can have a simple circuit configuration and a small occupied area.

The control portion 202 has a function of controlling the memory device 200. For example, the control portion 202 controls the driver 205, the main amplifier 206, and the input output circuit 207.

The potentials Vdd and GND are input as power supply potentials to the memory device 200. Potentials other than the potentials Vdd and GND are generated in the potential generation portion 201. The potentials generated in the potential generation portion 201 is input to the circuits in the memory device 200. The potential Vdd is used as a drive potential for the OS transistor (the transistor MW1). The drive potential for the OS transistor may be generated in the potential generation portion 201.

The potential generation portion 201 has a function of generating the potential Vbg_w1. The potential Vbg_w1 is input to the wiring BGL. For example, the potential Vbg_w1 is set to a negative potential, and the Vt of the transistor MW1 is shifted in the positive potential side. As a result, the retention time of the memory cell 209 can be increased.

The potential generation system 102 can be employed to the potential generation portion 201. The memory device 200 can be driven with a single power source owing to the potential generation portion 201. In addition, the circuits included in the memory device 200 can be integrated into one IC chip.

Although the example of FIG. 15A shows a folded-bit-line random access memory (RAM), an open-bit-line RAM may be alternatively employed.

<<Memory Device 220>>

Figure 16A:
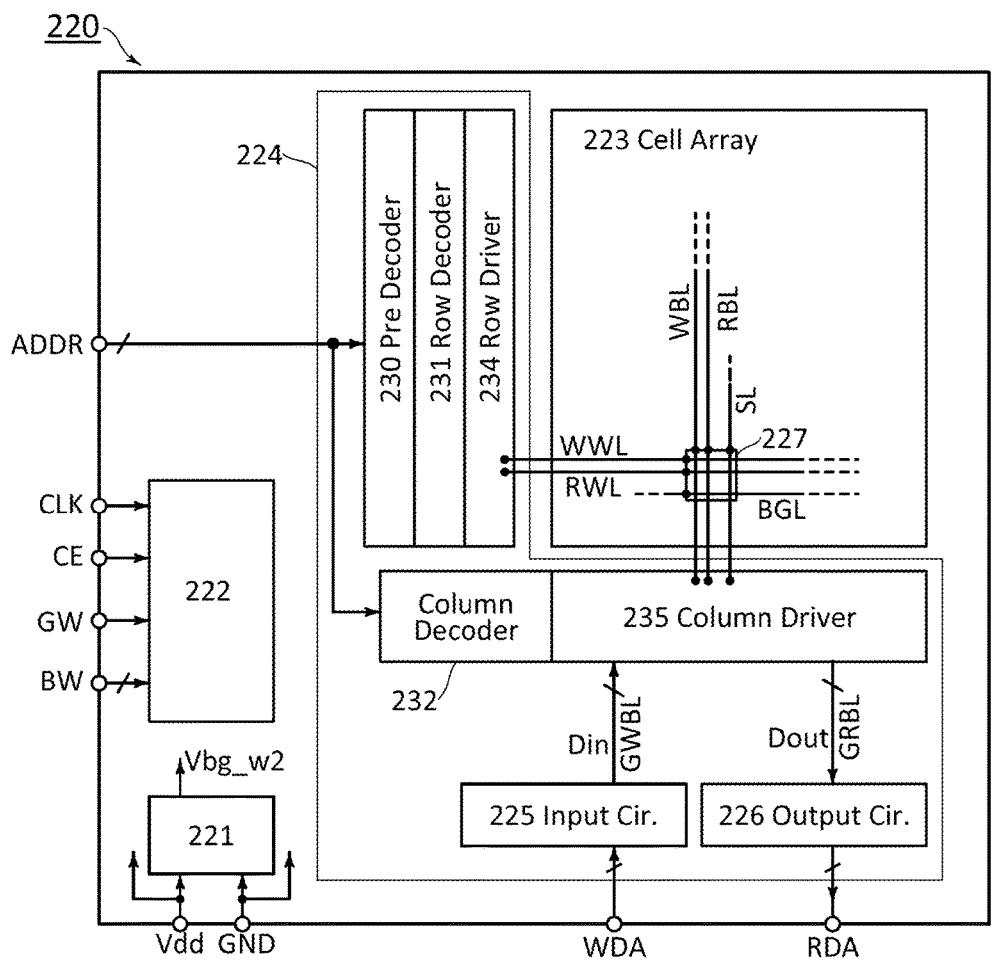
FIG. 16A is a block diagram showing a configuration example of a memory device.

A memory device 220 shown in FIG. 16A includes a potential generation portion 221, a control portion 222, a cell array 223, and a peripheral circuit 224. The peripheral circuit 224 includes an input circuit 225, an output circuit 226, a predecoder 230, a row decoder 231, a column decoder 232, a row driver 233, and a column driver 234.

In the memory device 220, the circuits, signals, and voltages are selected and used as appropriate. Another circuit or another signal may further be incorporated. Structures (e.g., bit lengths) of an input signal and an output signal of the memory device 220 are determined in accordance with the architecture of a host device connected to the memory device 220, the operation mode of the memory device 220, the configuration of the cell array 223, and the like.

Signals CLK, CE, GW, BW, ADDR, and WDA are signals input from the outside. A signal RDA is a signal output to the outside. The signal CLK is a clock signal. The signals CE, GW, and BW are control signals. The signal CE is a chip enable signal. The signal GW is a global write enable signal. The signal BW is a byte write enable signal. The signal ADDR is an address signal. The signal WDA is a write data signal. The signal RDA is a read data signal.

The control portion 222 is a logic circuit having a function of controlling the entire operation of the memory device 220. For example, the control portion 222 performs a logical operation on the signals CE, GW, and BW to determine the operation mode. The control portion 222 generates a control signal for the peripheral circuit 224 so that the operation mode can be performed. The control portion 222 may have a function of generating an internal clock signal from the signal CLK.

The cell array 223 includes a plurality of memory cells 227, a plurality of wirings WWL, a plurality of wirings RWL, a plurality of wirings WBL, a plurality of wirings RBL, a plurality of wirings SL, and a plurality of wirings BGL. The plurality of memory cells 227 are arranged in a matrix. In each row, the memory cells 227 are electrically connected to the wirings WWL, RWL, and BGL. In each column, the memory cells 227 are electrically connected to the wirings WBL, RBL, and SL. The wiring WWL is a write word line. The wiring RWL is a read word line. The wiring WBL is a write bit line. The wiring RBL is a read bit line. The wiring SL is a source line.

Figure 16B:
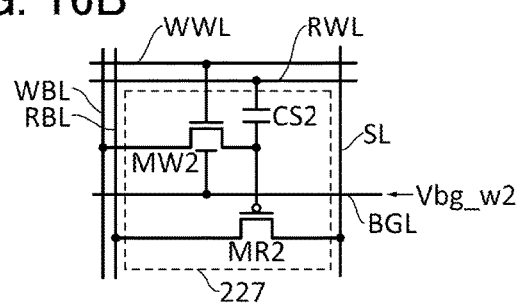
FIG. 16B is a circuit diagram showing a structure example of a memory cell.

FIG. 16B shows a structure example of the cell array 223. The memory cell 227 in this example is a 2-transistor gain cell. The memory cell 227 includes a transistor MW2, a transistor MR2, and a capacitor CS2. The transistor MW2 is an OS transistor having a backgate, which is electrically connected to the wiring BGL. A potential Vbg_w2 is input to the wiring BGL. The potential Vbg_w2 is a potential generated in the potential generation portion 221.

Since the transistor MW2 is an OS transistor, the memory cell 227 is a low-power-consuming memory cell in which power is not consumed for data retention and data can be retained for a long time. Thus, the memory device 220 can be used as a non-volatile memory device. Since the transistor MW2 and the capacitor C2 can be stacked over the transistor MR2, the integration degree of the cell array 223 can be increased.

The peripheral circuit 224 is a circuit for writing and reading data to/from the cell array 223. The peripheral circuit 224 is configured to drive the wirings WWL, RWL, WBL, RBL, and SL, for example.

The predecoder 230, the row decoder 231, and the column decoder 232 are configured to decode the signal ADDR. The predecoder 230 is provided in the case where the cell array 223 is divided into a plurality of blocks, for example. In that case, the predecoder 230 is configured to specify a block to be accessed. The row decoder 231 is configured to specify a row to be accessed. The column decoder 232 is configured to specify a column to be accessed.

The column driver 234 has a function of writing data to the cell array 223, a function of reading the data from the cell array 223, a function of amplifying the read data, and a function of retaining the read data, for example. More specifically, the column driver 234 has a function of controlling voltages of the wirings WBL, RBL, and SL, for example.

The row driver 233 has a function of activating the wirings WWL and RWL in a row specified by the row decoder 231. By activating the wiring WWL, the memory cell 227 in the specified row is selected and data is written to the selected memory cell 227 by the column driver 234. By activating the wiring RWL, the memory cell 227 in the specified row is selected. Data is written to the selected memory cell 227 by the column driver 234.

The input circuit 225 is configured to hold the WDA. The data held in the input circuit 225 is output to the column driver 234 through a wiring GWBL (global write bit line). Din is data that is output from the input circuit 225 and written to the cell array 223.

A data signal Dout that is read from the memory cell by the column driver 234 is output to the output circuit 226 through a wiring GRBL (global read bit line). The output circuit 226 is configured to hold the data signal Dout. The output circuit 226 outputs the held data to the outside of the memory device 220. The data signal output from the output circuit 226 is the signal RDA.

The potentials Vdd and GND are input as power supply potentials to the memory device 220. Potentials other than the potentials Vdd and GND are generated in the potential generation portion 201 and input to the circuits in the memory device 200. The potential Vdd is used as a drive potential for the OS transistor (the transistor MW2). Needless to say, the drive potential for the OS transistor may be generated in the potential generation portion 201.

For example, the potential generation portion 221 has a function of generating the potential Vbg_w2. For example, the potential Vbg_w2 is set to a negative potential, and the Vt of the transistor MW2 is shifted in the positive side. As a result, the retention time of the memory cell 227 can be increased.

The potential generation system 102 can be employed to the potential generation portion 221. The memory device 200 can be driven when the potential generation portion 221 is used for a power-supply circuit. The circuits included in the memory device 220 can be integrated into one IC chip.
(Cell Array)

FIGS. 17A to 17E show other structure examples of the cell array. Each figure shows the configuration in one row and one column.

Figure 17A:
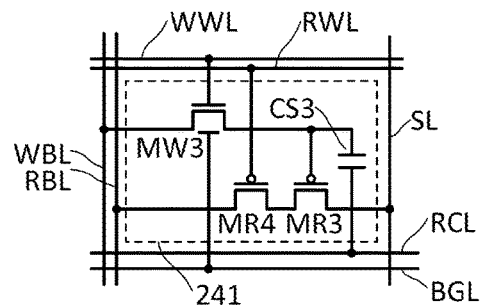
FIGS. 17A to 17E are circuit diagrams each illustrating a configuration example of a memory cell.

FIG. 17A shows a configuration example of a cell array with a 3-transistor gain cell. A wiring RCL is provided for each row of the cell array in FIG. 17A. A memory cell 241 is electrically connected to the wirings WWL, RWL, WBL, RBL, SL, RSL, and BGL. The memory cell 241 includes transistors MW3, MR3, and MR4, and a capacitor CS3. The transistor MW3 is an OS transistor with a backgate. The backgate is electrically connected to the wiring BGL. The transistors MR4 and MR3 are p-channel Si transistors.

Figure 17B:
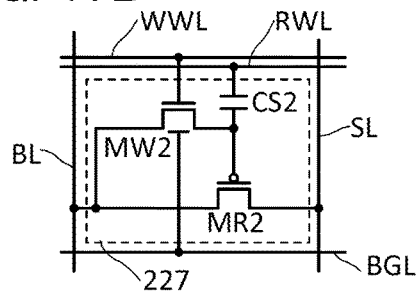
Figure 17C:
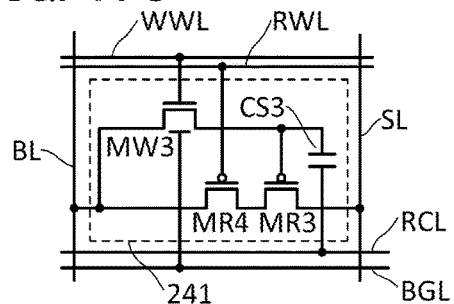

A cell array shown in FIG. 17B is a modification example of FIG. 16B, and a cell array shown in FIG. 17C is a modification example of FIG. 17A. In these cell arrays, a bit line for writing and reading (wiring BL) is provided instead of the wirings WBL and RBL.

Figure 17D:
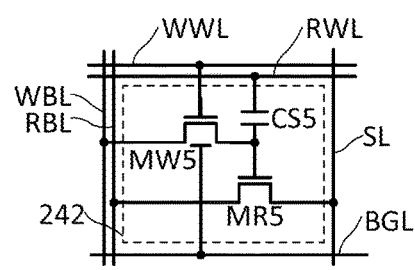

A cell array shown in FIG. 17D is a modification example of FIG. 16B. In FIG. 17D, in which an n-channel Si transistor is used instead of the transistor MR2. A memory cell 242 shown in FIG. 17D is electrically connected to the wirings WWL, RWL, WBL, RBL, SL, and BGL. The memory cell 242 includes transistors MW5 and MR5, and a capacitor CS5. The transistor MW5 is an OS transistor with a backgate. The transistor MR5 is an n-channel Si transistor. Also in the cell array in FIG. 17D, the wiring BL may be provided instead of the wirings WBL and RBL in a manner similar to that of FIG. 17B.

Note that when the cell array shown in FIG. 17D is employed for the memory device 220, a negative potential and a positive potential are preferably input to the wiring RWL in a non-selected row and the wiring RWL in a selected row, respectively. The negative potential input to the wiring RWL can be generated in the potential generation portion 221.

Figure 17E:
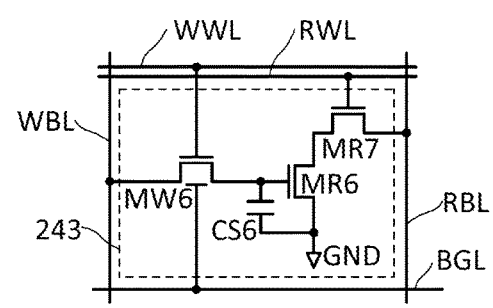

A cell array shown in FIG. 17E is a modification example of FIG. 17A, in which n-channel Si transistors are used instead of the transistors MR3 and MR4. A memory cell 243 shown in FIG. 17E is electrically connected to the wirings WWL, RWL, WBL, RBL, and BGL and a wiring to which a potential GND is input. The memory cell 243 includes transistors MW6, MR6, and MR7, and a capacitor CS6. The transistor MW6 is an OS transistor with a backgate. The transistors MR6 and MR7 are n-channel Si transistors. Also in the cell array in FIG. 17E, the wiring BL may be provided instead of the wirings WBL and RBL in a manner similar to that of FIG. 17C.

<<MCU 250>>

Figure 18:
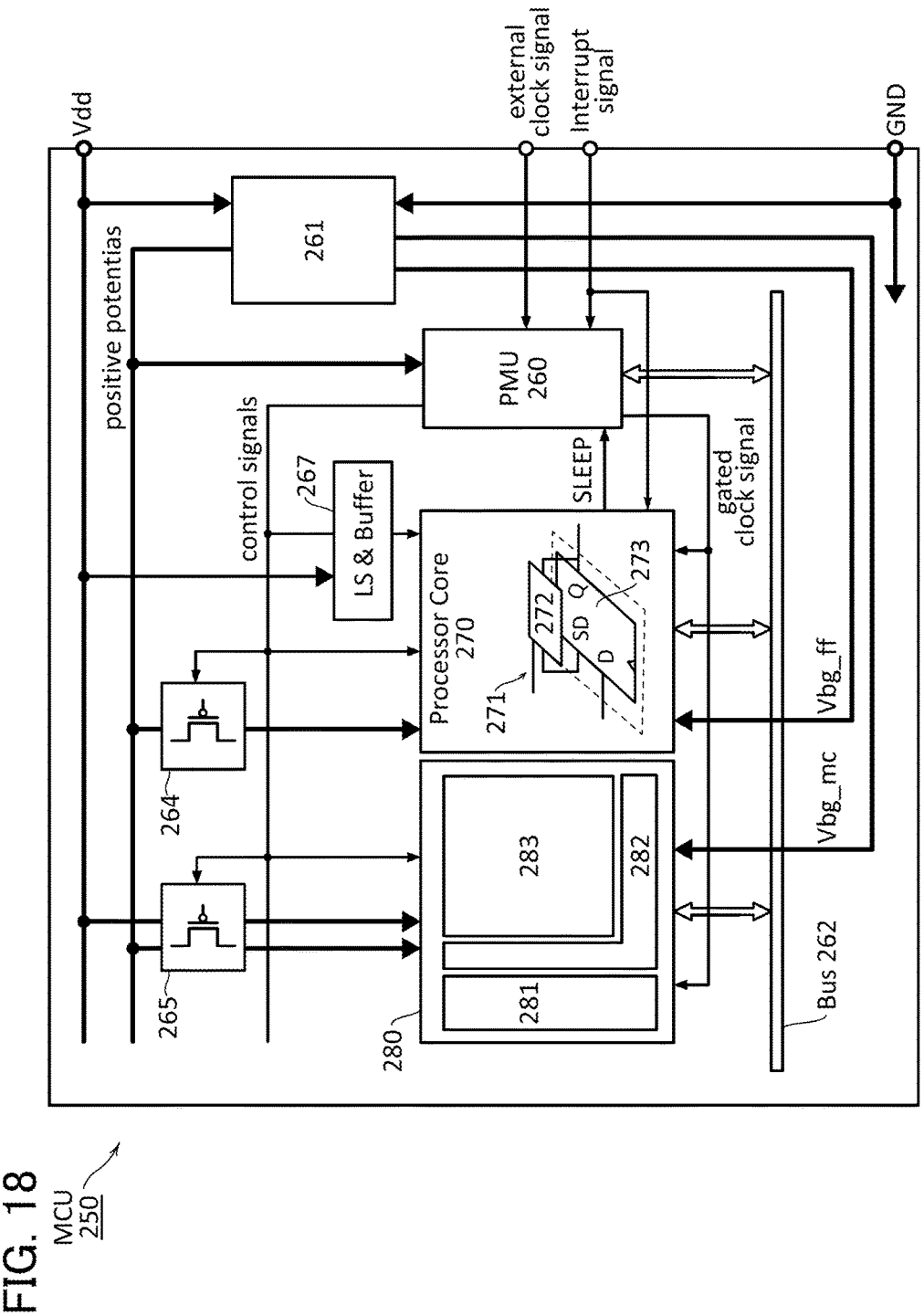
FIG. 18 is a block diagram showing a configuration example of a microcontroller unit (MCU).

FIG. 18 illustrates a structure example of a microcontroller unit (MCU). A MCU 250 in FIG. 18 is a semiconductor device that is capable of clock gating and power gating.

The MCU 250 includes a power management unit (PMU) 260, a potential generation unit 261, a bus 262, power switches 264 and 265, a level shifter (LS) and buffer circuit 267, a processor core 270 (hereinafter referred to as core 270), and a memory 280. The exchange of data and the like between the PMU 260, the core 270, and the memory 280 is performed through the bus 262.

In order to reduce the power consumption of a semiconductor device, circuits that do not need to be operated are stopped by power gating or clock gating. A flip-flop is a kind of sequential circuit (storage circuit that holds its state) included in a semiconductor device in many cases. Thus, a reduction in power consumption of the flip-flop is effective in reducing the power consumption of a semiconductor device including the flip-flop. In general, the state of the flip-flop is erased (data held therein is lost) when power supply is stopped. It is thus necessary to make backup of the state of the flip-flop so that the semiconductor device is power gated.

The core 270 includes a plurality of flip-flops 271. The flip-flop 271 is provided for a variety of registers in the core 270. The flip-flop 271 includes a backup circuit 272 and a scan flip-flop 273. In other words, the flip-flop 271 is a scan flip-flop including a backup circuit.

The backup circuit 272 is provided for the flip-flop 271 to save data of the flip-flop 271 in clock gating and power gating. The backup circuit 272 includes a plurality of OS transistors having backgates. The backup circuit 272 can be stacked over a logic cell composed of a Si transistor because no Si transistor is included in the backup circuit 272.

The memory 280 includes a control portion 281, a periphery circuit 282, and a cell array 283. The cell array 283 includes a plurality of memory cells including OS transistors. The above-described memory device can be employed for the memory 280.

Power-supply potentials such as the potentials Vdd and GND are input to the MCU 250. Positive potentials and negative potentials other than the potentials Vdd and GND are generated in the potential generation unit 261. For example, the potential generation unit 261 generates negative potentials such as potentials Vbg_ff and Vbg_mc. The potential Vbg_ff is input to the backgates of the OS transistors of the backup circuit 272. The potential Vbg_mc is input to the backgates of the OS transistors of the cell array 283. The potential Vdd here is a drive potential for OS transistors. The potential Vdd is supplied to the LS and buffer circuit 267 and the cell array 283. The potential generation unit 261 generates positive potentials such as a reference potential, a high-power-supply potential for driving an Si transistor, and the like. Needless to say, the potential generation unit 261 may generate the drive potential for the OS transistors.

A clock signal, an interrupt request signal, and the like are input to the MCU 250 from the outside. The external clock signal is input to the PMU 260. The interrupt request signal is input to the PMU 260 and the core 270.

The PMU 260 has a function of controlling clock gating and power gating. The PMU 260 generates a gated clock signal (hereinafter referred to as GCLK) from an external clock signal. The signal GCLK is input to the core 270 and the memory 280. The PMU 260 generates a variety of control signals. The control signals include control signals for the power switches 264 and 265, a control signal for the backup circuit 272, and a control signal for the scan flip-flop 273 (e.g., a reset signal).

The control signal for the backup circuit 272 is input to the LS and buffer circuit 267. The LS and buffer circuit 267 has a function of level-shift the control signal and of holding the level-shifted control signal. The control signal held by the LS and buffer circuit 267 is input to the backup circuit 272.

The power switch 264 controls supply of a positive potential to the core 270. The power switch 265 controls supply of a positive potential to the memory 280. When the core 270 includes a plurality of power supply domains, power switches corresponding to the power supply domains are provided in the power switch 264. The same applies to the power switch 265. Other than the potential Vdd, a plurality of positive potentials corresponding to the circuit configuration is input to the memory 280 through the power switch 265. The positive potentials input to the memory 280 include a power-supply potential for the control portion 281, a power-supply potential for the peripheral circuit 282, a precharge potential for the bit line, a reference potential for reading data, and the like.

A signal SLEEP is output from the processor core 270 to the PMU 260. The signal SLEEP is a trigger signal for transferring the core 270 to the sleep mode (standby mode). When the signal SLEEP is input to the PMU 260, the PMU 260 outputs a control signal for transition from the active mode to the sleep mode to a functional circuit to be controlled. The core 270 can be transferred from the active mode to the sleep mode in response to an interrupt request signal.

First, the PMU 260 stops supplying the clock signal to the core 270 to transfer it from the active mode to the sleep mode. Then, data in the scan flip-flop 273 is written to the backup circuit 272. The PMU 260 controls the power switch 264 and stops the supply of a positive potential to the core 270 as necessary.

Processing for returning the core 270 from the sleep mode to the active mode is executed by input of an interrupt request signal, for example. In response to the interrupt request signal, the PMU 260 outputs a control signal for transition from the sleep mode to the active mode to a functional circuit which is to be controlled. The PMU 260 controls the power switches 264 and 265 to restart the potential supply to the core 270 and the memory 280. Then, data held in the backup circuit 272 is recovered to the scan flip-flop 273. Finally, the supply of clock signals to the core 270 and the memory 280 is restarted.

Similarly to the core 270, the PMU 260 performs clock gating and power gating of the memory 280.

A timer circuit for counting time may be provided in the PMU 260 for power gating of the core 270 and the memory 280 on the basis of the counted time.

<Flip-Flop 271>

Figure 19:
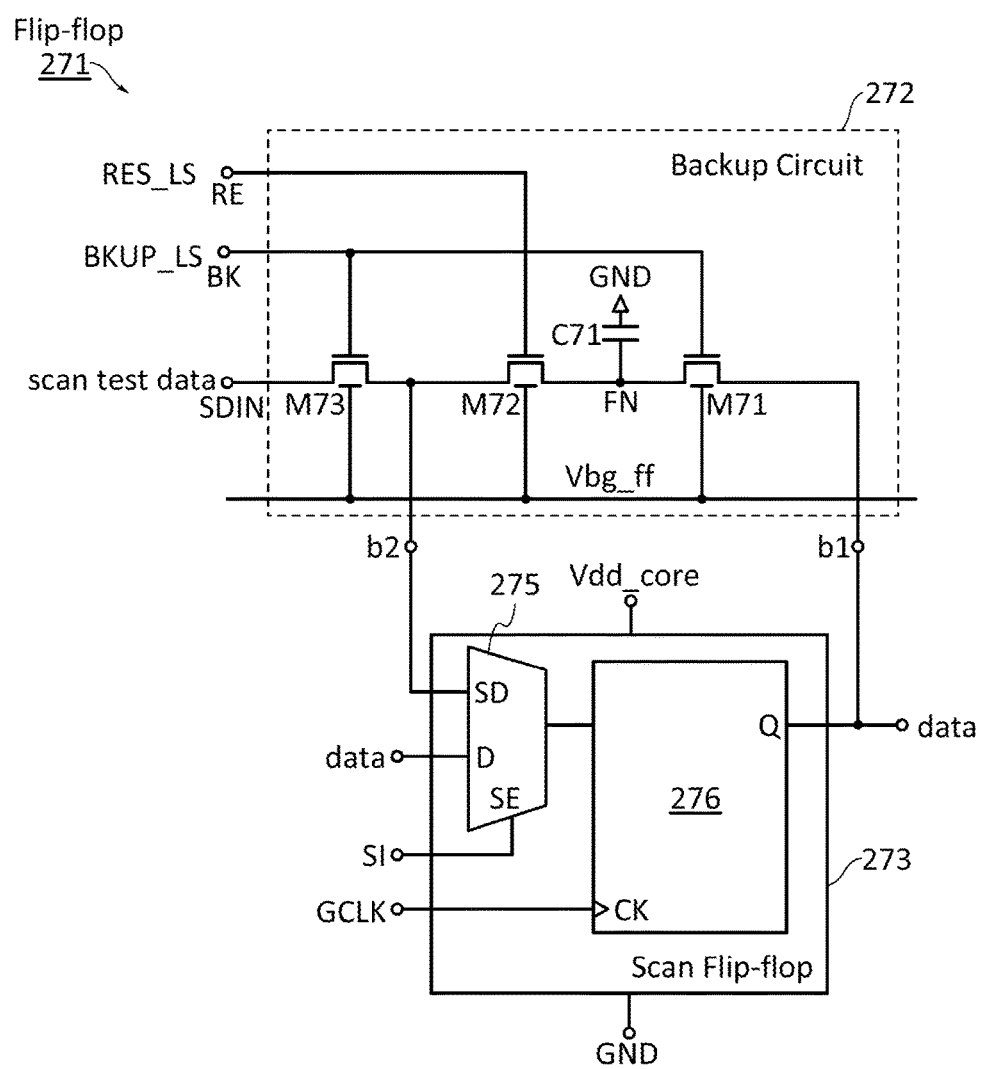
FIG. 19 is a circuit diagram illustrating a structure example of a flip-flop.

FIG. 19 shows a structure example of the flip-flop 271 (the backup circuit 272 and the scan flip-flop 273).

The circuit structure of the scan flip-flop 273 is not particularly limited. A scan flip-flop that is prepared in a circuit library can be used. The scan flip-flop 273 includes nodes D, Q, CK, SD, and SE, a selector 275, and a flip-flop 276. A signal SI is input to the node SE. The selector 275 selects either the node D or the node SD depending on the logic of the signal SI and outputs data to be input to the selected node to the flip-flop 276. The signal SI is output from the PMU 260.

A potential Vdd_core and GND are input to the scan flip-flop 273 as power supply potentials. The potential Vdd_core is a positive potential generated in the potential generation unit 261. The potential Vdd_core is supplied to the core 270 through the power switch 264.

The backup circuit 272 includes nodes RE, BK, SDIN, FN, b1, and b2, transistors M71 to M73, and a capacitor C71. The node FN is a data retention node. The capacitor C71 is electrically connected to the node FN. The node b1 is electrically connected to the node Q. The node b2 is electrically connected to the node SD. A backup signal (BKUP_LS) is input to the node BK, and a restore signal (RES_LS) is input to the node RE. The signals BKUP_LS and RES_LS are output from the LS and buffer circuit 267. The node SDIN is an input node of a scan test data.

The transistors M71 to M73 are OS transistors each including a backgate. A potential Vbg_ff is input to these backgates. Gates of the transistors M71 and M73 are electrically connected to the node BK. A gate of the transistor M72 is electrically connected to the node RE.

An operation example of the flip-flop 271 is described with reference to circuit diagrams in FIGS. 20A to 20C. In FIGS. 20A to 20C, the transistors M71 to M73 are denoted by switches.

(Normal Operation)

FIG. 20A illustrates an operation example of the flip-flop 271 in an active mode, where the flip-flop 271 performs normal operation. The flip-flop 271 takes data input from the node D and outputs retained data from the node Q in synchronization with the rise (or fall) of the signal GCLK. Since the flip-flop 821 takes data from the node D, the "L" (low-level) signal SI is input to the node SE. Since the signals BKUP_LS and RES_LS are at "L," the transistors M71 to M73 are off.

(Backup Operation)

First, the input of the signal GCLK is stopped in order to backup data of the scan flip-flop 273. The logic of the node Q is determined by this clock gating. Next, the "H" (high-level) signal BKUP_LS is input to the node BK to turn on the transistors M71 and M73 (FIG. 20B). Since the node FN is electrically connected to the node Q, the logic of the node FN is the same as that of the node Q. When the logic of the node Q is "1," the logic of the node FN is also "1." When the logic of the node Q is "0," the logic of the node FN is also "0."

Next, the "L" signal BKUP_LS is input to the node BK to turn off the transistor M71. Thus, the node FN is brought into an electrically floating state to terminate the backup operation. After the backup operation, supply of power to the potential Vdd_core to the scan flip-flop 273 is stopped as necessary. Since the transistors M71 and M72 are OS transistors that have extremely low off-state current, the backup circuit 272 can retain data for a long time.

(Restore Operation)

To start data restore operation of the scan flip-flop 273, the supply of the potential Vdd_core to the scan flip-flop 273 is restarted. Next, the "H" signal SI is input to the node SE so that data of the node SD is input to the scan flip-flop 273. The "H" signal RES_LS is input to the node RE to turn on the transistor M72. The node FN is electrically connected to the node SD, so that data of the node FN is written to the node SD (FIG. 20C). Then, the signal GCLK for one clock cycle is input to write the data of the node SD to the node Q. The scan flip-flop 273 is recovered to the state immediately after the stop of the input of the signal GCLK. In other words, the logic of the node Q of the scan flip-flop 273 is the same as the logic of the node Q immediately after the stop of the input of the signal GCLK.

The "L" signal RES_LS is input to the node RE to turn off the transistor M72; thus, the restore operation is terminated. The scan flip-flop 273 starts normal operation by restart of the input of the signal GCLK.

Since the transistors M71 and M72 are OS transistors that have extremely low off-state current, the backup circuit 272 can retain data for a long time. Input of a negative potential to the backgates of the transistors M71 and M72 is effective in increasing data retention time because cutoff current of the transistors M71 and M72 can be reduced.

When the transistors M71 to M73 are OS transistors, the transistors M71 to M73 can be stacked over the scan flip-flop 273. Thus, the backup circuit 272 can be provided without any change in design and layout of the scan flip-flop 273. Consequently, the area overhead due to the backup circuit 272 can be substantially zero.

The flip-flop 271 can backup and restore data at high speed. For example, the flip-flop 271 can complete backup operation and restore operation within several clock cycles.

The backup operation and the restore operation correspond to charging and discharging of the node FN by switching operation of the transistors M71 and M72; thus, energy required for these operations is low as in the case of a DRAM cell. In addition, since the backup circuit 272 does not consume power for data retention, the standby power of the flip-flop 271 can be reduced. Supply of power to the backup circuit 272 is not needed in normal operation; thus, even when the backup circuit 272 is provided, the dynamic power of the flip-flop 271 is not increased substantially.

Note that when the backup circuit 272 is provided, parasitic capacitance of the transistor M71 is added to the node Q. However, the parasitic capacitance of the transistor M71 is lower than parasitic capacitance due to a logic circuit connected to the node Q; thus, the influence of the parasitic capacitance of the transistor M71 on the normal operation of the flip-flop 271 is negligible. In other words, even when the backup circuit 272 is provided, there is no substantial decrease in the performance of the flip-flop 271 in the active mode.

The semiconductor device of this embodiment includes the circuit block whose operation is performed using a negative potential. Owing to the potential generation system according to Embodiment 2, a negative potential can be input to the circuit block with high accuracy, so that the semiconductor device can be operated stably. In addition, owing to the potential generation system, a semiconductor device that needs a negative potential can be operated with a single power source.

<<Imaging Device>>

Figure 21A:
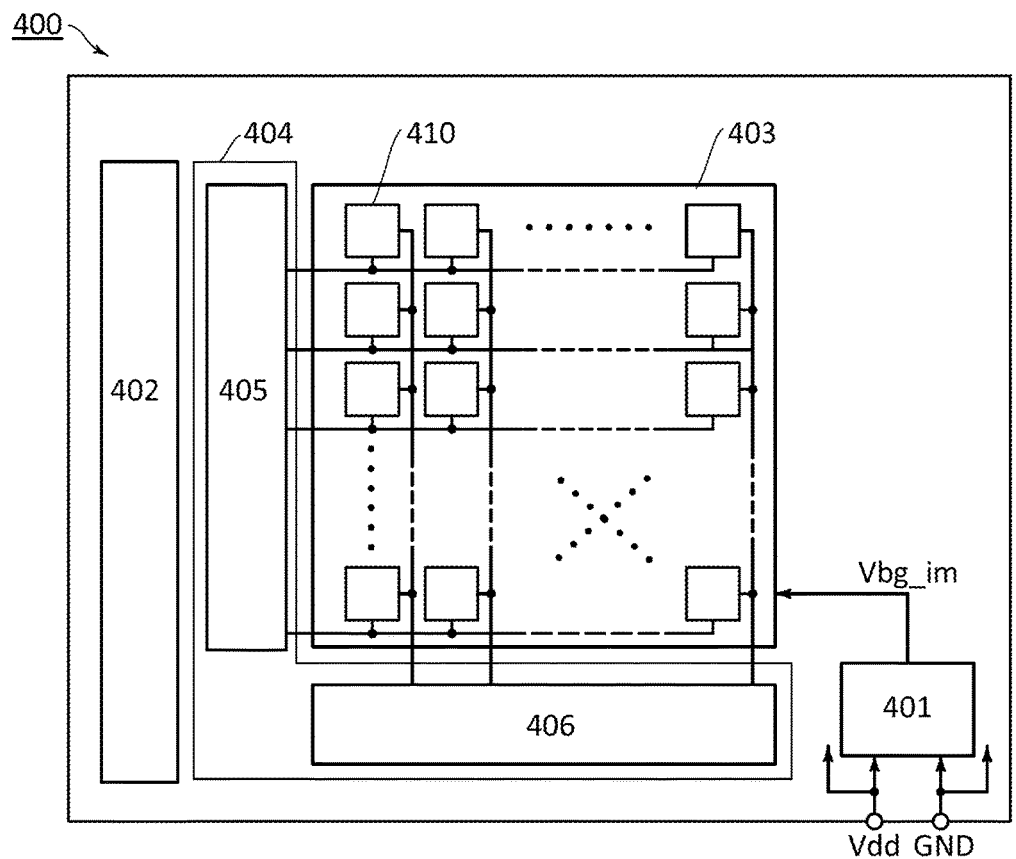
FIG. 21A is a circuit diagram showing a configuration example of an imaging device.
Figure 21B:
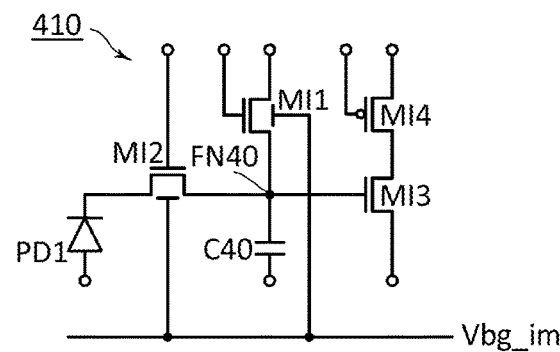
FIG. 21B is a circuit diagram showing a configuration example of a pixel.

An imaging device 400 shown in FIG. 21A includes a potential generation unit 401, a control portion 402, a pixel array 403, and a peripheral circuit 404. The peripheral circuit 404 includes a row driver 405 and a column driver 406. The pixel array 403 includes a plurality of pixels 410 arranged in a matrix of rows and columns. The pixel 410 is an image sensor, and has a function of converting light into electric charge, a function of accumulating electric charge, and the like. FIG. 21B shows an example of the pixel 410.

The pixel 410 in FIG. 21B includes a photodiode PD1, transistors MI1 to MI4, a capacitor C40, and a node FN40. The node FN40 serves as a data-holding node. The capacitor C40 is a storage capacitor for holding the voltage of the node FN40. The transistor MI1 is referred to as a reset transistor. The transistor MI1 has a function of resetting the voltage of the node FN40. The transistor MI2 is referred to as an exposure transistor that controls an exposure operation. The transistor MI2 is a pass transistor that controls a conduction state between the node FN40 and the photodiode PD1. With the transistor MI2, the exposure operation timing can be controlled; thus, an image can be taken by a global shutter method. The transistor MI3 is referred to as an amplifier transistor. The transistor MI3 has a function of generating on-state current corresponding to the voltage of the node FN40. The transistor MI4 is referred to as a selection transistor. The transistor MI4 is a pass transistor that controls a conduction state between the transistor MI3 and an output terminal of the pixel 410.

Here, the transistors MI1 and MI2 are OS transistors having backgates, the transistor MI3 is an n-channel Si transistor, the transistor MI4 is a p-channel Si transistor. A potential Vbg_im is input to the backgates of the transistors MI1 and MI2.

A PN junction or PI junction diode element over a silicon substrate, a PIN diode element using an amorphous silicon film (amorphous silicon film or a microcrystalline silicon film), or the like can be used as the photodiode PD1. Note that another photoelectric conversion element may be used instead of the photodiode in the pixel 410. For example, a diode-connected transistor may be used. A variable resistor or the like utilizing a photoelectric effect may be formed using silicon, germanium, selenium, or the like. A photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained. Amorphous selenium or crystalline selenium can be used as a selenium-based material. Crystalline selenium may be obtained by, for example, depositing amorphous selenium and then performing heat treatment. When the crystal grain size of crystalline selenium is smaller than a pixel pitch, variation in characteristics between pixels 410 can be reduced.

The potentials Vdd and GND are input as power supply potentials to the imaging device 400. The potential Vdd is used as a drive potential for the OS transistors (the transistors MI1 and MI2). The drive potential for the OS transistors may be generated in the potential generation portion 201.

Potentials other than the potentials Vdd and GND are generated in the potential generation unit 401 and input to the circuits in the imaging device 400. The potential generation portion 221 has a function of generating the potential Vbg_w2. Since the potential Vbg_im is set to a negative potential, cut-off current of the transistors MI1 and MI2 can be reduced. Thus, variation in potential of the node FN40 can be suppressed, and the imaging device 400 can perform high-accuracy imaging.

Embodiment 4

In this embodiment, an IC chip, an electronic component, electronic devices, and the like are described as examples of a semiconductor device.

<Example of Manufacturing Method of Electronic Component>

Figure 22A:
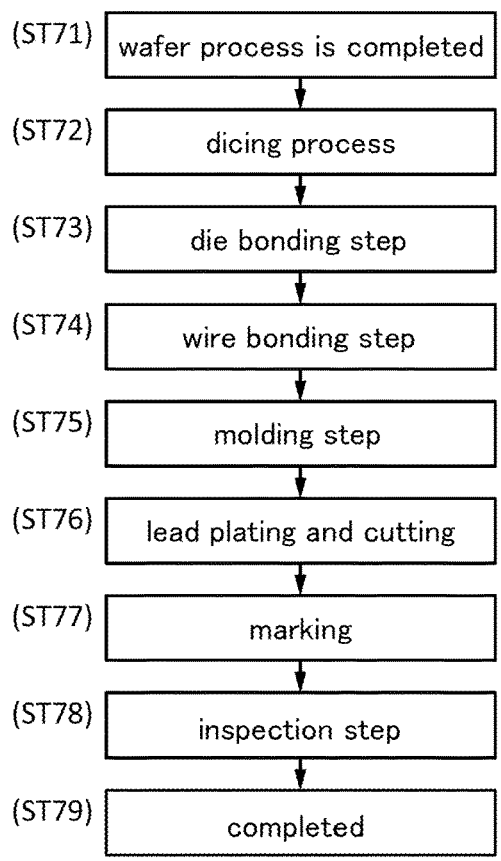
FIG. 22A is a flow chart showing an example of a method for manufacturing an electronic component.

FIG. 22A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 22A. Specifically, after an element substrate obtained in a wafer process is completed (Step ST71), a rear surface of the substrate is ground. The substrate is thinned in this step to reduce warpage or the like of the substrate in the wafer process and to reduce the size of the electronic component. Next, the substrate is divided into a plurality of chips in a dicing process (Step ST72).

Figure 22B:
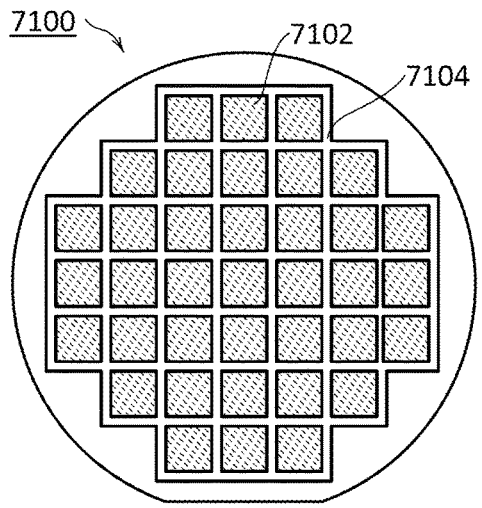
FIG. 22B is a top view of a semiconductor wafer.
Figure 22C:
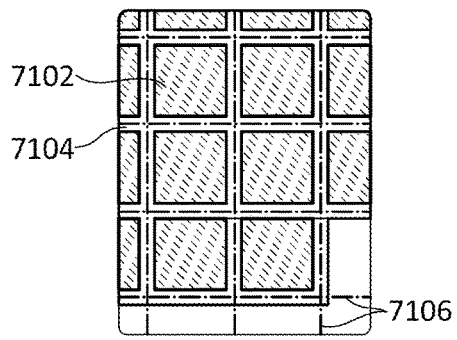
FIG. 22C is an enlarged view of part of the semiconductor wafer.

FIG. 22B is a top view of a semiconductor wafer 7100 before the dicing step. FIG. 22C is a partial enlarged view of FIG. 22B. A plurality of circuit regions 7102 are provided over the semiconductor wafer 7100. The semiconductor device of one embodiment of the present invention (e.g., a memory device, an imaging device, or an MCU) is provided in the circuit region 7102.

Figure 22D:
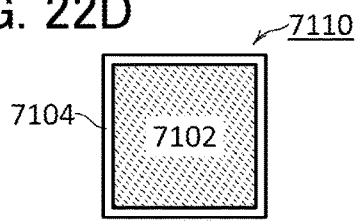
FIG. 22D is a schematic view illustrating a structure example of a chip.

The plurality of circuit regions 7102 are each surrounded by a separation region 7104. Separation lines (also referred to as dicing lines) 7106 are set at a position overlapping with the separation regions 7104. The semiconductor wafer 7100 is cut along the separation lines 7106 into chips 7110 including the circuit regions 7102 in the dicing step ST72. FIG. 22D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, which prevents a decrease in yield caused by the dicing step. A dicing step is generally performed while supplying pure water whose specific resistance is decreased by dissolution of a carbonic acid gas or the like to a cut portion, in order to cool down a substrate, remove swarf, and prevent electrification, for example. Providing a conductive layer or a semiconductor layer in the separation regions 7104 allows a reduction in the usage of pure water. Therefore, the cost of manufacturing semiconductor devices can be reduced. In addition, semiconductor devices can be manufactured with improved productivity.

After ST72, the divided chips are separately picked up to be mounted on and bonded to a lead frame in a die bonding step (Step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (Step ST74). A silver line or a gold line can be used as the metal fine line. Either ball bonding or wedge bonding may be used as wire bonding.

A molding step is performed to seal the wire bonded chip with an epoxy resin or the like (Step ST75). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (Step ST76). This plating process prevents rust of the lead and facilitates soldering at the time of mounting the chip on a printed wiring board in a later step. Printing (marking) is performed on a surface of the package (Step ST77). Through an inspection step (Step ST78), the electronic component is completed (Step ST79). When the electronic component includes the semiconductor device described in the above embodiment, a low-power small electronic component can be provided.

Figure 22E:
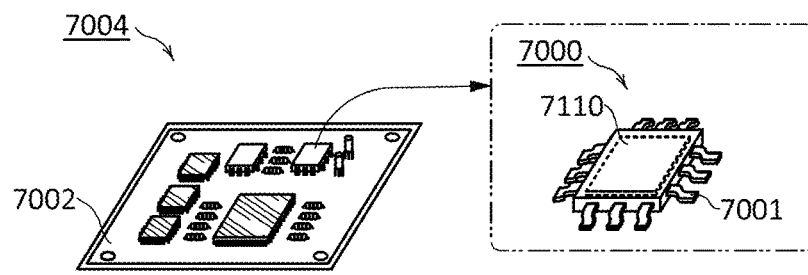
FIG. 22E is a schematic perspective view illustrating a structure example of the electronic component.

FIG. 22E is a schematic perspective view of the completed electronic component. FIG. 22E illustrates a schematic perspective view of a quad flat package (QFP) as an example of the electronic component. As illustrated in FIG. 22E, an electronic component 7000 includes a lead 7001 and a chip 7110.

The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described below with reference to FIGS. 23A to 23C and FIGS. 24A to 24E. A touch panel including a touch sensor is preferably used for a display portion of each of the electronic devices in FIG. 23A and the like. With the touch panel, the display portion can also function as an input portion of the electronic device.

Figure 23A:
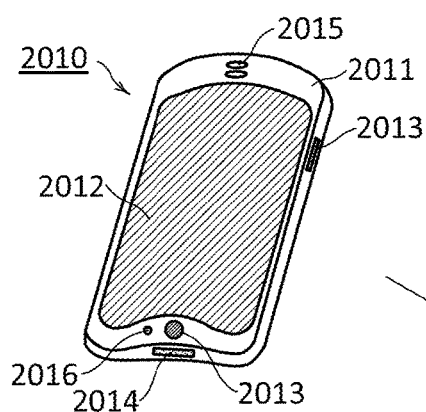
FIGS. 23A to 23C are diagrams showing structure examples of electronic devices.

An information terminal 2010 in FIG. 23A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting characters, and screen switching of the display portion 2012 can be performed by touching the display portion 2012 with a finger or the like. The information terminal 2010 can be operated by inputting sound from the microphone 2016. Power on/off operation, screen switching of the display portion 2012, and the like can be performed by pressing the operation button 2013.

Figure 23B:
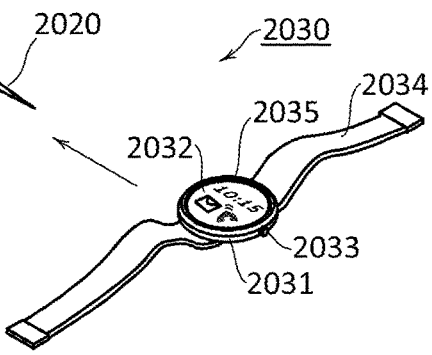

FIG. 23B illustrates an example of a watch-type information terminal. An information terminal 2030 includes a housing 2031, a display portion 2032, a winding crown 2033, a belt 2034, and a sensing unit 2035. The information terminal 2030 can be operated by rotating the winding crown 2033. The information terminal 2030 can be operated by touching the display portion 2032 with a finger.

The sensing unit 2035 has a function of obtaining information on usage environment and biological information. The sensing unit 2035 may be provided with a microphone, an imaging element, an acceleration sensor, a direction sensor, a pressure sensor, a temperature sensor, a humidity sensor, an illumination sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. When the information terminal 2010 receives an incoming e-mail or call, for example, information notifying the incoming e-mail or call can be displayed on the display portion 2032 of the information terminal 2030.

Figure 23C:
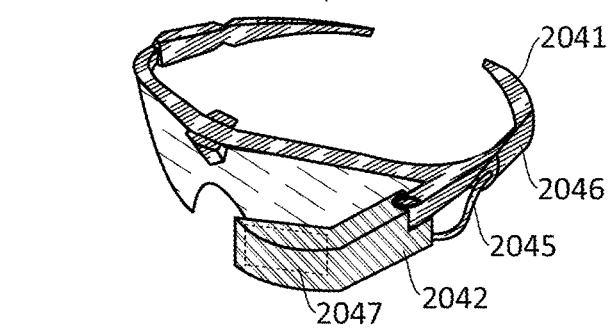

FIG. 23C illustrates an example of a glasses-type information terminal. An information terminal 2040 includes a mounting portion 2041, a housing 2042, a cable 2045, a battery 2046, and a display portion 2047. The battery 2046 is stored in the mounting portion 2041. The display portion 2047 is provided in the housing 2042. The housing 2042 includes a processor, a wireless communication device, a storage device, and a variety of electronic components. Power is supplied from the battery 2046 to the display portion 2047 and the electronic components in the housing 2042 through the cable 2045. A variety of information such as an image or the like transmitted wirelessly is displayed on the display portion 2047.

The housing 2042 may be provided with a camera. The information terminal 2040 can be operated by sensing movement of a user's eyeball or eyelid with the camera.

The mounting portion 2041 may be provided with a variety of sensors such as a temperature sensor, a pressure sensor, an acceleration sensor, and a biological sensor. For example, the biological sensor obtains biological information about the user and then stores the biological information in the storage device of the housing 2042. Interactive communication between the information terminal 2010 and the information terminal 2040 is possible through a wireless signal 2021, for example. The information terminal 2040 transmits the stored biological information to the information terminal 2010. The information terminal 2010 calculates the degree of fatigue, the amount of activity, and the like of the user from the received biological information.

Figure 24A:
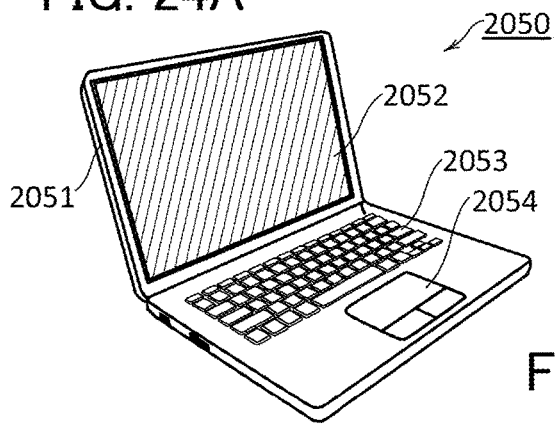
FIGS. 24A to 24E are diagrams showing structure examples of electronic devices.

A laptop 2050 in FIG. 24A includes a housing 2051, a display portion 2052, a keyboard 2053, and a pointing device 2054. The laptop 2050 can be operated by touch operation of the display portion 2052.

Figure 24B:
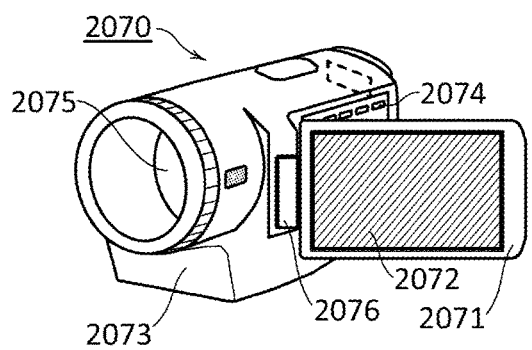

A video camera 2070 in FIG. 24B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation of the display portion 2072.

Figure 24C:
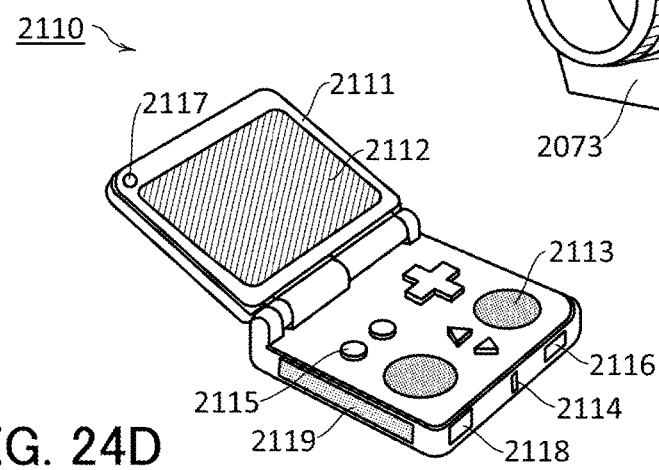

A portable game machine 2110 in FIG. 24C includes a housing 2111, a display portion 2112, speakers 2113, an LED lamp 2114, operation key buttons 2115, a connection terminal 2116, a camera 2117, a microphone 2118, and a recording medium read portion 2119.

Figure 24D:
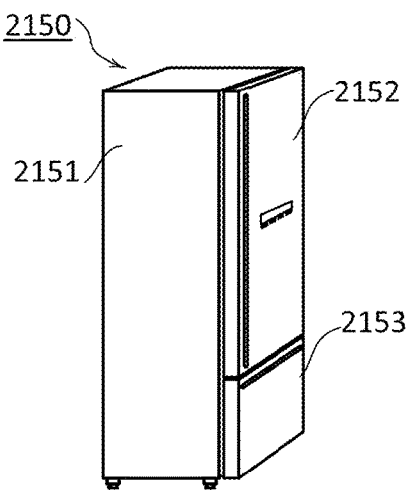

An electric refrigerator-freezer 2150 in FIG. 24D includes a housing 2151, a refrigerator door 2152, a freezer door 2153, and the like.

Figure 24E:
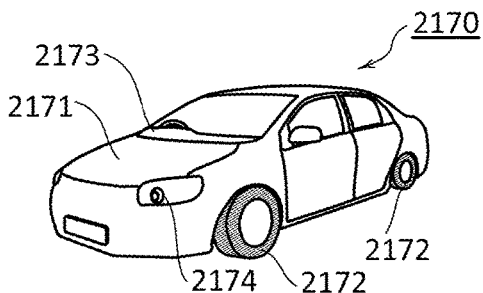

A motor vehicle 2170 in FIG. 24E includes a car body 2171, wheels 2172, a dashboard 2173, lights 2174, and the like. The processor in Embodiment 2 is used as each of processors in the motor vehicle 2170.

Embodiment 5

In this embodiment, an oxide semiconductor and the like are described.

<<Structure Example 1 of OS Transistor>>

FIG. 25A is a top view illustrating a structure example of an OS transistor. FIG. 25B is a cross-sectional view taken along line X1-X2 in FIG. 25A. FIG. 25C is a cross-sectional view taken along line Y1-Y2 in FIG. 25A. In some cases, the direction of line X1-X2 is referred to as a channel length direction, and the direction of line Y1-Y2 is referred to as a channel width direction. Accordingly, FIG. 25B illustrates a cross-sectional structure of the OS transistor in the channel length direction, and FIG. 25C illustrates a cross-sectional structure of the OS transistor in the channel width direction. Note that to clarify the device structure, FIG. 25A does not illustrate some components.

An OS transistor 501 is formed over an insulating surface, here, over an insulating layer 521. The OS transistor 501 is covered with insulating layers 528 and 529. The OS transistor 501 includes insulating layers 522 to 527, metal oxide layers 511 to 513, and conductive layers 550 to 553.

Note that an insulating layer, a metal oxide layer, a conductor, and the like in a drawing may have a single-layer structure or a layered structure. These elements can be formed by any of a variety of deposition methods such as sputtering, molecular beam epitaxy (MBE), pulsed laser deposition (PLD), CVD, and atomic layer deposition (ALD). Examples of CVD include plasma-enhanced CVD, thermal CVD, and metal organic CVD.

The metal oxide layers 511 to 513 are collectively referred to as an oxide layer 510. As illustrated in FIGS. 25B and 25C, the oxide layer 510 includes a portion where the metal oxide layer 511, the metal oxide layer 512, and the metal oxide layer 513 are stacked in that order. When the OS transistor 501 is on, a channel is mainly formed in the metal oxide layer 512 of the oxide layer 510.

A gate electrode of the OS transistor 501 is formed using the conductive layer 550. A pair of electrodes that functions as a source electrode and a drain electrode of the OS transistor 501 is formed using the conductive layers 551 and 552. A backgate electrode of the OS transistor 501 is formed using the conductive layer 553. The conductive layer 553 includes conductive layers 553a and 553b. Note that the OS transistor 501 does not necessarily include a backgate electrode. The same applies to OS transistors 502 to 507 to be described later.

A gate insulating layer on a gate (front gate) side is formed using the insulating layer 527. A gate insulating layer on a backgate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

The conductive layers 551 and 552 are formed using a hard mask used for forming the stack of the metal oxide layers 511 and 512. For example, the metal oxide layers 511 and 512 and the conductive layers 551 and 552 can be formed through the following steps. A two-layer metal oxide film is formed. A conductive film is formed over a metal oxide film. This conductive film is etched, so that a hard mask is formed. With the use of this hard mask, the two-layer metal oxide film is etched to form the stack of the metal oxide layers 511 and 512. Then, the hard mask is etched to form the conductive layers 551 and 552. Since the conductive layers 551 and 552 are formed through these steps, the conductive layers 551 and 552 do not include regions that are in contact with side surfaces of the metal oxide layers 511 and 512.

(Conductive Layer)

Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

With the use of a conductive material with a high work function for the conductive layer 550, it is possible to increase Vt of the OS transistor 501 and reduce cutoff current. For the conductive layer 550, a conductive material whose work function is preferably higher than or equal to 4.8 eV, more preferably higher than or equal to 5.0 eV, still more preferably higher than or equal to 5.2 eV, yet more preferably higher than or equal to 5.4 eV, still more preferably higher than or equal to 5.6 eV can be used. Examples of the conductive material with a high work function include molybdenum, molybdenum oxide, Pt, Pt silicide, Ni silicide, indium tin oxide, and an In—Ga—Zn oxide to which nitrogen is added.

Note that the cutoff current refers to drain current when gate-source voltage is 0 V.

For example, the conductive layer 550 is a single layer of tantalum nitride or tungsten. The above conductor is used for a layer on the insulating layer 527 side. Alternatively, in the case where the conductive layer 550 has a two-layer structure or a three-layer structure, the following combinations can be used: aluminum and titanium; titanium nitride and titanium; tantalum nitride and tungsten; tungsten nitride and tungsten; titanium, aluminum, and titanium; titanium nitride, aluminum, and titanium; and titanium nitride, aluminum, and titanium nitride.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be used. The above conductor is used for a layer on the insulating layer 527 side. Alternatively, in the case where the conductive layer 551 has a two-layer structure or a three-layer structure layer, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride.

For example, it is preferable that the conductive layer 553a be a conductive layer that has a hydrogen barrier property (e.g., a tantalum nitride layer) and that the conductive layer 553b be a conductive layer that has higher conductivity than the conductive layer 553a (e.g., tungsten). With such a structure, the conductive layer 553 functions as a wiring and has a function of suppressing diffusion of hydrogen into the oxide layer 510.

(Insulator)

Examples of insulating materials used for the insulating layers 521 to 529 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 529 are formed using a single-layer structure or a layered structure of these insulating materials. The layers used for the insulating layers 521 to 529 may include a plurality of insulating materials.

Note that in this specification and the like, an oxynitride refers to a substance that contains more oxygen than nitrogen, and a nitride oxide refers to a substance that contains more nitrogen than oxygen.

In order to suppress the increase in oxygen vacancies in the oxide layer 510, the insulating layers 526 to 528 preferably include oxygen. More preferably, at least one of the insulating layers 526 to 528 is formed using an insulating film from which oxygen is released by heating (hereinafter such an insulating film is referred to as an insulating film containing excess oxygen). When oxygen is supplied from the insulating film containing excess oxygen to the oxide layer 510, the oxygen vacancies in the oxide layer 510 can be compensated. Thus, reliability and electrical characteristics of the OS transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 521 to 529 is preferably low in order to prevent the increase in the concentration of hydrogen in the oxide layer 510. In particular, the concentration of hydrogen in the insulating layers 523 to 528 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in the insulating layers 523 to 528 is preferably low in order to prevent the increase in the concentration of nitrogen in the oxide layer 510. Specifically, the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The hydrogen concentration and the nitrogen concentration are measured by secondary ion mass spectrometry (SIMS).

In the OS transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510; thus, the reliability and electrical characteristics of the OS transistor 501 can be improved.

For example, the insulating layer 529 functions as a barrier layer and at least one of the insulating layers 521, 522, and 524 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

In addition, a barrier layer may be provided between the oxide layer 510 and the conductive layer 550. Alternatively, a metal oxide layer that has oxygen and hydrogen barrier properties may be provided as the metal oxide layer 513.

The film thicknesses of the insulating layer 524, the insulating layer 525, and the insulating layer 526 are preferably reduced so that the threshold voltage of the OS transistor can be easily controlled with the voltage of the conductive layer 550. For example, the film thicknesses of the insulating layers 524 to 526 are each smaller than or equal to 50 nm. The film thicknesses of the insulating layers 524 to 526 are each preferably smaller than or equal to 30 nm, more preferably smaller than or equal to 10 nm, still more preferably smaller than or equal to 5 nm.

A structure example of the insulating layers 521 to 529 is described. In this example, each of the insulating layers 521, 522, 525, and 529 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the backgate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layer 529 is formed using aluminum oxide.

(Metal Oxide Layer)

The thickness of each of the metal oxide layers 511 to 513 is larger than or equal to 3 nm and smaller than or equal to 500 nm, preferably larger than or equal to 3 nm and smaller than or equal to 100 nm, more preferably larger than or equal to 3 nm and smaller than or equal to 60 nm.

In order to reduce the off-state current of the OS transistor 501, for example, the energy gap of the metal oxide layer 512 is preferably large. The energy gap of the metal oxide layer 512 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 510 is preferably a crystalline metal oxide layer. At least the metal oxide layer 512 is preferably a crystalline metal oxide layer. The OS transistor 501 can have high reliability and favorable electrical characteristics.

As the oxide of the metal oxide layer 512, typically, an In—Ga oxide, an In—Zn oxide, or an In-M-Zn oxide (M is Al, Ga, Y, or Sn) can be used. The metal oxide layer 512 is not limited to the oxide layer containing indium. The metal oxide layer 512 can be formed using a Zn—Sn oxide, a Ga—Sn oxide, or a Zn—Mg oxide, for example. The metal oxide layers 511 and 513 can be formed using an oxide that is similar to the oxide of the metal oxide layer 512. The metal oxide layers 511 and 513 can be formed using a Ga oxide. In that case, the metal oxide layer 512 is preferably a metal oxide layer containing Ga.

When an interface level is formed at an interface between the metal oxide layer 512 and the metal oxide layer 511, a channel region is also formed in a region close to the interface; thus, the threshold voltage of the OS transistor 501 varies. It is preferable that the metal oxide layer 511 contains at least one of the metal elements contained in the metal oxide layer 512. Accordingly, an interface state is hardly formed at the interface between the metal oxide layer 512 and the metal oxide layer 511, and variations in the electrical characteristics of the OS transistor 501, such as the threshold voltage, can be reduced.

The metal oxide layer 513 preferably contains at least one of the metal elements contained in the metal oxide layer 512 because interface scattering is unlikely to occur at the interface between the metal oxide layer 512 and the metal oxide layer 513, and carrier transfer is not inhibited. Thus, the field-effect mobility of the OS transistor 501 can be increased.

It is preferable that the metal oxide layer 512 have the highest carrier mobility among the metal oxide layers 511 to 513. Accordingly, a channel can be formed in the metal oxide layer 512 that is apart from the insulating layers 526 and 527.

For example, in a metal oxide containing In such as an In-M-Zn oxide, carrier mobility can be increase by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 512 is formed using an In—Ga—Zn oxide, and the metal oxide layers 511 and 513 are formed using a Ga oxide. For example, in the case where the metal oxide layers 511 to 513 are formed using an In-M-Zn oxide, the metal oxide layer 511 has the highest In content among the metal oxide layers 511 to 513. In the case where the In-M-Zn oxide is formed by sputtering, the In content can be changed by a change in the atomic ratio of metal elements of a target.

For example, it is preferable that the atomic ratio of metal elements of a target used for depositing the metal oxide layer 512 be In:M:Zn=1:1:1, 3:1:2, or 4:2:4.1. For example, it is preferable that the atomic ratio of metal elements of a target used for depositing the metal oxide layers 511 and 513 be In:M:Zn=1:3:2 or 1:3:4. The atomic ratio of an In-M-Zn oxide deposited using a target of In:M:Zn=4:2:4.1 is approximately In:M:Zn=4:2:3.

In order that the OS transistor 501 have stable electrical characteristics, it is preferable to reduce the concentration of impurities in the oxide layer 510. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the OS transistor.

For example, the oxide layer 510 includes a region where the concentration of silicon is lower than or equal to $2\times10^{18}$ atoms/cm$^3$. The concentration of silicon in the region is preferably lower than or equal to $2\times10^{17}$ atoms/cm$^3$. The same applies to the concentration of carbon in the oxide layer 510.

The oxide layer 510 includes a region where the concentration of alkali metal is lower than or equal to $1\times10^{18}$ atoms/cm$^3$. The concentration of alkali metal in the region is preferably lower than or equal to $2\times10^{16}$ atoms/cm$^3$. The same applies to the concentration of alkaline earth metal in the oxide layer 510.

The oxide layer 510 includes a region where the concentration of nitrogen is lower than $5\times10^{19}$ atoms/cm$^3$. The concentration of nitrogen in the region is preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The oxide layer 510 includes a region where the concentration of hydrogen is lower than $1\times10^{20}$ atoms/cm$^3$. The concentration of hydrogen in the region is preferably lower than $1\times10^{19}$ atoms/cm$^3$, more preferably lower than $5\times10^{18}$ atoms/cm$^3$, still more preferably lower than $1\times10^{18}$ atoms/cm$^3$.

The concentrations of the impurities in the oxide layer 510 are measured by SIMS.

In the case where the metal oxide layer 512 contains oxygen vacancies, donor levels are formed by entry of hydrogen into sites of oxygen vacancies in some cases. As a result, the on-state current of the OS transistor 501 is decreased. Sites of oxygen vacancies become more stable by entry of oxygen than by entry of hydrogen. Thus, by decreasing oxygen vacancies in metal oxide layer 512, the on-state current of the OS transistor 501 can be increased in some cases. Consequently, preventing entry of hydrogen into sites of oxygen vacancies by a reduction in hydrogen in the metal oxide layer 512 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the OS transistor 501 is likely to be normally-on when the metal oxide layer 512 contains hydrogen because the metal oxide layer 512 includes a channel formation region. Accordingly, it is preferable that hydrogen in the metal oxide layer 512 be reduced as much as possible.

FIGS. 25A to 25C illustrate examples in which the oxide layer 510 has a three-layer structure; however, one embodiment of the present invention is not limited thereto. For example, the oxide layer 510 may have a two-layer structure without the metal oxide layer 511 or 513. Alternatively, the oxide layer 510 may have a four-layer structure in which any one of the oxide semiconductor layers described as the metal oxide layers 511 to 513 is provided below or over the metal oxide layer 511 or below or over the metal oxide layer 513. Alternatively, the oxide layer 510 may include one or more metal oxide layers that are similar to the metal oxide layers 511 to 513 at two or more of the following positions: between given layers in the oxide layer 510, over the oxide layer 510, and below the oxide layer 510.

<Energy Band Structure>

Figure 32:
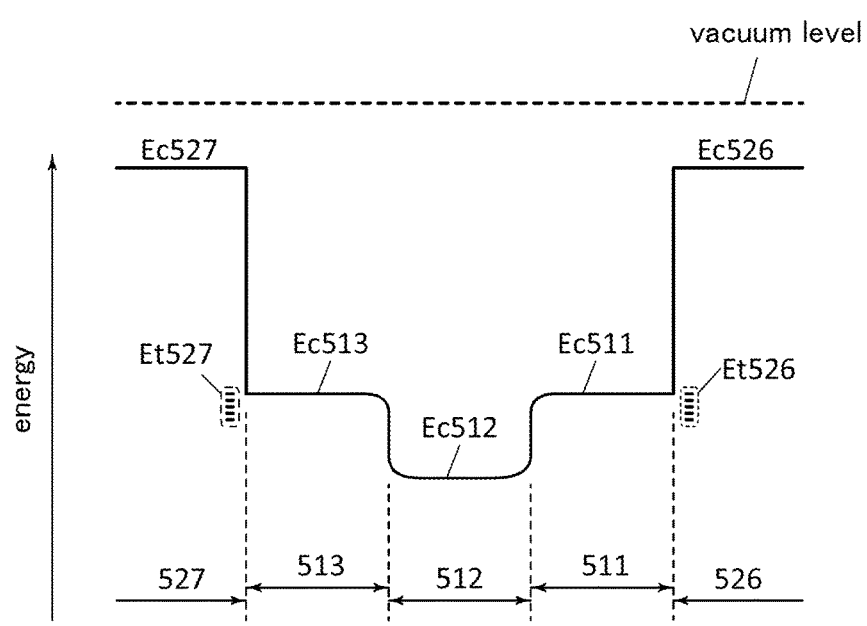
FIG. 32 is an energy band diagram of an OS transistor.

Effects of the stack of the metal oxide layers 511 to 513 are described with reference to FIG. 32. FIG. 32 is a schematic diagram showing the energy band structure of a channel formation region of the OS transistor 501. Although the OS transistor 501 is described here as an example, effects of the stack of the metal oxide layers 511 to 513 in the OS transistors 502 and 503 to be described later are similar to those in the OS transistor 501.

Here, Ec526, Ec511, Ec512, Ec513, and Ec527 indicate the energy at the bottom of the conduction band of the insulating layer 526, the metal oxide layer 511, the metal oxide layer 512, the metal oxide layer 513, and the insulating layer 527, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The difference in energy between the vacuum level and the top of the valence band can be measured using an ultraviolet photoelectron spectroscopy (UPS) device (VersaProbe manufactured by ULVAC-PHI, Inc.).

Since the insulating layers 526 and 527 are insulators, Ec526 and Ec527 are closer to the vacuum level than Ec511, Ec512, and Ec513 (i.e., the insulating layers 526 and 527 have a lower electron affinity than the metal oxide layers 511 to 513).

The metal oxide layer 512 has a higher electron affinity than the metal oxide layers 511 and 513. For example, the difference in electron affinity between the metal oxide layers 511 and 512 and the difference in electron affinity between the metal oxide layers 512 and 513 are each greater than or equal to 0.07 eV and less than or equal to 1.3 eV. The difference in electron affinity between the metal oxide layers 511 and 512 and the difference in electron affinity between the metal oxide layers 512 and 513 are each preferably greater than or equal to 0.1 eV and less than or equal to 0.7 eV, more preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 550) of the OS transistor 501, a channel is mainly formed in the metal oxide layer 512 having the highest electron affinity among the metal oxide layers 511 to 513.

An indium gallium oxide has low electron affinity and a high oxygen-blocking property. Therefore, the metal oxide layer 513 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide layers 511 and 512 between the metal oxide layers 511 and 512. Furthermore, in some cases, there is a mixed region of the metal oxide layers 512 and 513 between the metal oxide layers 512 and 513. Because the mixed region has low interface state density, a stack of the metal oxide layers 511 to 513 (the oxide layer 510) has a band structure where energy at each interface and in the vicinity of the interface is changed continuously (continuous junction).

Electrons transfer mainly through the metal oxide layer 512 in the oxide layer 510 having such an energy band structure. Therefore, even when an interface state exists at an interface between the metal oxide layer 511 and the insulating layer 526 or an interface between the metal oxide layer 513 and the insulating layer 527, electron movement in the oxide layer 510 is less likely to be inhibited and the on-state current of the OS transistor 501 can be increased.

Although trap states Et526 and Et527 due to impurities or defects might be formed in the vicinity of the interface between the metal oxide layer 521 and the insulating layer 526 and the vicinity of the interface between the metal oxide layer 523 and the insulating layer 527 as illustrated in FIG. 32, the metal oxide layer 522 can be separated from the trap states Et526 and Et527 owing to the existence of the metal oxide layers 521 and 523.

Note that when a difference in energy between Ec521 and Ec522 is small, an electron in the metal oxide layer 512 might reach the trap state Et526 by passing over the difference in energy. Since the electron is trapped at the trap state Et526, negative fixed charge is generated at the interface with the insulating film, causing the threshold voltage of the transistor to be shifted in a positive direction. The same applies to the case where a difference in energy between Ec521 and Ec523 is small.

Each of the difference in energy between Ec521 and Ec522 and the difference in energy between Ec522 and Ec523 is preferably greater than or equal to 0.1 eV, more preferably greater than or equal to 0.15 eV so that a change in the threshold voltage of the OS transistor 501 can be reduced and the OS transistor 501 can have favorable electrical characteristics.

<Structure Example 2 of OS Transistor>

Figure 26A:
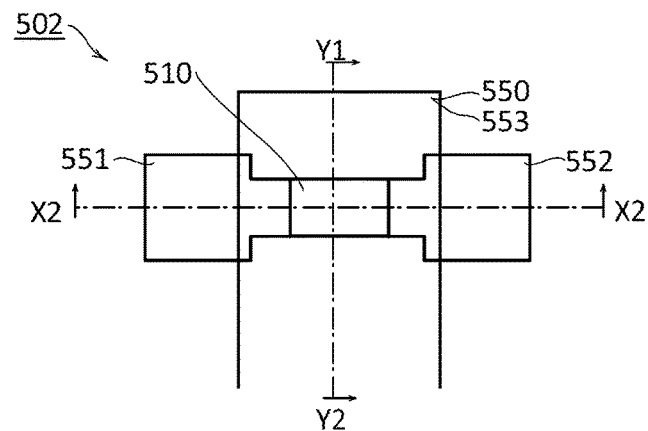
FIG. 26A is a plan view illustrating a structure example of an OS transistor.
Figure 26B:
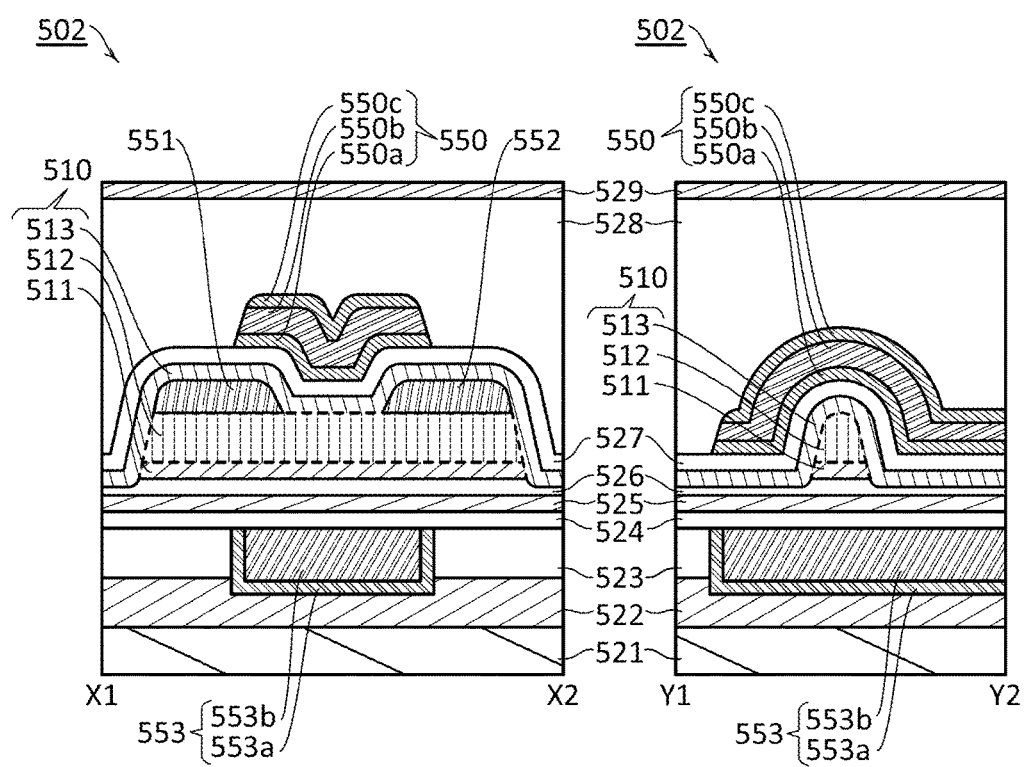
FIGS. 26B and 26C are cross-sectional views illustrating the OS transistor of FIG. 26A.
Figure 26C:
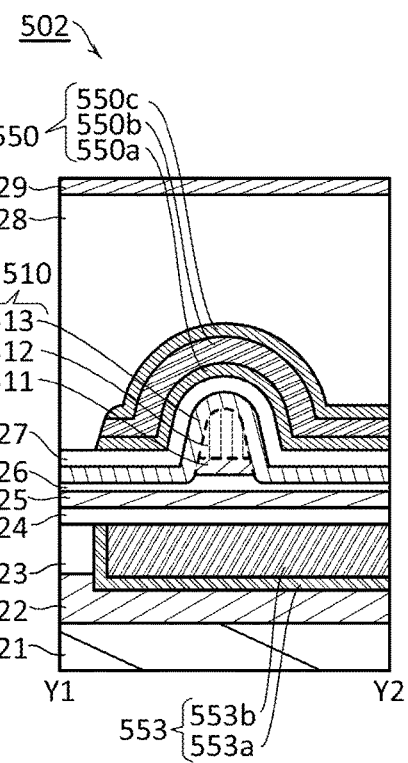

The OS transistor 502 in FIGS. 26A to 26C is a modification example of the OS transistor 501. The conductive layer 550 of the OS transistor 502 includes a conductive layer 550a, a conductive layer 550b, and a conductive layer 550c.

The conductive layer 550a is preferably formed by thermal CVD, MOCVD, or ALD. In particular, the conductive layer 550a is preferably formed by atomic layer deposition (ALD). When the conductive layer 550a is formed by ALD or the like, plasma damage to the insulating layer 527 can be reduced. In addition, the conductive layer 550a is preferably formed by ALD or the like because coverage thereof can be improved. Therefore, it is possible to provide the highly reliable OS transistor 502.

The conductive layer 550b is formed using a material that has high conductivity, such as tantalum, tungsten, copper, or aluminum. The conductive layer 550c formed over the conductive layer 550b is preferably formed using a conductor that is less likely to be oxidized, such as tungsten nitride. In the case where an oxide material from which oxygen is released is used for the insulating layer 528, the conductive layer 550 can be prevented from being oxidized by released oxygen. Thus, it is possible to suppress oxidation of the conductive layer 550 and efficiently supply oxygen released from the insulating layer 528 to the oxide layer 510.

When a conductor that is less likely to be oxidized is used for the conductive layer 550c having a large contact area with the insulating layer 528 including an excess oxygen region, it is possible to suppress absorption of excess oxygen in the insulating layer 528 by the conductive layer 550. In addition, when a conductor with high conductivity is used for the conductive layer 550b, it is possible to provide the OS transistor 502 with low power consumption.

<Structure Example 3 of OS Transistor>

Figure 27A:
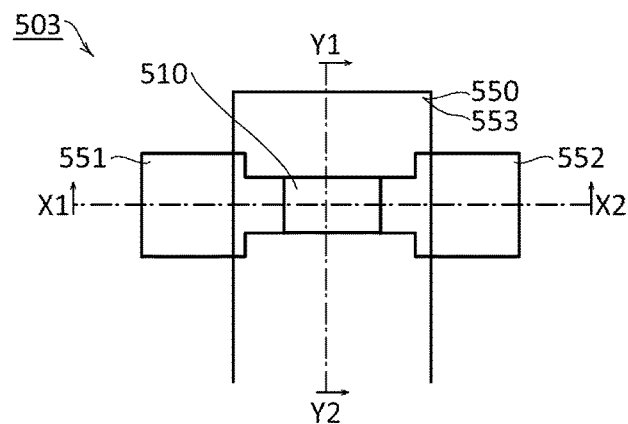
FIG. 27A is a plan view illustrating a structure example of an OS transistor.
Figure 27B:
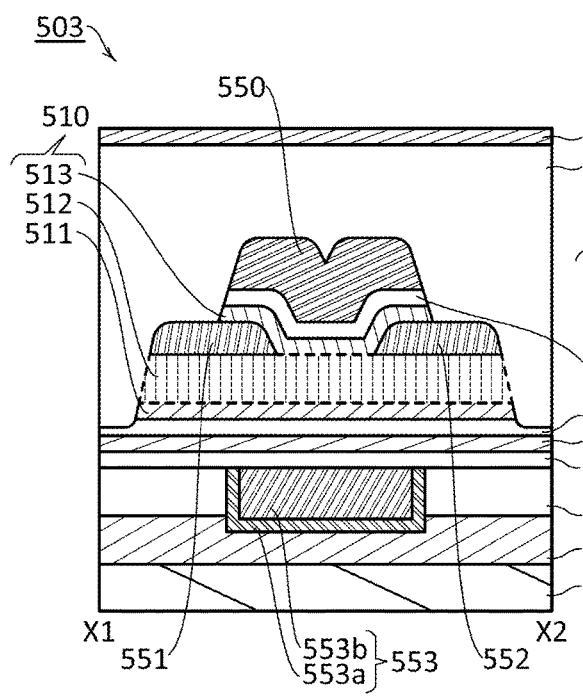
FIGS. 27B and 27C are cross-sectional views illustrating the OS transistor of FIG. 27A.
Figure 27C:
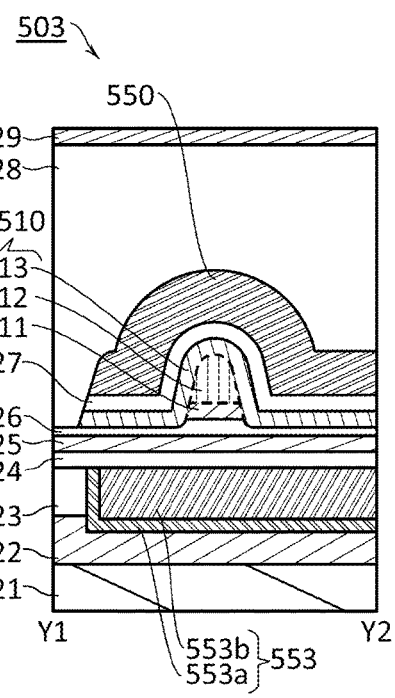

The OS transistor 503 in FIGS. 27A to 27C is a modification example of the OS transistor 501. In the OS transistor 503, the conductive layer 550 is used as an etching mask to etch the metal oxide layer 513 and the insulating layer 527.

<Structure Example 4 of OS Transistor>

Figure 28A:
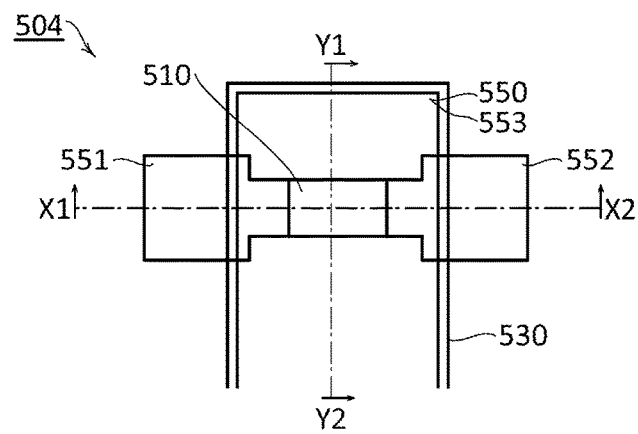
FIG. 28A is a plan view illustrating a structure example of an OS transistor.
Figure 28B:
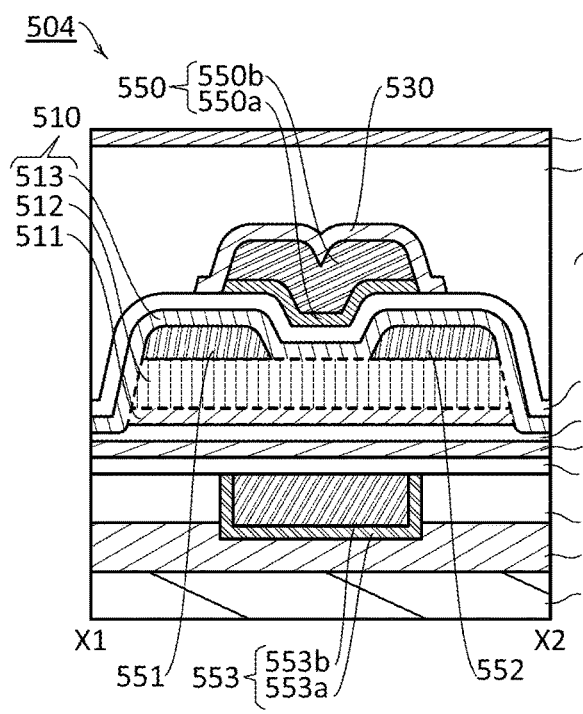
FIGS. 28B and 28C are cross-sectional views illustrating the OS transistor of FIG. 28A.
Figure 28C:
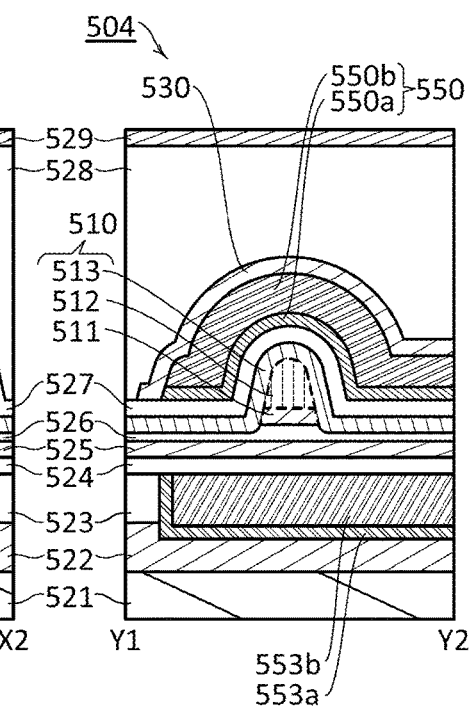

The OS transistor 504 in FIGS. 28A to 28C is a modification example of the OS transistor 501.

The conductive layer 550 has a two-layer structure of the conductive layer 550a and the conductive layer 550b. The conductive layer 550 is covered with an insulating layer 530.

For example, the insulating layer 530 has an oxygen barrier property. Thus, oxygen released from the insulating layer 528 or the like can suppress oxidation of the conductive layer 550. In that case, a metal oxide such as aluminum oxide can be used for the insulating layer 530. The thickness of the insulating layer 530 is not limited to a certain thickness as long as oxidation of the conductive layer 550 can be prevented. For example, the thickness of the insulating layer 530 is greater than or equal to 1 nm and less than or equal to 10 nm, preferably greater than or equal to 3 nm and less than or equal to 7 nm.

Note that as in the case of the OS transistor 503, the metal oxide layer 513 and the insulating layer 527 in the OS transistor 504 may be partly removed so that upper surfaces of the conductive layers 551 and 552 are partly exposed. Alternatively, only the insulating layer 527 may be partly removed.

<Structure Example 5 of OS Transistor>

Figure 29A:
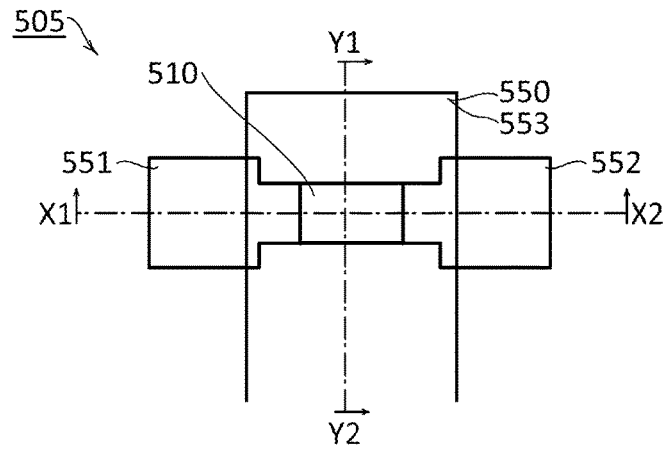
FIG. 29A is a plan view illustrating a structure example of an OS transistor.
Figure 29B:
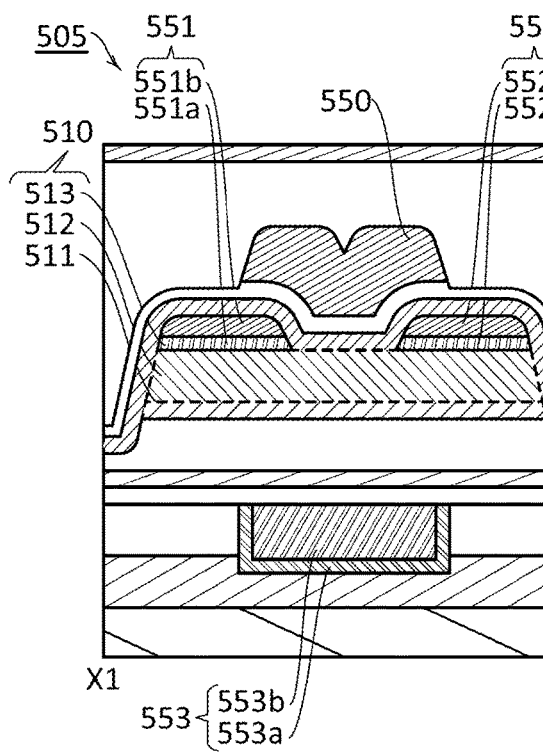
FIGS. 29B and 29C are cross-sectional views illustrating the OS transistor of FIG. 29A.
Figure 29C:
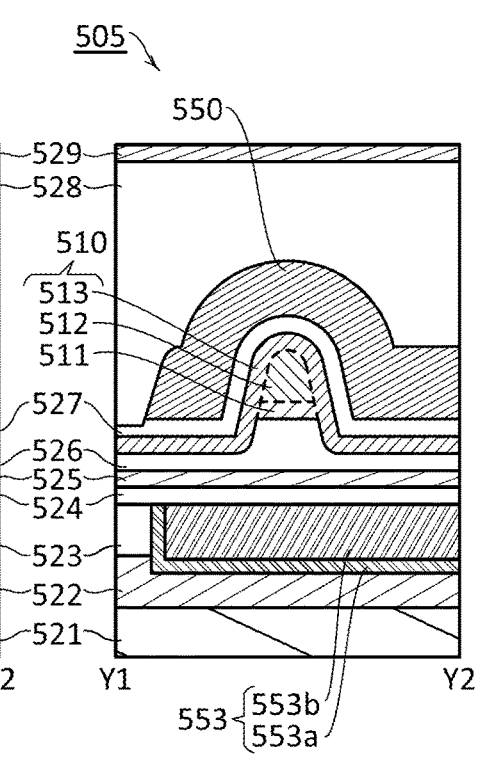

The OS transistor 505 in FIGS. 29A to 29C is a modification example of the OS transistor 501.

The conductive layer 551 has a two-layer structure of a conductive layer 551a and a conductive layer 551b, and the conductive layer 552 has a two-layer structure of a conductive layer 552a and a conductive layer 552b.

In the conductive layers 551 and 552, the conductive layers 551a and 552a are preferably formed using a conductive film that has high adhesion to the metal oxide layer 512. This conductive film is preferably formed by ALD because coverage thereof can be improved. The conductive layers 551b and 552b are preferably formed using a conductor that has higher conductivity than the conductive layers 551a and 552a. The use of the conductive layers 551a and 552a reduces restrictions on a conductive material that can be used for the conductive layers 551b and 552b. When a material that has high conductivity, such as tantalum, tungsten, copper, or aluminum, is used for the conductive layers 551a and 552a, power consumption of a circuit including the OS transistor 505 can be reduced.

<Structure Example 6 of OS Transistor>

The OS transistor 506 in FIGS. 30A to 30C is a modification example of the OS transistor 501. The OS transistor 506 differs from the OS transistor 501 mainly in the structure of the gate electrode.

The metal oxide layer 513, the insulating layer 527, and the conductive layer 550 are provided in an opening portion formed in the insulating layer 528. In other words, a gate electrode can be formed in a self-aligning manner by using the opening portion in the insulating layer 528. Thus, in the OS transistor 506, a gate electrode (550) does not include a region that overlaps with a source electrode and a drain electrode (551 and 552) with a gate insulating layer (527) positioned therebetween. Accordingly, gate-source parasitic capacitance and gate-drain parasitic capacitance can be reduced and frequency characteristics can be improved. Furthermore, gate electrode width can be controlled by the opening portion in the insulating layer 528; thus, it is easy to fabricate an OS transistor with short channel length.

<Structure Example 7 of OS Transistor>

The OS transistor 507 in FIGS. 31A to 31C is a modification example of the OS transistor 506.

The oxide layer 510 further includes a metal oxide layer 514. The metal oxide layer 514 covers the metal oxide layers 511 and 512 and the conductive layers 551 and 552.

The metal oxide layer 512 is separated from the insulating layer 528 by the metal oxide layer 514. In the oxide layer 510, a channel is mainly formed in the metal oxide layer 512; thus, generation of a shallow level in the vicinity of the channel can be suppressed when there is no region where the metal oxide layer 512 is in contact with the insulating layer 528. Thus, reliability of the OS transistor 507 can be improved.

<Structure Example of Semiconductor Device>

Structure examples of a semiconductor device including OS transistors and Si transistors are described with reference to FIG. 33 to FIG. 35.

Figure 33:
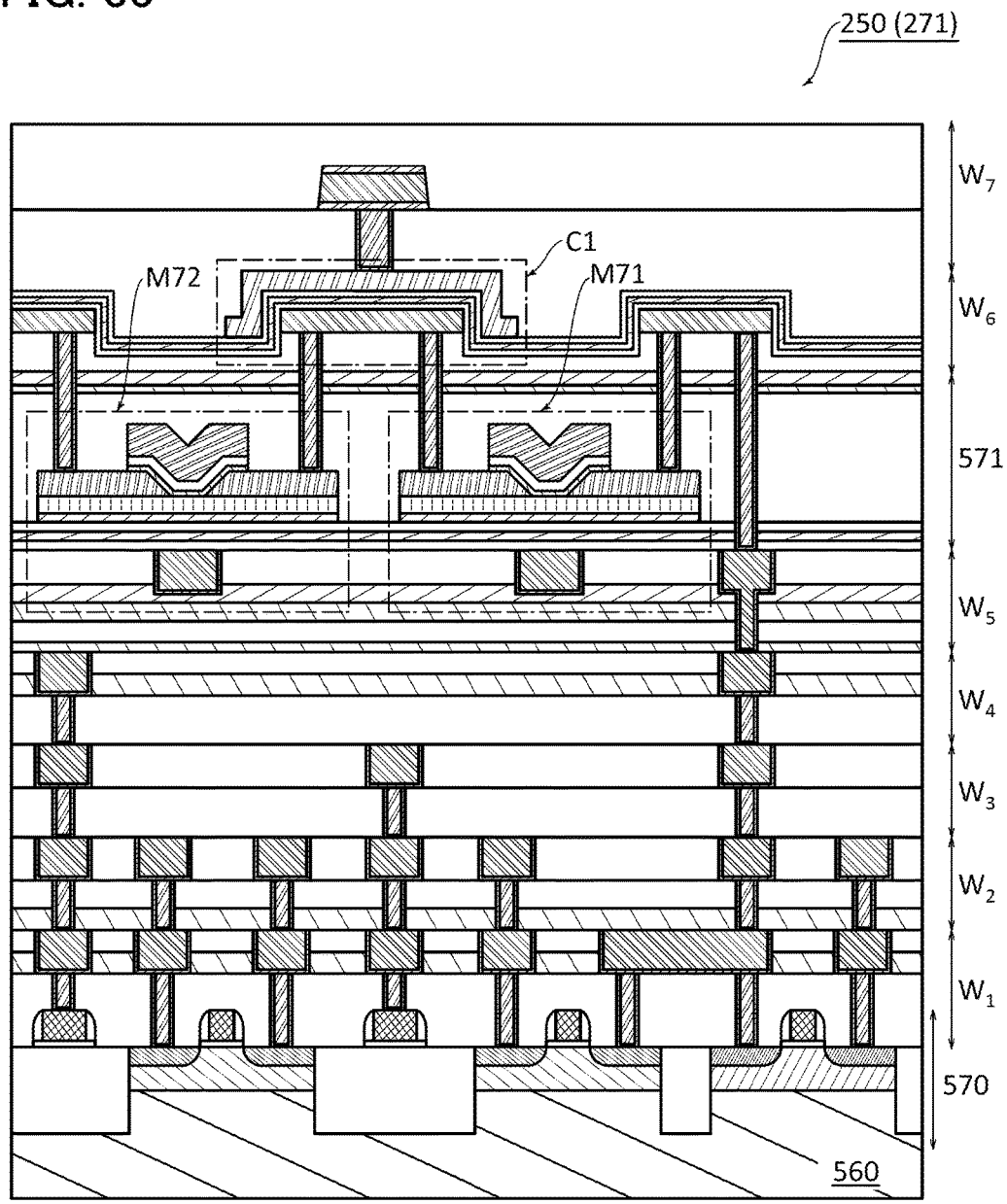
FIG. 33 is a cross-sectional view illustrating a structure example of a MCU.
Figure 34:
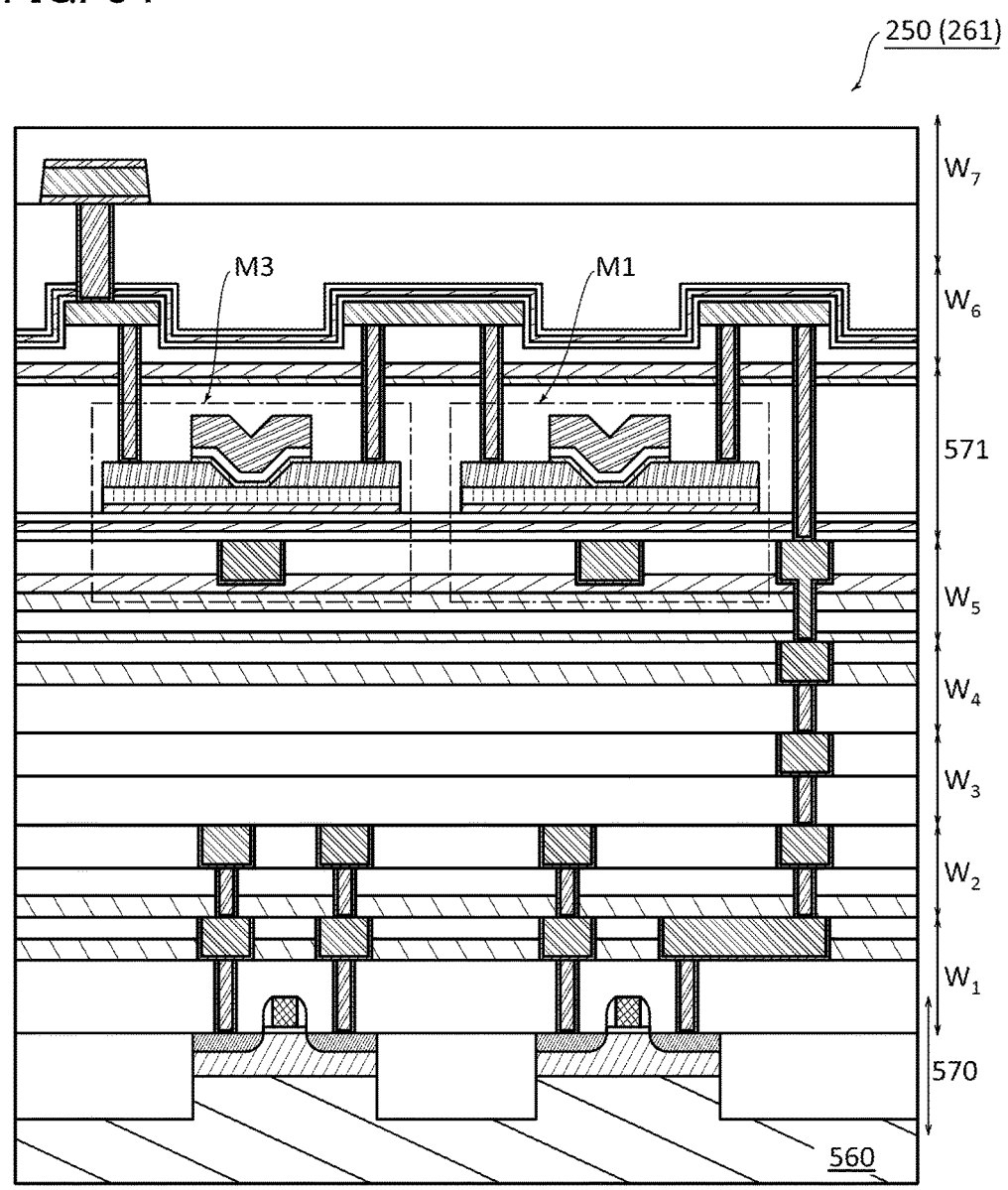
FIG. 34 is a cross-sectional view illustrating a structure example of a MCU.

FIG. 33 and FIG. 34 are cross-sectional views for illustrating the layered structure of the MCU 250 (FIG. 18). FIG. 33 illustrates main parts of the flip-flop 271. FIG. 34 illustrates main parts of the potential generation unit 261.

The MCU 250 includes a stack of the CMOS layer 570, the wiring layers $W_1$ to $W_5$, an OSFET layer 571, and the wiring layers W6 and W7.

Si transistors of the MCU 250 are provided in the CMOS layer 570. An active layer of the Si transistor is formed in a single crystalline silicon wafer 560.

OS transistors of the MCU 250 are provided in the OS FET layer 571. In the OS FET layer 571, an OS transistor of the flip-flop 271, an OS transistor of the potential generation unit 261, and an OS transistor of the memory 280 are provided in the OSFET layer 571. FIG. 33 typically illustrates transistors M71 and M72 of the flip-flop 271 (a backup circuit 272). FIG. 34 typically illustrates transistors M1 and M3 of the potential generation unit 261 (negative potential comparison portion). The transistors M71, M72, M1, and M3 have device structures similar to that of the OS transistor 503 (FIGS. 27A to 27C). The backgates of these transistors are formed in the wiring layer $W_5$. The capacitor C71 of the backup circuit 272 is formed in the wiring layer W6.

Figure 35:
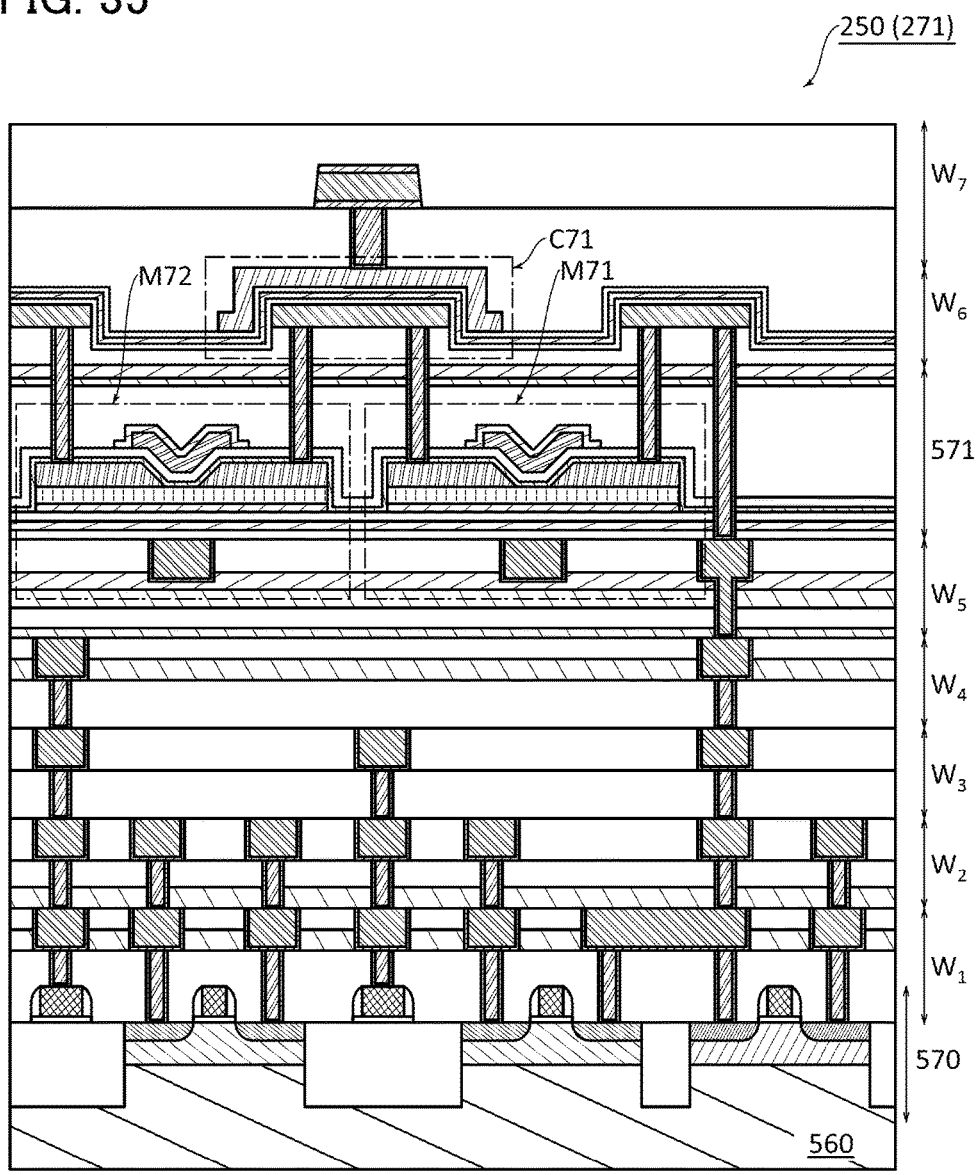
FIG. 35 is a cross-sectional view illustrating a structure example of a MCU.

FIG. 35 illustrates a structure example where the OSFET layer 571 includes transistors having structures similar to that of the OS transistor 504 (FIGS. 28A to 28C). FIG. 35 illustrates the main part of the flip-flop 271 like FIG. 34.

Embodiment 6

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor.

Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

(CAAC-OS)

A CAAC-OS is an oxide semiconductor having a plurality of c-axis aligned crystal parts (also referred to as pellets).

The CAAC-OS has c-axis alignment, its crystal parts (nanocrystals) are connected in an a-b plane direction, and the crystal structure has distortion. The size of the crystal part is greater than or equal to 1 nm or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

(nc-OS)

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including random aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor with an atomic ratio of In:Ga:Zn=1:1:1, the density of an a-like OS is higher than or equal to 5.0 $g/cm^3$ and lower than 5.9 $g/cm^3$. In addition, for example, in the case of the oxide semiconductor with an atomic ratio of In:Ga:Zn=1:1:1, the density of an nc-OS or a CAAC-OS is higher than or equal to 5.9 $g/cm^3$ and lower than 6.3 $g/cm^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

<Carrier Density of Oxide Semiconductor>

Next, the carrier density of an oxide semiconductor is described. Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

The carrier density of the oxide semiconductor is preferably reduced in order to inhibit the negative shift of Vt of the OS transistor or reduce the off-state current of the OS transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state.

The carrier density of the oxide semiconductor is preferably increased in some cases in order to increase the on-state current or field-effect mobility of the OS transistor. The carrier density of the oxide semiconductor can be increased by slightly increasing the impurity concentration or the density of defect states in the oxide semiconductor. For example, an oxide semiconductor that has a slightly high impurity concentration or a slightly high density of defect states in the range where a favorable ratio between the on-state current and the off-state current (i.e., Ion/Ioff ratio) of the OS transistor is obtained can be regarded as being substantially intrinsic.

Furthermore, an oxide semiconductor that has high electron affinity and thus has a narrow bandgap so as to increase the density of thermally excited electrons (carriers) can be regarded as substantially intrinsic. Note that an OS transistor using an oxide semiconductor with higher electron affinity has lower Vt.

The oxide semiconductor with an increased carrier density has somewhat n-type conductivity; thus, it can be referred to as a "slightly-n" oxide semiconductor.

The carrier density of a highly purified intrinsic oxide semiconductor is, for example, lower than $8\times10^{15}$ cm$^{-3}$, preferably lower than $1\times10^{11}$ cm$^{-3}$, more preferably lower than $1\times10^{10}$ cm$^{-3}$ and higher than or equal to $1\times10^{-9}$ cm$^{-3}$.

The carrier density of a substantially highly purified intrinsic oxide semiconductor is, for example, higher than or equal to $1\times10^{5}$ cm$^{-3}$ and lower than $1\times10^{18}$ cm$^{-3}$, preferably higher than or equal to $1\times10^{7}$ cm$^{-3}$ and lower than or equal to $1\times10^{17}$ cm$^{-3}$, more preferably higher than or equal to $1\times10^{9}$ cm$^{-3}$ and lower than or equal to $5\times10^{16}$ cm$^{-3}$, still more preferably higher than or equal to $1\times10^{10}$ cm$^{-3}$ and lower than or equal to $1\times10^{16}$ cm$^{-3}$, yet more preferably higher than or equal to $1\times10^{11}$ cm$^{-3}$ and lower than or equal to $1\times10^{15}$ cm$^{-3}$.

This application is based on Japanese Patent Application serial No. 2016-023593 filed with Japan Patent Office on Feb. 10, 2016 and Japanese Patent Application serial No. 2016-077225 filed with Japan Patent Office on Apr. 7, 2016, the entire contents of which are hereby incorporated by reference.

What is claimed is:

1. A semiconductor device comprising:
a first transistor;
a second transistor;
a third transistor; and
a load,
wherein each of a drain of the first transistor and a drain of the second transistor is electrically connected to the load,
wherein each of a source of the first transistor and a source of the second transistor is electrically connected to a drain of the third transistor,
wherein the first transistor and the second transistor each comprise a backgate,
wherein a gate of the first transistor is supplied with a first potential,
wherein a gate of the second transistor is supplied with a second potential,
wherein a gate of the third transistor is supplied with a fourth potential,
wherein a source of the third transistor is supplied with a fifth potential,
wherein the backgate of the first transistor is supplied with a sixth potential,
wherein the first potential and the second potential are lower than the fifth potential,
wherein the sixth potential is higher than the fifth potential,
wherein the semiconductor device is configured to compare the first potential and the second potential, and
wherein the semiconductor device is configured to generate a third potential based on a comparison result.

2. The semiconductor device according to claim 1,
wherein the backgate of the second transistor is supplied with a seventh potential, and
wherein the seventh potential is higher than the fifth potential.

3. The semiconductor device according to claim 1,
wherein the third transistor comprises a backgate, and
wherein the backgate of the third transistor is supplied with an eighth potential.

4. The semiconductor device according to claim 1,
wherein the third transistor comprises a backgate, and
wherein the backgate of the third transistor is electrically connected to the gate or the drain of the third transistor.

5. The semiconductor device according to claim 1,
wherein the load comprises a fourth transistor and a fifth transistor,
wherein the fourth transistor and the fifth transistor are diode-connected,
wherein a source of the fourth transistor is electrically connected to the drain of the first transistor,
wherein a source of the fifth transistor is electrically connected to the drain of the second transistor, and
wherein each channel formation region of the fourth transistor and the fifth transistor comprises a metal oxide.

6. The semiconductor device according to claim 1, wherein each channel formation region of the first to third transistors comprises a metal oxide.

7. The semiconductor device according to claim 1, wherein the fifth potential is a ground potential.

8. A semiconductor device comprising:
a first transistor;
a second transistor;
a third transistor;
a load;
a first terminal;
a second terminal;
a third terminal;
a fourth terminal; and
a fifth terminal;
wherein the semiconductor device is configured to compare a first potential and a second potential,
wherein the semiconductor device is configured to generate a third potential based on the comparison result,
wherein the first terminal is configured to supply the first potential,
wherein the second terminal is configured to supply the second potential,
wherein the third terminal, the fourth terminal, and the fifth terminal are configured to supply a fourth potential, a fifth potential, and a sixth potential, respectively,
wherein a gate of the first transistor is electrically connected to the first terminal,
wherein a gate of the second transistor is electrically connected to the second terminal,
wherein a drain of the first transistor is electrically connected to the load,
wherein a drain of the second transistor is electrically connected to the load,
wherein a source of the first transistor is electrically connected to a drain of the third transistor,
wherein a source of the second transistor is electrically connected to the drain of the third transistor,
wherein a gate of the third transistor is electrically connected to the third terminal,
wherein a source of the third transistor is electrically connected to the fourth terminal,
wherein the first transistor and the second transistor each comprises a backgate,
wherein the backgate of the first transistor is electrically connected to the fifth terminal,
wherein the first potential and the second potential are lower than the fifth potential, and wherein the sixth potential is higher than the fifth potential.

9. The semiconductor device according to claim 8, further comprising:
a sixth terminal configured to supply a seventh potential,
wherein the seventh potential is higher than the fifth potential, and
wherein the backgate of the second transistor is electrically connected to the sixth terminal.

10. The semiconductor device according to claim 8, further comprising:
a seventh terminal configured to supply an eighth potential,
wherein the third transistor comprises a backgate, and
wherein the backgate of the third transistor is electrically connected to the seventh terminal.

11. The semiconductor device according to claim 8,
wherein the third transistor comprises a backgate,
wherein the backgate of the third transistor is electrically connected to the gate or the drain of the third transistor.

12. The semiconductor device according to claim 8,
wherein the load comprises a fourth transistor and a fifth transistor,
wherein the fourth transistor and the fifth transistor are diode-connected,
wherein a source of the fourth transistor is electrically connected to the drain of the first transistor,
wherein a source of the fifth transistor is electrically connected to the drain of the second transistor, and
wherein each channel formation region of the fourth transistor and the fifth transistor comprises a metal oxide.

13. The semiconductor device according to claim 8, wherein each channel formation region of the first to third transistors comprises a metal oxide.

14. The semiconductor device according to claim 8, wherein the fifth potential is a ground potential.

15. A semiconductor device comprising:
a first-potential generation portion;
a second-potential generation portion;
a first-potential hold portion;
a potential comparison portion;
a control portion; and
an output terminal,
wherein the potential comparison portion comprises the semiconductor device described in claim 8,
wherein the first terminal of the potential comparison portion is electrically connected to the output terminal of the second-potential generation portion,
wherein the second terminal of the potential comparison portion is electrically connected to the output terminal,
wherein the first-potential generation portion is configured to supply a negative potential to the output terminal,
wherein the first-potential hold portion is configured to hold a potential of the output terminal,
wherein the second-potential generation portion is configured to supply a negative potential to the first terminal of the potential comparison portion,
wherein the control portion is configured to control the second-potential generation portion and is configured to control the first-potential generation portion based on the third potential generated in the potential comparison portion.

16. A semiconductor device comprising:
a first-potential generation portion;
a second-potential generation portion;
a first-potential hold portion;
a second-potential hold portion;
a potential comparison portion;
a control portion; and
an output terminal,
wherein the potential comparison portion comprises the semiconductor device described in claim 8,
wherein the first-potential generation portion is configured to supply a negative potential to the output terminal,
wherein the first-potential hold portion is configured to hold a potential of the output terminal,
wherein the second terminal of the potential comparison portion is electrically connected to the output terminal,
wherein the second-potential generation portion is configured to supply a negative potential to the first terminal of the potential comparison portion,
wherein the second-potential hold portion is configured to hold a potential of the first terminal of the potential comparison portion, and
wherein the control portion is configured to control the first-potential generation portion and the second-potential generation portion based on the third potential generated in the potential comparison portion.

17. An electronic component comprising:
a chip; and
a lead,
wherein the lead is electrically connected to the chip, and
wherein the chip comprises the semiconductor device described in claim 8.

18. An electronic component comprising:
a chip; and
a lead,
wherein the lead is electrically connected to the chip,
wherein the chip comprises the semiconductor device described in claim 15, and
wherein the chip comprises at least one of a memory device and a processor core.

19. An electronic component comprising:
a chip; and
a lead,
wherein the lead is electrically connected to the chip,
wherein the chip comprises the semiconductor device described in claim 15,
wherein the chip comprises a pixel array, and
wherein the pixel array comprises a plurality of imaging elements arranged in a matrix.

20. An electronic device comprising:
the electronic component described in claim 17; and
at least one of a display portion, a touch sensor, a microphone, a speaker, an operation key, and a housing.

21. A semiconductor wafer comprising:
a plurality of first regions; and
a dicing region,
wherein the plurality of first regions each comprises the semiconductor device described in claim 8.

22. The semiconductor device according to claim 1,
wherein the backgate of the second transistor is supplied with the sixth potential.

23. The semiconductor device according to claim 1,
wherein the drain of the third transistor is supplied with a ninth potential, and
wherein the sixth potential and the ninth potential are different from each other.

24. The semiconductor device according to claim 8, wherein the backgate of the second transistor is electrically connected to the fifth terminal.

* * * * *